(12) United States Patent
Sakuma et al.

(10) Patent No.: US 6,235,547 B1
(45) Date of Patent: May 22, 2001

(54) SEMICONDUCTOR DEVICE AND METHOD OF FABRICATING THE SAME

(75) Inventors: Yoshiki Sakuma; Yoshihiro Sugiyama, both of Kawasaki; Shunichi Muto, Atsugi, all of (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/366,564

(22) Filed: Aug. 4, 1999

Related U.S. Application Data

(60) Division of application No. 08/678,549, filed on Jul. 9, 1996, now Pat. No. 6,011,271, which is a continuation-in-part of application No. 08/431,298, filed on Apr. 28, 1995, now abandoned.

(30) Foreign Application Priority Data

| Apr. 28, 1994 | (JP) | 6-092576 |
|---|---|---|
| Feb. 22, 1995 | (JP) | 7-33268 |
| Jul. 10, 1995 | (JP) | 7-173653 |

(51) Int. Cl.$^7$ .................................................. H01L 21/00
(52) U.S. Cl. ........................ 438/44; 438/42; 438/43
(58) Field of Search ........................ 438/42, 43, 44, 438/713, 733, 911

(56) References Cited

U.S. PATENT DOCUMENTS

| 5,313,484 | 5/1994 | Arimoto . |
| 5,362,973 | 11/1994 | Paoli et al. . |
| 5,486,706 | 1/1996 | Yuki et al. . |
| 5,656,821 | 8/1997 | Sakuma . |
| 5,922,621 | * 7/1999 | Sakuma .............................. 438/733 |

FOREIGN PATENT DOCUMENTS

| 2-174268 | 7/1990 | (JP) . |
| 3-159287 | 7/1991 | (JP) . |
| 4-294331 | 10/1992 | (JP) . |

OTHER PUBLICATIONS

D.L. Kendall, On Etching Very Narrow Grooves In Silicon, *Applied Physics Letters*, vol. 26, No. 4, Feb. 15, 1975, pp. 195–198.

E. Bassous, Fabrication of Novel Three–Dimensional Microstructures by the Anisotropic Etching of (100) and (110) Silicon, *IEEE Trans. On Electron Devices*, vol. ED–25, No. 10, Oct. 1978, pp. 1178–1184.

P.M. Pertroff, et al., Toward Quantum Well Wires: Fabrication and Optical Properties, *Applied Physics Letters*, vol. 41, No. 7, Oct. 1, 1982, pp. 635–638.

E. Kapon, et al., Molecular Beam Epitaxy of GaAs/AlGaAs Superlattice Heterostructure on Nonplanar Substrates, *Applied Physics Letters*, vol. 50, No. 6, Feb. 9, 1987, pp. 347–349.

H. Temkin, et al., Low–temperature Photoluminescence from InGaAs/InP Quantum Wires and Boxes, *Applied Physics Letters*, vol. 50, No. 7, Feb. 16, 1987, pp. 413–415.

(List continued on next page.)

*Primary Examiner*—Kevin M. Picardat
(74) *Attorney, Agent, or Firm*—Armstrong, Westerman, Hattori, McLeland & Naughton

(57) ABSTRACT

In a semiconductor device, concave sections in which an opening area becomes small in proportion as a depth becomes deep are formed in a crystal layer, and a quantum structure is formed on at least one crystal face of a bottom section of the concave section and a border formed between plural sidewalls thereof. In case the quantum structure is formed in the bottom section, a quantum box is formed therein. If the quantum structure is formed in the border between the sidewalls of the concave section, a quantum wire is formed therein. In case the quantum structure is formed in the sidewall of the concave section, a two-dimensional quantum well is formed therein.

24 Claims, 40 Drawing Sheets

OTHER PUBLICATIONS

Asai, et al., Narrow Two-dimensional Electron Gas Channels in GaAs/AlGaAs Sidewall Interfaces by Selective Growth, *Applied Physics Letters*, vol. 51, No. 19, Nov. 9, 1987, pp. 1518–1520.

D.J. Robbins, et al., Electroluminescence from a Pseudomorphic $Si_{0.8}Ge_{0.2}$ Alloy, *Applied Physics Letters*, vol. 59, No. 11, Sep. 9, 1991, pp. 1350–1352.

S. Tsukamoto, et al., Fabrication of GaAs Wires on epitaxially Grown V Grooves by Metal–Organic Chemical–Vapor Deposition, *J. Applied Physics*, vol. 71, No. 1, Jan. 1, 1992, pp. 533–535.

D. Leonard, et al., Direct Formation of Quantum–sized Dots, from Uniform Coherent Islands of InGaAs Surfaces, *Applied Physics Letters*, vol. 63, No. 23, Dec. 6, 1993, pp. 3203–3205.

J.Y. Marzin, et al., Photoluminescence of Single InAs Quantum Dots Obtained by Self–organized Growth on GaAs, *Physical Review Letters*, Vo. 73, No. 5, Aug. 1, 1994, pp. 716–719.

J. Oshinowa, et al., Highly Uniform InGaAs/GaAs Quantum Dots (–15 nm) by Metalorganic Chemical Vapor Deposition, *Applied Physics Letters*, vol. 65, No. 11, Sep. 12, 1994, pp. 1421–1423.

K. Mukai, et al., Self–formed $In_{0.5}Ga_{0.5}As$ Quantum on GaAs Substrates Emitting at 1.3 $\mu$m, *Jpn. J. Appl. Phys.*, vol. 33 (1994), Part 2, No. 12A, Dec. 1, 1994, pp. L1710–L1712.

S. Muto, On a Possibility of Wavelength–Domain–Multiplication Memory Using Quantum Boxes, *Jpn. J. Applied Physics*, vol. 34, (1995), Part 2, No. 2B, Feb. 15, 1995, pp. L1210–L1212.

Fukui et al., "GaAs Tetrahedral Quantum Dots: Towards a Zero–Dimensional Electron–Hole System", Extended Abstracts of $22^{nd}$ Conference on Solid State Devices and Materials, Sendal, 1990, pp. 99–102.

H.V. Schreiber, et al., Si/SiGe Heterojunction Bipolar Transistor with Base Doping Highly Exceeding Emitter Doping Concentration, *Electronics Letters*, vol. 25, No. 3, Feb. 2, 1989, pp. 185–186.

E. Kapon, et al., Single Quantum Wire Semiconductor Lasers, *Applied Physics Letters*, vol. 55, No. 26, Dec. 25, 1989, pp. 2715–2717.

T. Fukui, et al., GaAs Tetrahedral Quantum Dot Structures Fabricated Using Selective Area Metalorganic Chemical Vapor Deposition, *Applied Physics Letters*, vol. 58, No. 18, May 6, 1991, pp. 2018–2020.

\* cited by examiner (0) ··· QUANTUM BOX
(1) ··· QUANTUM LINE
(2) ··· QUANTUM WELL LAYER

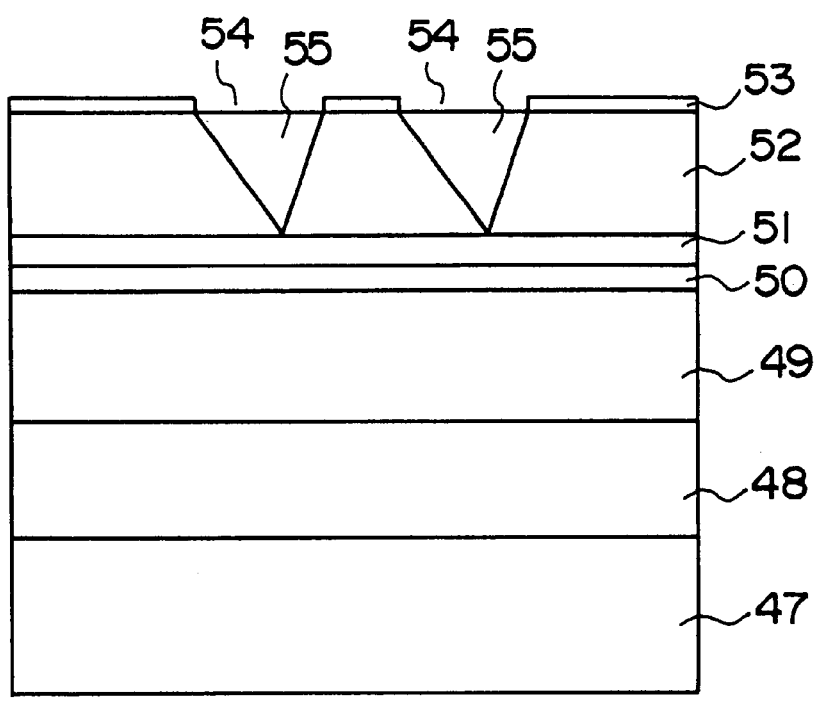

— 200 nm

— 1.5 μm 1.45 eV

— 10 μm 1.48 eV

US 6,235,547 B1

SEMICONDUCTOR DEVICE AND METHOD OF FABRICATING THE SAME

This application is a division of prior application Ser. No. 08/678,549, filed Jul. 9, 1996, now is U.S. Pat. No. 6,011,271, which is a continuation-in-part of application Ser. No. 08/431,298, filed Apr. 28, 1995, abandoned.

BACKGROUND OF THE INVENTION

1. Field of the Invention

The present invention relates to a semiconductor device and a method of fabricating the same and, more particularly, a semiconductor device having a quantum wire, a quantum box etc. employing quantum effect and a method of fabricating the same.

2. Description of the Related Art

Various fine patternings of semiconductor devices have been proposed, and semiconductor devices having new functions have also been proposed. Especially, a trend of forming various structures, which have not been achieved yet, on a semiconductor by employing crystal growth technology has been highly increased. In particular, a tendency of study has been raised such that new properties of matter, which are attained based on physical phenomena not found in the prior art, should be employed by forming a "quantum wire" or a "quantum box" so as to operate the semiconductor device. In the quantum wire or the quantum box, free carriers such as electrons and holes are confined in one or zero-dimensional potential energy by using a hetero junction structure of a compound semiconductor. If carriers are confined two-dimensionally, they move within one dimensional space (line). Such structure is called as the quantum wire. If carriers are confined three-dimensionally, they only have degree of freedom in zero dimensional space (point). Such structure is called as the quantum box (quantum dot). In the quantum box and the quantum wire, state density becomes discretization, and further it can be expressed by delta function. Therefore, it can be expected that carriers in the quantum box and the quantum wire take different behavior from those of carriers which have a three dimensional degree of freedom.

FIGS. 39A to 41B show three quantum box forming techniques in the prior art. FIGS. 39A, 40A, and 41A are sectional views explaining three conventional methods, and FIGS. 39B, 40B and 41B are plan views corresponding respectively to FIGS. 39A, 40A and 41A. If carriers are confined two-dimensionally, they move within one dimensional space (line). Such structure is called as the quantum wire. If carriers are confined three-dimensionally, they only have a degree of freedom in zero dimensional space (point). Such structure is called as the quantum box (quantum dot). In the quantum box and the quantum wire, state density becomes discretization, and further it can be expressed by delta function. Therefore, it can be expected that carriers in the quantum box and the quantum wire take different behavior from those of carriers which have a three dimensional degree of freedom.

FIGS. 39A to 41B show three quantum box forming techniques in the prior art. FIGS. 39A, 40A, and 41A are sectional views explaining three conventional methods, and FIGS. 39B, 40B and 41B are plan views corresponding respectively to FIGS. 39A, 40A and 41A.

For instance, in Patent Application Publication (KOKAI) 2-174268, a device has been set forth wherein carriers are drifted in the quantum wire one-dimensionally. Also, in Patent Application Publication (KOKAI) 4-294331, an optically non-linear optical device has been proposed wherein the quantum wire or the quantum box is employed.

Followings are main conventional methods of fabricating the quantum wire or the quantum box.

As a first method, there is an approach wherein a multilayered film having a quantum well structure or a superlattice structure is first formed by the ordinary method such as MBE (molecular beam epitaxy) and MOVPE (metal organic vapor phase epitaxy), and then the quantum structure is patterned by affecting wet etching, dry etching etc. using a mask to have a desired shape. Since, in the quantum well structure or the superlattice structure formed on a flat surface, carriers can be confined two-dimensionally, one or zero dimensional confinement of the carriers can be attained by patterning the multilayered film constituting such structure. It has been set forth in following articles [1-1] and [1-2] that, when forming such structure, photo-lithography technology or electron beam lithography technology may be employed.

[1-1] P. M. Pertroff et al.: Applied Physics Letters, vol. 41, 1982, pp. 635–638

[1-2] H. Temkin et al.: Applied Physics Letters, vol. 50, 1987, pp. 413–415

FIGS. 39A and 39B show a technique for forming the quantum dot by dry etching. A first energy barrier layer 202 having wide bandgap, a quantum well layer 203 having narrow bandgap, and a second energy barrier layer 204 having wide bandgap are stacked on a substrate 201 in that order, and then a mask 205 is formed thereon. The mask 205 has a circular plane shape, for example, as shown in FIG. 39B.

Using the mask 205 as the etching mask, the energy barrier layers 202, 204 and the quantum well layer 203 are etched by means of dry etching. The quantum well layer 203 treated by dry etching is sandwiched between the energy barrier layers 202 and 204. The circumference of the quantum well layer 203 is defined by a space specified by dry etching according to the mask 205.

The desired quantum box which is formed of the dot-like quantum well layer 203 can be provided by adjusting a thickness of the quantum well layer 203 and a size of the mask 205. However, if the quantum box is formed by dry etching, the quantum well layer 203 is damaged due to dry etching. As a result, it becomes difficult to obtain good crystal states and good electron states.

As a second method, there is another approach wherein an insulating film formed on a semiconductor crystal substrate is first patterned by photolithography technology, and then, using the patterned insulating film as a mask, a multilayered film is formed selectively by chemical vapor deposition such as MOVPE in areas not covered by the mask, thereby fabricating the quantum structure. In this case, the quantum wire or the quantum box can be derived by forming the mask to have a small dimension by means of the photolithography or electron beam lithography technology. Such technology has been recited in following articles [2-1] and [2-2], for example.

[2-1] H. Asai et al.: Applied Physics Letters, vol.51, 1987, pp.1518–1520

[2-2] T. Fukui et al.: Applied Physics Letters, vol.58, 1991, pp.2018–2020

FIGS. 40A and 40B show technique for forming the quantum box by selective etching. An $SiO_2$ mask 206 having openings is formed on the surface of the substrate 201. As shown in FIG. 40B, the $SiO_2$ mask 206 has rectangular openings 207, for example. Respective sides of the openings 207 are aligned to coincide with crystal face orientation of the base substrate 201.

Epitaxial growth is executed on the surface of the substrate 201 exposed in the openings 207 of the $SiO_2$ mask 206. By selecting face orientation of the substrate 201 exposed from the openings 207, the epitaxial growth has been formed in the openings 207 like pyramids wherein its sectional area becomes small as the thickness proceeds upward.

The energy barrier layer 202 and the quantum well layers 203 are grown in respective openings 207 by the epitaxial growth. In this case, the quantum well layer 203 has a small area. By selecting the shape of the opening 207 and layer thickness of the energy barrier layer 202 and the quantum well layer 203, the quantum well layer 203 can serve as the quantum box. However, the quantum box 203 obtained by the above method is formed at the top portion of the pyramid. Therefore, it is not easy to connect the quantum box 203 to external wirings.

As has been stated above, the technique for forming the quantum dot by dry etching or selective growth may form fine structures on the desired locations, but satisfactory results have not been derived since it is hard to form the quantum dot itself.

As a third method, there is still another approach wherein a semiconductor film can be grown by the MBE or the MOVPE on a semiconductor substrate processed in advance by wet etching or dry etching, thereby fabricating the quantum wire or the quantum box.

However, in the first method described above, the etching process is performed after the film having the quantum structure is fabricated. For this reason, damage and contamination caused during the process remain in the quantum wire or the quantum box. As a result, it has been pointed out that good optical characteristic and electric characteristic thereof cannot be derived by the first method.

Therefore, active components of the device should be formed by a crystal growth method rather than the first method. Consequently, the second and third methods above described are developed vigorously.

For instance, there can be found many reports wherein the quantum wire structure is fabricated by forming a stripe mask on a (001) face of a III-V group compound semiconductor such as GaAs and InP, either etching exposed areas, which are not covered by the stripe mask, to thus form a so-called V-shaped groove section and then growing a multilayered semiconductor film constituting the hetero junction structure or growing the multilayered semiconductor film directly on the (001) face of the III-V group compound semiconductor in areas, which are not covered by the stripe mask.

These technologies are set forth in following articles [3-1] to [3-3], for example.

[3-1] E. Kapon, S. Simhony, R. Bhat and D. M. Hwang: Applied Physics Letters, vol.55, 1989, p.2715–2717

[3-2] E. Kapon, et al.: Applied Physics Letters, vol.50, 1987, pp.347–349

[3-3] S. Tsukamoto et al.: J. Applied Physics, vol.71, 1992, p.533–p.535

FIGS. 41A and 41B show a natural forming technique of the quantum dot. An AlGaAs buffer layer 212 and a GaAs layer 213 are formed in that order by epitaxial growth on a GaAs substrate 211 having (111) surfaces. An InGaAs layer 214 in which In composition is set to about 0.5 so as to have large lattice mismatching is grown on the GaAS layer 213, and a GaAs layer 215 is grown thereon. By either selecting growth temperature or executing annealing process after the epitaxial growth, spherical areas 216 having large In composition are generated in the InGaAs layer 214. The spherical areas 216 are generated naturally, and have the size enabling the quantum dot to be achieved.

Leonard et al. have reported that such spherical areas can be formed by molecular beam epitaxy (MBE).[4]D. Leonard et al., Appl. Phys. Lett. 63 (1993), pp.3203–3205

In addition, Mukai et al. have reported that such $In_{0.5}Ga_{0.5}As$ quantum dot can be formed from the InAs/GaAs stacked layer by atomic layer epitaxy using low pressure metal organic vapor phase epitaxy (LP-MOVPE). [5]K. Mukai et al., Jpn. J. Appl. Phys, 33 (1994), pp.L1710–L1712

In addition, Oshinowo et al. have reported that the same quantum dot can be obtained by growing the InGaAs layer on the GaAs substrate by means of metal organic chemical vapor deposition (MOCVD).[6]J. Oshinowa et al., Appl. Phys. Lett. 65 (1994), pp.1421–1423

In addition, Marzin et al. have reported that the quantum dot can be derived by growing the InAs layer and the GaAs layer on the (100) GaAs substrate by means of MBE.[7]J. Y. Marzin et al., Phys. Rev. Lett. 73 (1994), pp.716–719

The natural forming techniques of the quantum dot, as described above, have advantages such that the quantum dot is scarcely damaged since they do not use dry etching process, and that the surface of the substrate can be kept even after forming the quantum dot.

However, locations of the quantum dots cannot be controlled on the substrate plane, so that the quantum dot distributes on the surface of the substrate at random. In case an electron device will be formed, carriers must be injected into the quantum dot and also carriers must be extracted from the quantum dot. Unless the locations of the quantum dot can be controlled, the electron device becomes difficult to operate.

With the above, although several techniques for forming the quantum dots have been proposed, it is difficult to form the less damaged quantum dots on desired locations.

On the contrary, as another tendency of study, while adopting silicon system semiconductors which are a main stream of current electronic devices, studies for fabricating new electronic devices or new optical devices by introducing the hetero junction structure into the silicon system semiconductor have been made. For example, as set out in an article [8], an HBT (Hetero Junction Bipolar Transistor) in which an Si layer is employed as a wide emitter by utilizing an Si/Ge hetero junction has been studied. As set forth in an article [9], a light emitting device utilizing the Si/Ge hetero junction has been studied.

[8] H. V. Schreiber et al.: Electron Letters, vol.25, 1989, p.185

[9] D. J. Robbins et al.: Applied Physics Letters, vol.59, 1991, p.1350

However, above studies are confined to only a general idea. Therefore, they lack concrete processes to fabricate a fine structure for causing quantum size effect or single electron tunneling with high density and uniformly.

For example, a device of the superlattice structure in which plural layers, each having a thickness of several tens Å, are stacked so as to form a multilayered structure can be relatively firmly fabricated. It has been just stated that, in order to form the quantum wire by fine-patterning such multilayered structure or to form the quantum box by reforming such multilayered structure as a dot, the photolithography technology or the electron beam lithography technology may be utilized. However, there has been no practical proposal how to perform the fine-patterning or the dot-forming concretely.

SUMMARY OF THE INVENTION

It is an object of the present invention to provide a quantum semiconductor device having a new quantum wire structure and a quantum box, and a method of fabricating the same.

It is another object of the present invention to provide a device structure used for fabricating a silicon system semiconductor device, in which quantum size effect or single electron tunneling is employed, firmly and with good reproducibility, and a method of fabricating the same.

An object of the present invention is to provide a method of fabricating a quantum effect semiconductor device capable of forming less damaged quantum dots on desired locations.

According to an aspect of the present invention, there are provided a device having either a quantum box structure alone or a quantum wire structure alone, or a structure in which two or three of the quantum box, the quantum wire and the quantum well are combined, and a method of fabricating the same.

More specifically, concave sections, having an inverse regular tetrahedron shape or its similar shape, is first formed by means of the photolithography etc. on a (111)B face or (111)A face substrate of a III-V group semiconductor or on a substrate having face orientation similar to the III-V group semiconductor. The III-V group semiconductor has a zincblend type crystal structure. Then, selective growth or regrowth of a semiconductor in respective concave sections is effected by a growth method like MBE, MOVPE or ALE (Atomic Layer Epitaxy), thus resulting in the quantum structure. Note that the inverse regular tetrahedron (triangular pyramid) can be formed by utilizing an extremely small etching rate in a $\{\bar{1}\bar{1}1\}$A face or a (111)B face in contrast to those in other faces.

In such concave sections, the quantum box is formed on a point of the bottom of the inverse regular tetrahedron, the two-dimensional quantum well layer is formed on a side surface of the triangular shape, and the quantum wire is formed on a intersecting line (valleyline) of the side surfaces.

Another object of the present invention is to provide a quantum effect semiconductor device having quantum dots which are fabricated readily.

According to an aspect of the present invention, there is provided a method of fabricating a quantum effect semiconductor device comprising the steps of forming a mask having opening portions on a surface of a substrate having specific face orientation, forming concaves having side faces which are converged respectively toward tops on bottoms in proportion to depth by etching said surface of said substrate via said opening portions of said mask, and growing quantum effect layers by growing consecutive compound semiconductors which have respectively different energy band structures on said tops and said side faces surrounding said tops on inner faces of said concaves.

According to another aspect of the present invention, there is provided a quantum effect semiconductor device comprising a substrate having a surface having specific face orientation, concaves formed on said surface of said substrate and having side faces which are converged respectively toward tops on bottoms in proportion to depth, and first compound semiconductors formed in said concaves and having different energy band structures on said tops and said side faces.

Since the quantum dots are formed in concaves formed on the surface of the semiconductor substrate, locations of the quantum dots can be determined precisely. In addition, since the quantum dots can be automatically formed by crystal forming techniques, the quantum dots are less damaged.

By adjusting the number and thickness of layers to be grown, a semiconductor device using various quantum dots can be formed.

According to another aspect of the present invention, inverse pyramid like concave sections are first formed on a single crystal semiconductor substrate having a diamond structure using its face orientation dependency of etching rate, and then an active area having a fine structure is formed by film growth in each concave section. For this reason, the quantum semiconductor device can be formed simply, precisely and with good reproducibility.

Further, if utilizing the bottom section, the valleyline section, and the sidewall section of the sharp concave section, the structures showing quantum effect having different dimensions like fine quantum box, quantum wire and quantum well layer can be formed independently or compositely.

Furthermore, if a barrier layer constituting the fine structure is formed to have a thickness through which carriers (electrons or holes) can be tunneled, a resonance tunneling device can be formed. In addition, if part of the resonance tunneling device is formed to have a size capable of showing Coulomb-blockade effect, a single electron tunneling device can be formed.

Besides, if a substrate having a {100} face is employed as the semiconductor substrate, inverse regular quadrangular pyramid concave sections whose side wall surfaces are a (111)face can be precisely formed.

In addition, if a mask having circular or rectangular opening sections therein is first formed on the {100} face of the semiconductor substrate having diamond structures and also an anisotropic etching having small etching rate in the (111)face in comparison with etching rates in other faces is effected using the mask, etching can be stopped at edges of the opening sections. For this reason, a size of the bottom of the concave section can be defined precisely by adjusting a size of the opening section of the mask.

If processing steps of forming the fine structure are carried out in a state wherein the mask is left on the semiconductor substrate, other areas are never influenced harmfully by such processing steps. In addition, if a conductive mask is used as the mask, the conductive mask can be also used as part of wiring layers.

Employing this technology described above, the way for forming the quantum box, which is hard especially to be fabricated until now can be opened. In addition, it can be considered that a fabrication of a new device employing this structure will be accelerated.

BRIEF DESCRIPTION OF THE DRAWINGS

FIGS. 15A to 15E are sectional views showing manufacturing steps of a semiconductor device according to the second embodiment of the present invention;

DESCRIPTION OF THE PREFERRED EMBODIMENT

There will be described preferred embodiments of the present invention hereinafter with reference to the accompanying drawings.
(First Embodiment)

In the first embodiment, concave sections are formed on a compound semiconductor layer, and semiconductors are formed in the concave sections. Thus, quantum structures such as quantum box, quantum wire, or quantum well layer can be formed. The quantum box is a structure wherein carriers are confined zero-dimensionally, the quantum wire is a structure wherein carriers are carried one-dimensionally, the quantum well layer is a structure wherein carriers are carried two-dimensionally.

Next, a concave section forming method, a film growth method, and a quantum structure forming method will be explained in detail.

(1) Compound semiconductor layer in which concave portions are formed:

As the compound semiconductor layer on which the concave sections are formed, either single crystal substrate (bulk) or semiconductor film formed on a single crystal substrate by epitaxial growth may be used.

As a material constituting the substrate, III-V group compound semiconductor may be used, for example. As a binary system semiconductor substrate, a substrate made of gallium-arsenide (GaAs), indium-phosphide (InP), or gallium-phosphide (GaP), for example, may be used. As a ternary system semiconductor substrate, a substrate made of InGaAs, for example, may be used.

Further, as a III-V group compound semiconductor film formed by epitaxial growth, either a ternary mixed crystal such as AlGaAs, InGaAs, InAlAs, InGaP, AlGaAs or AlGaP or a quaternary mixed crystal such as AlGaAsP, InGaAlAs, InGaAlP, or InGaAsP as well as the binary system compound such as GaAs, InP, or GaP may be used. Note that a multilayer-stacked structure may be used as the compound semiconductor film.

As a material of the semiconductor layer, a II-VI group compound semiconductor such as zinc-selenide (ZnSe), zinc-telluride (ZnTe), and cadmium-telluride (CdTe) may be used in addition to the III-V group semiconductor layer.

A zincblende type crystal structure may be adopted as the crystal structure of the compound semiconductor layer. A (111)B face may be set as a principle face on which the concave sections are formed.

An A-face of a group III-V compound semiconductor is the group III element, and a B-face of the group III-V compound semiconductpor is the group V element.

(2) Formation of concave sections:

The following are the manufacturing steps of forming the concave sections on the (111)B face of the compound semiconductor layer.

Figure 1A:
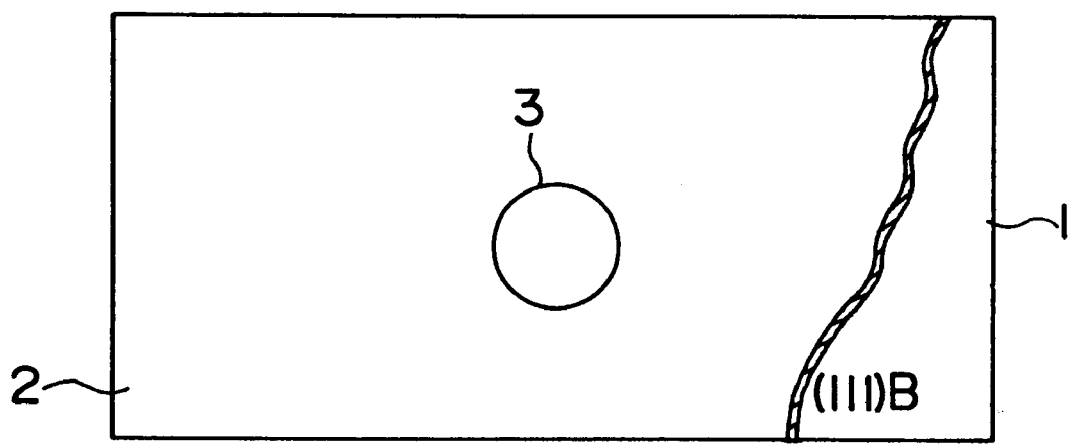
FIGS. 1A and 1B are plan views showing manufacturing steps of forming a concave section having a regular tetrahedron shape used in a first embodiment of the present invention in a crystal layer.

First, as shown in FIG. 1A, a silicon oxide film ($SiO_2$ film) 2 is formed by CVD method etc. on the (111)B face of the compound semiconductor layer 1 having the zincblende type crystal structure. Subsequently, the $SiO_2$ film 2 is patterned by the photolithography technology to form round holes 3 having a diameter of 1 to 50 $\mu$m, for example. The $SiO_2$ film 2 may be used as an etchingproof mask.

Then, the compound semiconductor layer 1 is etched by etching solution through the round holes 3. Such solution may be used as the above etching solution that either an etching rate in the $\{\bar{1}\ \bar{1}\ 1\}$ A face of the compound semiconductor layer 1 is zero or close to zero, or an etching rate in the $\{\bar{1}\ \bar{1}\ 1\}$ A face of the compound semiconductor layer 1 becomes extremely small in contrast to those in other faces.

Figure 1B:
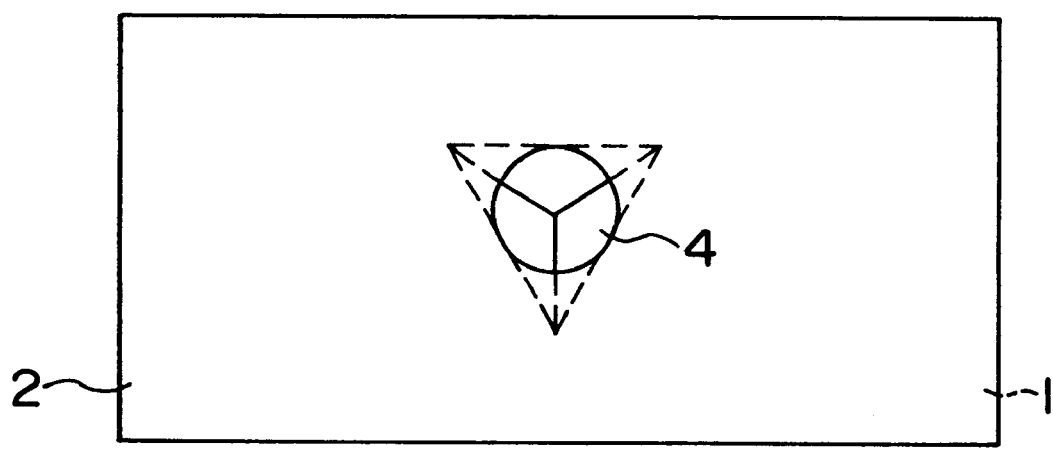

As shown in FIG. 1B, either concave sections 4 of regular tetrahedron having four triangle faces and four apexes, i.e., regular tetrahedrons or concave sections 4 having similar tetrahedron are formed on the compound semiconductor layer 1 by the etching process. One apex of the tetrahedron is located on its bottom, and remaining three apexes of the tetrahedron are located on the (111)B face of the compound semiconductor layer 1. For example, an edge line of the round hole 3 in the mask is inscribed in a triangle which appears on the (111)B face of the tetrahedron. Therefore, the etching is stopped at the edge line under such condition.

Figure 2:
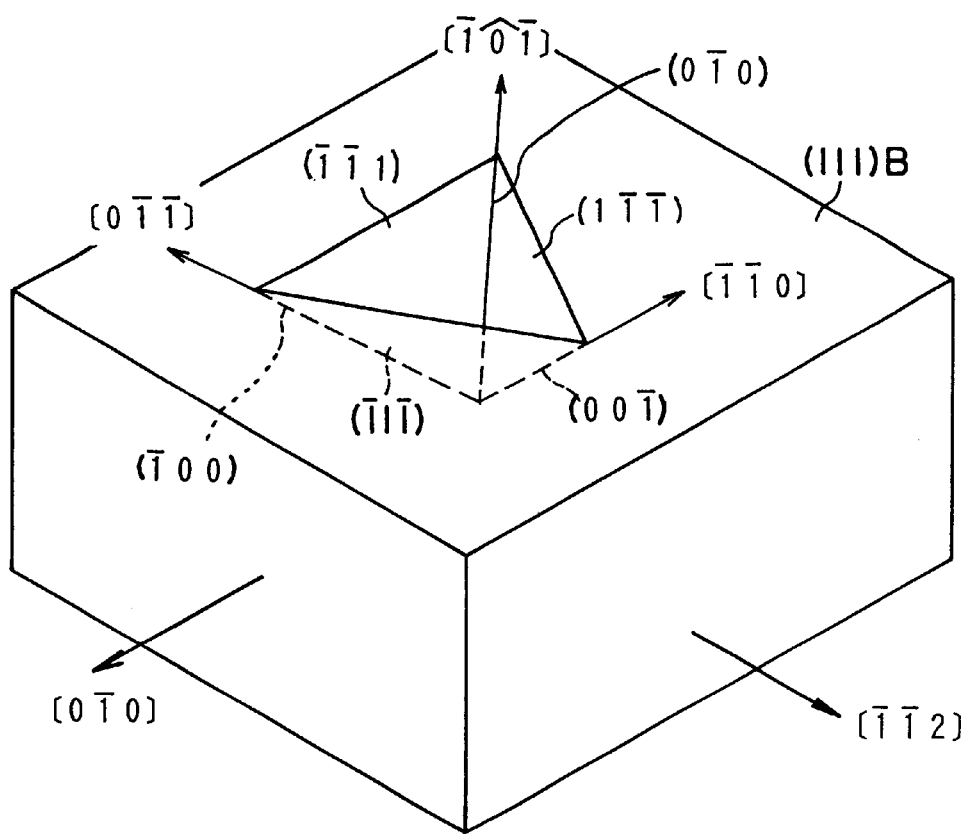
FIG. 2 is a perspective view showing a concave section shown in FIG. 1B.

The concave section 4 having the regular tetrahedron is formed to have a shape shown in a perspective view of FIG. 2.

As shown in FIG. 2, three intersecting lines (valleylines) which are formed by intersecting three $\{\bar{1}\,\bar{1}\,1\}$ A faces in the compound semiconductor layer 1 extend in the <$\bar{1}\,\bar{1}\,0$> direction, and the intersecting lines exist on the $\{\bar{1}\,00\}$ face.

Next, a detailed method of forming concave sections in the (111)B face of the GaAs (III-V group semiconductor) substrate will be explained as a definite example.

Figure 3A:
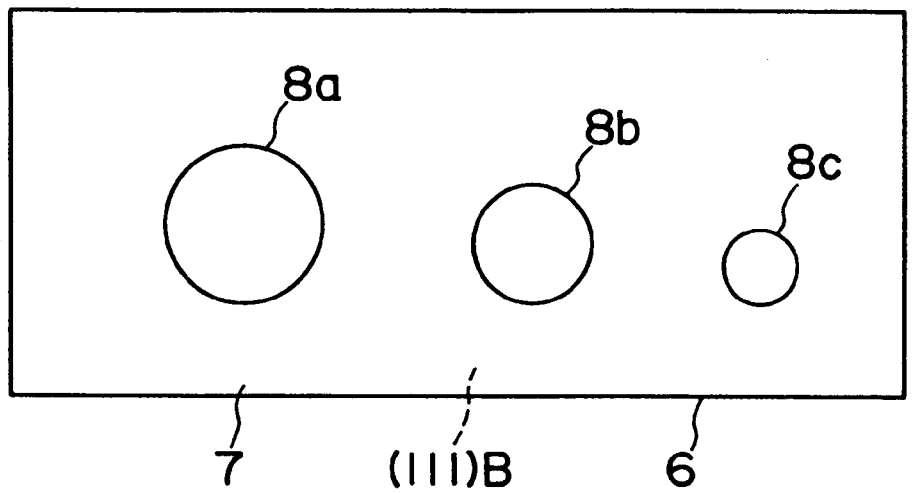
FIGS. 3A and 3B are plan views showing manufacturing steps of forming the concave section used in the present invention by employing masks having round holes with different diameters.

First, as shown in FIG. 3A, an $SiO_2$ film 7 is formed by CVD method etc. on the (111)B face of the GaAs substrate 6 to have a thickness of about 100 nm. After this, round holes 8a to 8c having different diameters within a range of 1 μm to 50 μm are opened in the $SiO_2$ film 7 by the ordinary photolithography technology.

Figure 3B:
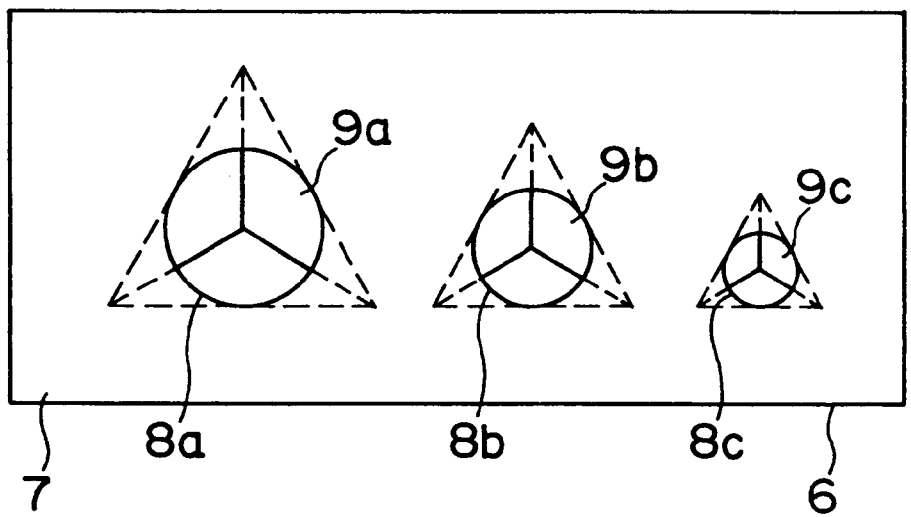

The GaAs substrate 6 is then etched by $Br_2$—$C_2H_5OH$ etching solution having a volume concentration of 1% to cause anisotropic etching through the round holes 8a to 8c. As a result, as shown in FIG. 3B, concave sections 9a to 9c each having the tetrahedron shape defined by three $\{\bar{1}\,\bar{1}\,1\}$ A faces are formed. This is because the wet etching rate of the GaAs substrate 6 having the zincblende type crystal structure becomes substantially zero in the ($\{\bar{1}\,\bar{1}\,1\}$ A face thereof and the rate is therefore significantly small in comparison with those in other faces. Note that, as the etching solution, a solution of $NH_4OH$ added with $H_2O_2$ may be used.

As the result of observing deepest sections of the concave sections 9a to 9c by a high resolution scanning electron microscope (SEM), it has been confirmed that three $\{\bar{1}\,\bar{1}\,1\}$ A faces substantially completely intersect each other in the concave sections 9a to 9c of the GaAs substrate 6 and no flat face is found at the bottom portion of the concave sections 9a to 9c. In addition, in case the etching is performed in the above described manner, the etching has been ceased automatically in an area where triangle $\{\bar{1}\,\bar{1}\,1\}$ A faces are formed on the side walls of the concave sections 9a to 9c. Even if the etching is continued for a prolonged time, the concave sections 9a to 9c are not extended into areas into which the round holes 8a to 8c of the $SiO_2$ film 7 are fully entered.

This is because undercuts are not produced in contact portions of the $SiO_2$ film 7 and the GaAs crystal. Hence, even when, using round holes 8a to 8c having different diameters, the etching process is effected for a sufficiently long time, the concave sections 9a to 9c each having a regular tetrahedron shape and having similar figures are formed around these round holes 8a to 8c, as shown in FIG. 3B. In other words, the etching is ceased automatically at the time when regular tetrahedrons, which have a regular triangle circumscribed about the round holes 8a to 8c formed on the (111)B face as one face, are formed.

Although, if taking shapes of these concave sections 9a to 9c into consideration, a significant advantage can be attained such that a size of the regular triangle formed on the (111)B face changes depending upon the dimension of initial round holes 8a to 8c, uniform shapes can be formed near the deepest portion of the concave section in all structures. As a result, in order to fabricate the quantum structures each having a uniform shape, a significant merit can be obtained.

Figure 4:
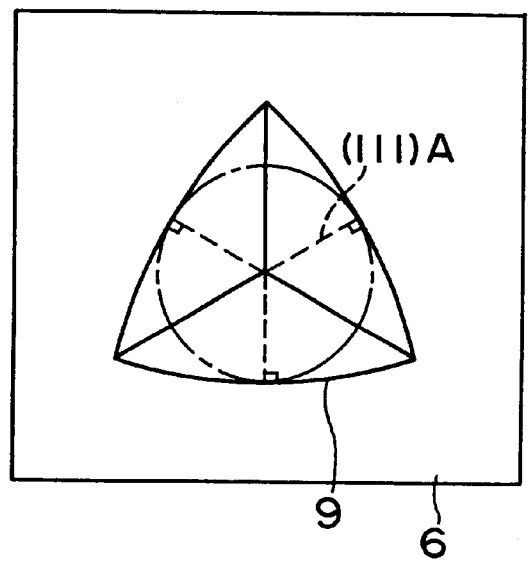
FIG. 4 is a plan view showing the concave section used in the first embodiment of the present invention having a regular tetrahedron shape.

In the meanwhile, according to the experiment by the present inventors, the concave sections 9a to 9c formed by the etching solution employing the mask on the GaAs substrate 6 are not always formed as the regular tetrahedron, but are formed as a tetrahedron similar to the regular tetrahedron. For example, as shown in FIG. 4, there are some cases where each of three triangular faces, which reside in the GaAs substrate 6, is formed to have a slightly outwardly curved shape. In these triangular faces, a perpendicular line drawn from the apex on the bottom resides along the $\{\bar{1}\,\bar{1}\,1\}$ A face thereof. On the other hand, in the concave sections (not shown) of regular tetrahedron formed on the InP substrate in the same manner, three triangular faces in the InP substrate become almost plane faces, so that cubic shapes which are very close to the regular tetrahedrons could be always derived. In this case, the $Br_2$—$C_2H_5OH$ having a volume concentration of 1% has been used as the etching solution for the InP substrate.

Figure 5A:
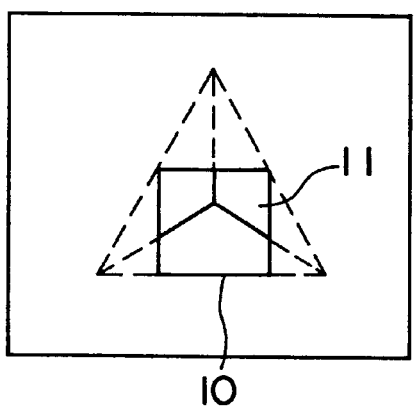
FIGS. 5A and 5B are plan views each showing a window in the mask used in the first embodiment of the present invention having a shape excluding a round shape.
Figure 5B:
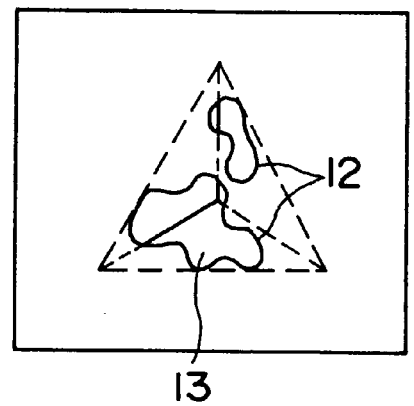

By the way, in the above discussions, round holes are formed in the mask and the etching is effected therethrough when forming the concave sections of the tetrahedron. However, the mask is not restricted to the round shape. For example, as shown in FIGS. 5A and 5B, it has been confirmed that, if either quadrangular holes 10 or plural undefined shaped holes 12 are used, the concave sections 11 or 13 are formed so as to be circumscribed about these holes 10 or 12, respectively.

Now, there may be an insulating film such as SiN, SION, or a conductive film such as W, WSi in addition to the $SiO_2$ film as a mask material. Note that any mask material having good close contact to the compound semiconductor layer and causing no undercut in the substrate may be used. Further, the semiconductor material, which can be obtained by stacking different kind of semiconductors and employing a certain enchant that enables selective etching, may be used as a mask. For instance, there are InGaP formed on the GaAs, InGaAs formed on the InP and the like.

(3) Method of forming quantum box, quantum wire and quantum well layer selectively:

In view of crystallography, respective crystal faces formed in the concave sections described above have significantly different chemical qualities.

For instance, if considering the growth of GaAs, stability of an arsenic (As) atom is increased on the $\{\bar{1}\,\bar{1}\,1\}$ A face, the $\{100\}$ face, and the (111)B face in that order. This is relevant to how many linkages are utilized to connect the arsenic atom located in a most external layer to the gallium atom located in a second external layer. That is, three linkages are used in the (111)B face, two linkages are used in the $\{100\}$ face, and one linkage is used in the $\{\bar{1}\,\bar{1}\,1\}$ A face.

Based on semiconductor growth experiments by MOVPE, MBE or the like, it has been reported that growth rates in these faces are significantly concerned with the stability of arsenic. In other words, the stability of arsenic becomes extremely high in the (111)B face. Hence, excessive absorption of arsenic occurs in the surface during the crystal growth process, so that it prevents gallium atoms from entering into the crystal. This characteristic becomes remarkable as a growth temperature becomes low and an arsenic supply amount is increased.

Consequently, either the higher the growth temperature becomes in the (111)B face or the smaller the arsenic supply amount becomes, the larger the growth rate of arsenic containing compound semiconductor becomes in the (111)B face. On the other hand, either the lower the growth temperature becomes in the (111)B face or the larger the arsenic supply amount becomes, the smaller the growth rate of arsenic containing compound semiconductor becomes in the (111)B face.

Further, since the bond of arsenic is unstable in the $\{\bar{1}\,\bar{1}\,1\}$ A face, the growth of the semiconductor is not caused unless the growth temperature is set low and the arsenic supply amount is increased. If a high growth temperature is selected and the arsenic supply amount is decreased, the growth of the semiconductor is never caused. The {100} face has an intermediate characteristic between the (111)B face and the {$\bar{1}\bar{1}1$} A face.

Therefore, if employing the fact that a growth rate of the arsenic containing semiconductor in these faces depends upon the growth temperature and the arsenic supply amount, growth distribution of the arsenic containing semiconductor, for example, the GaAs semiconductor, formed on inner surfaces of the concave sections, each having the regular tetrahedron shape, can be controlled by changing these conditions.

Namely, if the growth of the semiconductor is conducted under the very low growth temperature and the high As supply amount, the arsenic containing semiconductor is grown, as it is, with reflecting an original regular tetrahedron shape. Thus, three {$\bar{1}\bar{1}1$} A faces are dominantly grown.

If either the growth temperature is increased or the arsenic supply amount is decreased, growth rates of both three {$\bar{1}\bar{1}1$} A faces and {$\bar{1}00$} faces on these intersecting portions are accelerated whereas growth rate of the (111)B face as the bottom face of the regular tetrahedron is suppressed beyond certain conditions. Further, if either the growth temperature is raised or the arsenic supply amount is reduced, growth in the (111)B face begins and the growth rate of the arsenic containing compound semiconductor in the (111)B face, the {$\bar{1}\bar{1}1$} A face, and the {$\bar{1}00$} face become substantially uniform beyond another certain conditions. Furthermore, if either the growth temperature is raised or the arsenic supply amount is reduced, the growth in the {$\bar{1}00$} face and the (111)B face becomes dominant. Finally, the growth is done in only the (111)B face.

In any event, in case the quantum well structure should be formed along inner faces of the concave sections having the regular tetrahedron, barrier layers, well layers, and barrier layers are grown in that order. When growing the barrier layers, such a condition must be selected that the growth rate in the (111)B face, the {$\bar{1}\bar{1}1$} A face, and the {$\bar{1}00$} face becomes substantially equal. Also, when growing the well layers, it is possible to form selectively the quantum well layers, the quantum wire, the quantum box by changing the growth rates in the (111)B face, the {$\bar{1}\bar{1}1$} A face, and the {$\bar{1}00$} face.

These conditions are shown qualitatively as in FIG. 6. Five combinations of the growth rate and the arsenic supply amount can be considered.

Figure 6A:
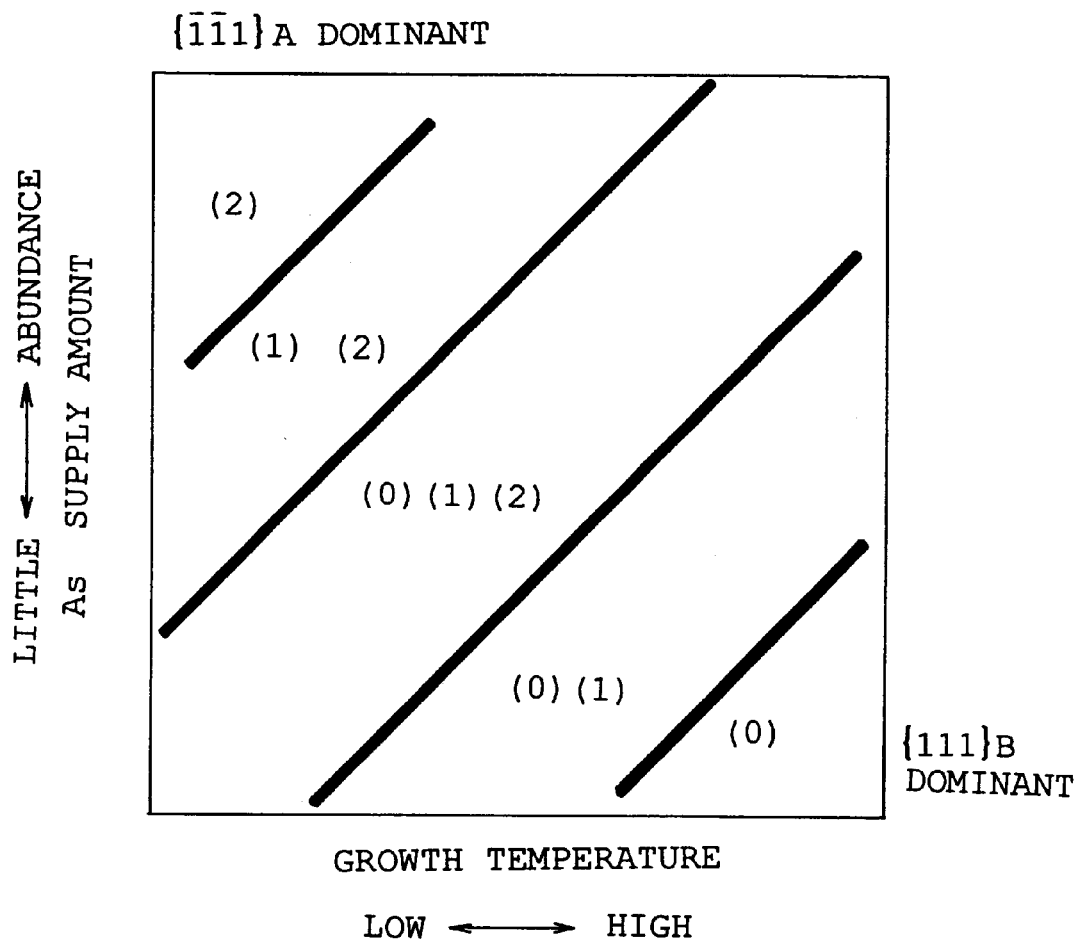
FIG. 6A is a view a relationship between partial pressure of arsenic and growth temperature in order to selectively forming the quantum box, the quantum wire and the quantum well according to the first embodiment of the present invention.
Figure 6B:
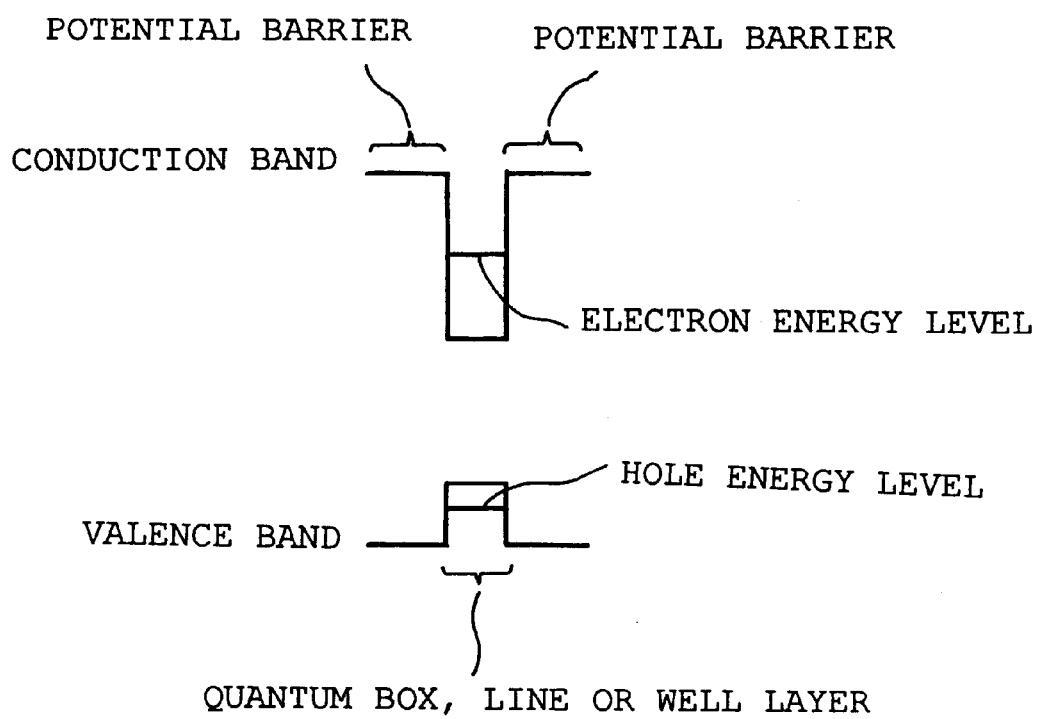
FIG. 6B is a energy band diagram of a quantum box, a quantum wire or a quantum well layer.
Figure 7A:
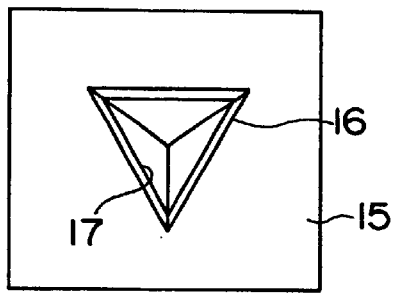
FIG. 7A is a plan view showing the quantum well formed selectively in the concave section used in the first embodiment of the present invention.
Figure 7B:
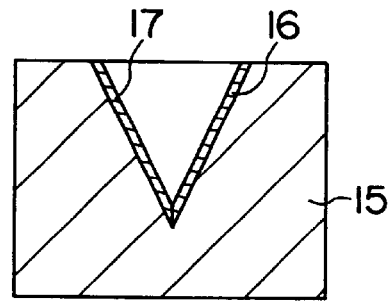
FIG. 7B is a sectional view showing the quantum well in FIG. 7A.

In FIG. 6A, as a first combination, if the growth temperature is set to be lowest and the arsenic supply amount is set to be highest when forming the quantum well structure, the arsenic containing compound semiconductor is grown dominantly on three {$\bar{1}\bar{1}1$} A faces in the concave sections of regular tetrahedron. Each of the quantum box, the quantum wire, and the quantum well layer has the energy band diagram as shown FIG. 6B. Therefore, the quantum wells are preferentially formed on the {$\bar{1}\bar{1}1$} A faces, and thus they are not formed on other areas. In this case, the compound semiconductor has a plan structure, as shown in FIG. 7A, and has a sectional shape, as shown in FIG. 7B, in the concave sections having regular tetrahedrons. In FIGS. 7A and 7B, reference 15 denotes a substrate; 16, the concave section; and 17, a film (the same are true in following Figures).

Figure 8A:
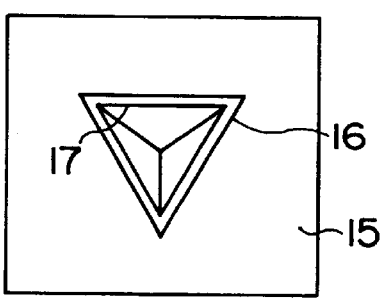
FIG. 8A is a plan view showing the quantum well and the quantum wire formed selectively in the concave section used in the first embodiment of the present invention.
Figure 8B:
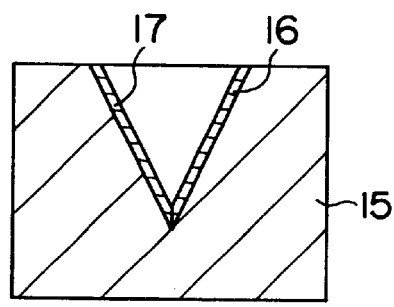
FIG. 8B is a sectional view showing the quantum well and the quantum wire in FIG. 8A.

As a second combination, if the growth temperature and the arsenic supply amount are set to grow the semiconductor on the {$\bar{1}\bar{1}1$} A face and the {$\bar{1}00$} face preferentially when forming the quantum well structure, the quantum well is formed on the {$\bar{1}\bar{1}1$} A face, and the quantum wire is formed on the intersecting line of the {$\bar{1}00$} faces (valleyline of the tetrahedron) between the {$\bar{1}\bar{1}1$} A faces. In the growth conditions of this case, at least either of conditions must be selected that, in comparison with the first combination, the growth temperature is set to be high and the arsenic supply amount is set to be small. In this case, the compound semiconductor has a plan structure, as shown in FIG. 8A, and has a sectional shape, as shown in FIG. 8B, in the concave sections of regular tetrahedron.

Figure 9A:
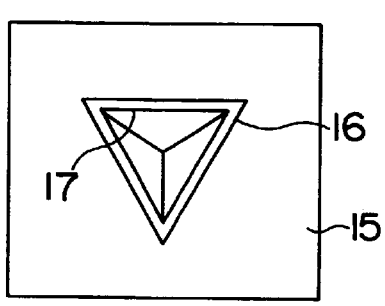
FIG. 9A is a plan view showing the quantum well, the quantum wire and the quantum box formed selectively in the concave section used in the first embodiment of the present invention.
Figure 9B:
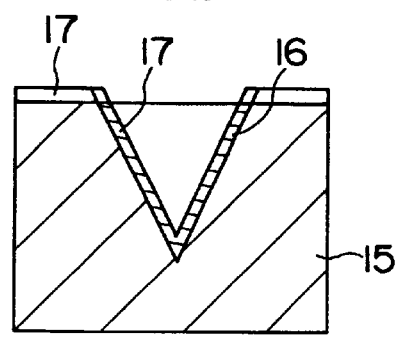
FIG. 9B is a sectional view showing the quantum well, the quantum wire and the quantum box in FIG. 9A.

As a third combination, if growth conditions are set to attain the substantially same growth rate on the (111)B face, the {$\bar{1}\bar{1}1$} A face and the {$\bar{1}00$} face when forming the quantum well layer, the quantum wells are formed on three {$\bar{1}\bar{1}1$} A faces, the quantum wires are formed on three {$\bar{1}00$} faces, and the quantum box is formed on the (111)B face formed on the apex of the bottom of the concave section. In the growth conditions of this case, at least one of conditions must be selected that, in contrast to the second combination, the high growth temperature is set and also the small arsenic supply amount is set. In this case, the compound semiconductor has a plan structure, as shown in FIG. 9A, and has a sectional shape, as shown in FIG. 9B, in the concave sections of regular tetrahedron.

Figure 10A:
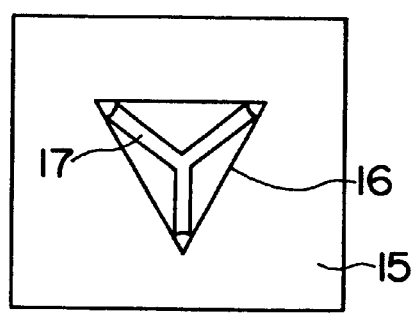
FIG. 10A is a plan view showing the quantum well and the quantum wire formed selectively in the concave section used in the first embodiment of the present invention.
Figure 10B:
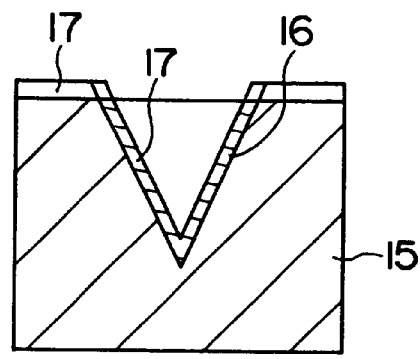
FIG. 10B is a sectional view showing the quantum well and the quantum wire in FIG. 10A.

As a fourth combination, if growth conditions are set to attain the substantially same growth rate on the (111)B face and the {$\bar{1}00$} face when forming the quantum well layer, the quantum wires are formed on the intersecting line (valley) of three {$\bar{1}00$} faces between three {$\bar{1}\bar{1}1$} A faces, and the quantum box is formed on the (111)B face formed on the apex of the bottom of the concave section. But, the quantum wells are not formed on three {$\bar{1}\bar{1}1$} A faces. In the growth conditions of this case, at least one of conditions must be selected that, in comparison with the third combination, the growth temperature is selected to be high and that the arsenic supply amount is set to be small. In this case, the compound semiconductor has a plan structure, as shown in FIG. 10A, and has a sectional shape, as shown in FIG. 10B, in the concave sections of regular tetrahedron.

Figure 11A:
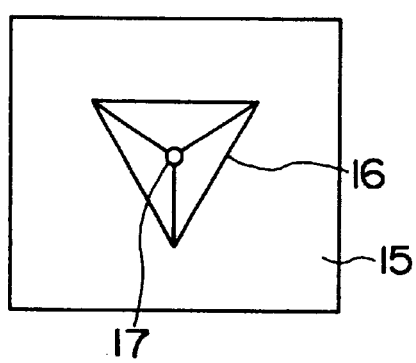
FIG. 11A is a plan view showing the quantum box formed selectively in the concave section used in the first embodiment of the present invention.
Figure 11B:
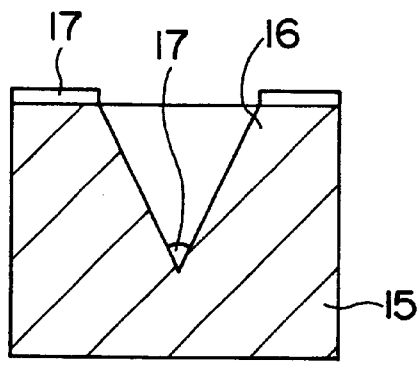
FIG. 11B is a sectional view showing the quantum box in FIG. 11A.

As a fifth combination, if growth conditions on the (111)B face are preferentially set when forming the quantum well layer, the quantum box is formed on the (111)B face formed on the apex of the bottom of the regular tetrahedron. However, the quantum wells and the quantum wire are not formed on other areas. In the growth conditions of this case, at least one of conditions must be selected that, in contrast to the fourth combination, the growth temperature is selected to be high and that the arsenic supply amount is selected to be small. In this case, the compound semiconductor has a plan structure, as shown in FIG. 11A, and has a sectional shape, as shown in FIG. 11B, in the concave sections of regular tetrahedron.

The specific growth temperature and arsenic supply amount are varied by the growth method, the growth apparatus, and materials used for the growth. However, relations between the quantum structure and changes in the growth temperature and the arsenic supply amount are not varied.

In the above described explanation, the growth rate of the arsenic containing compound semiconductor layer has been varied on the {$\bar{1}00$} face, the (111)B face and {$\bar{1}\bar{1}1$} A face by changing the arsenic supply amount. Note that such characteristic is not limited to the arsenic containing compound semiconductor. In case the compound semiconductor including the V group elements such as phosphorous, antimony etc. other than the arsenic, a face which can be preferentially grown by changing the supply amount of these V group elements must be selected.

(4) Specific example for forming quantum structure:

Next, a method of forming the quantum box will be explained as an example.

Figure 12A:
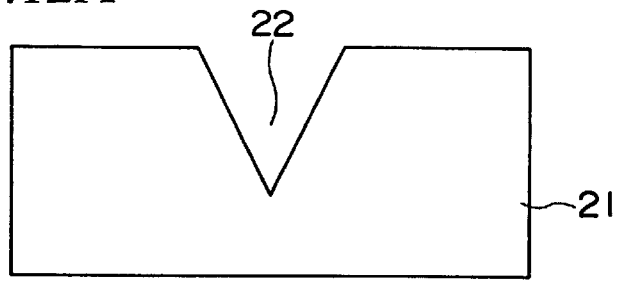
FIGS. 12A to 12D are sectional views showing manufacturing steps of forming the quantum box in the concave section having the regular tetrahedron formed in a (111)B face of a GaAs substrate according to the first embodiment of the present invention.

First, as shown in FIG. 12A, the concave section 22 having the tetrahedron shape is formed on a GaAs substrate 21 by the above described method. A mask is removed in FIG. 12A.

After this, the compound semiconductor is formed by the reduced pressure MOVPE method. An apparatus used for growing the semiconductor is a vertical type reduced pressure MOVPE apparatus wherein the GaAs substrate 21 is placed in a reaction tube. In the growth apparatus, the growth temperature of the compound semiconductor is set at 780° C., the pressure in growth atmosphere is set at 50 Torr. Triethylgallium (TEGa), dimethylethylamineallane (DMEAAl), and arsine ($AsH_3$) are utilized as a growth material gas. AlAs and GaAs are selectively grown by introducing the mixed gas of high purity $H_2$ gas (carrier gas) and these material gases. In case of growing the GaAs, both TEGa and $AsH_3$ are employed as materials. Further, in case of growing the AlAs, both $AsH_3$ and DMEAAl are utilized as materials.

In the reaction tube, TEGa has $1.6 \times 10^{31\ 6}$ atm, DMEAAl has $5 \times 10^{31\ 7}$ atm, $AsH_3$ has $3 \times 10^{31\ 5}$ atm to $2 \times 10^{-3}$ atm.

Figure 12B:
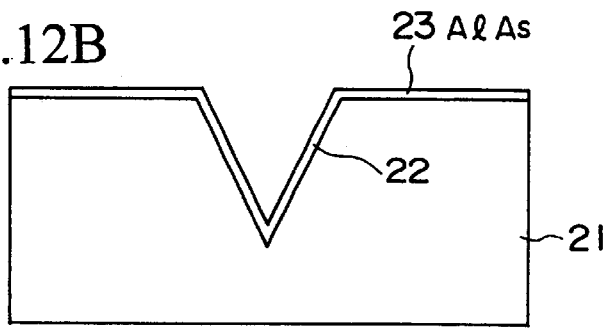
Figure 12C:
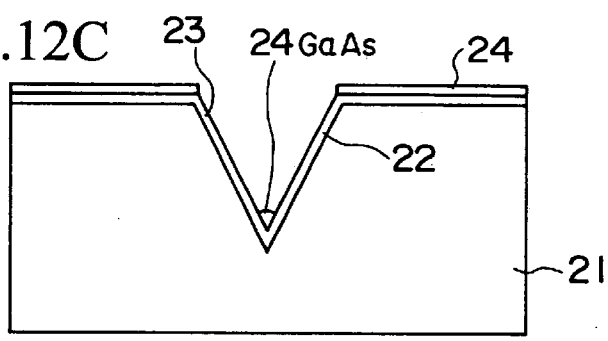

Under these conditions, as shown in FIG. 12B, the AlAs layer 23 is grown up to 10 nm and then, as shown in FIG. 12C, the GaAS layer 24 is grown to have a thickness of 5 nm, and the AlAs layer 25 is in turn grown to have a thickness of 10 nm, thus fabricating the quantum structure. At this time, growth thicknesses are corrected on the (111)A face of a dummy wafer.

However, a partial pressure of $AsH_3$ is set to high partial pressure of $2 \times 10^{-3}$ atm when growing the AlAs layers 23, 25 and set to low partial pressure of $3 \times 10^{-5}$ atm when growing the GaAs layer 24.

When the AlAs layers 23, 25 are grown at such high $AsH_3$ partial pressure, AlAs is grown so as to trace an underlying etching shape, as shown in FIG. 12B. Consequently, even if the AlAs layer 23 is formed at growth temperature of 780° C., a most deep portion thereof can be formed to maintain its sharp shape as it is.

On the contrary, when high growth temperature of 780° C. and low $AsH_3$ partial pressure described above are employed, the GaAs layers 24 are preferentially grown, as shown in FIG. 12C, on the (111)B faces of an upper face of the substrate and a bottom of the concave section 22. A growth of the GaAs layer 24 is scarcely caused on the $\{\bar{1}\ \bar{1}\ 1\}$ A face of the sidewall and the $\{\bar{1}\ 00\}$ face on the intersecting line between sidewalls. For this reason, no quantum well layer is formed on the $\{\bar{1}\ \bar{1}\ 1\}$ A face, and no quantum wire is formed on the $\{\bar{1}\ 00\}$ face (i.e., valleyline of the tetra-hedron).

Figure 12D:
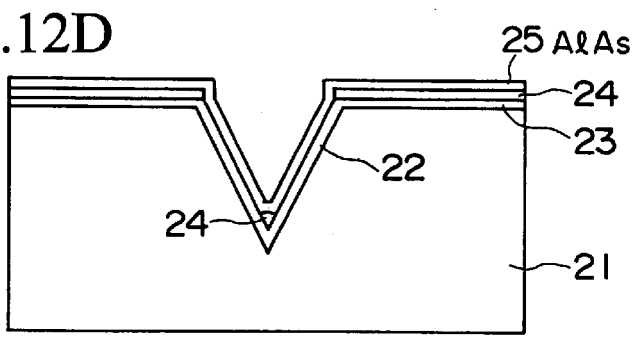

Thereafter, when the AlAs layer is grown again under the conditions above, the quantum box can be formed only on the bottom section of the concave section 22, as shown in FIG. 12D.

Note that, since the AlAs, when being grown, tends to trace the underlying crystal shape in a very wide area, difference in the growth rates between crystal faces, as in GaAs, need not be taken into consideration. This is relevant to the fact migration process of Al atoms is extremely small in contrast to that of Ga atoms.

Further note that, in order to form the quantum box, selective growth of the semiconductor layer may be effected without removing the mask used to form the concave section.

Such quantum box can be applied to an optical device described in a following article [10], for example. In the article [10], the quantum box comes into a hole-burning state by applying light.

[10] Shunichi Muto: Jan. J. Applied Physics, vol 34, (1995), pp.L210–L212

Although the MOVPE method has been used to grow the compound semiconductors described above, the quantum structure forming method is not limited to such MOVPE method. Vapor deposition such as MBE, ALE, GSMBE (gas source MBE), CBE (chemical beam epitaxy), MOMBE (metal organic MBE), chloride VPE, hydride VPE may be utilized, and further LPE (liquid phase epitaxy) may be employed, if required. These film growing methods can be applied to the embodiments described hereinafter.

(Second Embodiment)

Figure 13:
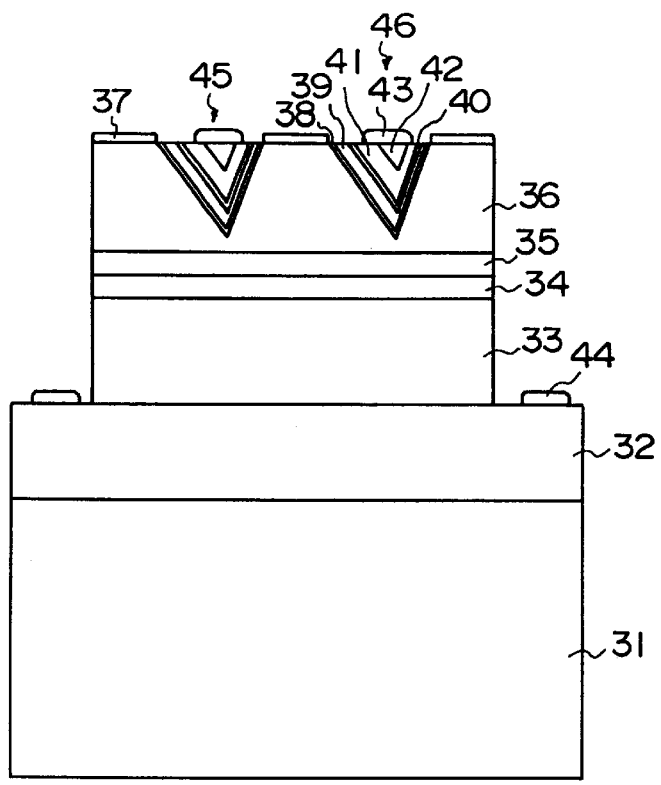
FIG. 13 is a sectional view showing a semiconductor device according to a second embodiment of the present invention.

FIG.13 shows a structure of a quantum semiconductor memory device according to the second embodiment. The quantum semiconductor memory device is a quantum effect memory device in which a multi emitter type RHET (resonance tunneling hot electron transistor) having differential load characteristic is employed. A conventional quantum effect memory device has been recited in Patent Application Publication (KOKAI) 6-112426, in which the number of constituent element has been reduced into ⅙ in comparison with those of an SRAM composed of MOSFETs.

A semiconductor layer 36 comprising the quantum semiconductor memory device according to the second embodiment has the zincblende type crystal structure, and a principal face thereof is the $\{111\}$ face. At least a pair of concave sections, each having an inverse triangular tetrahedron, are formed in the semiconductor layer 36. A double barrier structure (quantum box) made of a multilayered film is formed in the bottom section of the concave sections. The multilayered film is formed by stacking a semiconductor layer (barrier layer) 38 having a large energy bad gap, a semiconductor layer (well layer) 39 having a small energy bad gap, a barrier layer 40 from the bottom in that order. The double barrier structures formed in the bottom portions of a pair of the concave sections, respectively, become multi emitter structures. Like this, the quantum box formed in the bottom portion of the concave section can be fine-patterned beyond a dimensional limit attained by the photolithography.

Figure 14:
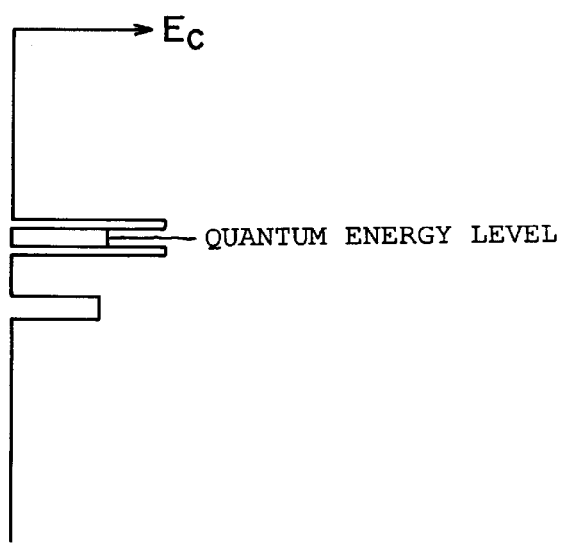
FIG. 14 is a view showing an equivalent circuit of the semiconductor device in FIG. 13.

The resonance tunneling diode can be derived from the structure obtained by putting the well layer 39 between the barrier layers 38, 40. FIG. 14 shows energy state in a conduction band of the quantum semiconductor memory device.

In FIG. 13, a reference 31 denotes a semi-insulating semiconductor substrate; 32, a sub collector layer; 33, a collector layer; 34, a collector barrier layer; 35, a base layer; 37, a mask; 41, an emitter layer; 42, a collector layer; 43, an emitter electrode; 44, a collector electrode; 45, a first emitter; and 46, a second emitter.

In case the resonance tunneling diode having the quantum box structure is formed by the photolithography technology, reduction of power consumption and operation at room temperature are raised as problems. In order to reduce the power consumption, a ratio (P/V ratio) of peak value (P value) to valley value (V value) in a substantially N-shaped differential load curve, which appears in a current (I)–voltage (V), must be increased. In this case, since the valley current specifies consumption current while storing information, it is necessary to reduce the V value. In addition, in order to realize the operation at room temperature, a large difference between the P value and the V value is needed. However, the resonance tunneling diode structure formed by the photolithography technology is formed as a plan rectangular shape having one side of almost 1 μm, which is large in contrast to de Broglie wavelength (almost 10 nm) of electron. Therefore, since, in the lateral direction, the diode structure is not formed as a quantum size, it has been difficult in principle to improve the P/V ratio.

In the second embodiment, the P/V ratio can be set larger then the conventional one by forming the double barrier structure in the quantum box formed in the bottom of the concave section. More specifically, by forming the double barrier structure as the quantum box which is the zero-dimensional quantum well, the valley value (V value) in the I–V characteristic appearing as an almost N-shape can be reduced according to the principle of phonon bottleneck. Accordingly, it becomes possible to reduce the power consumption and to increase the operation temperature relatively.

Here the principle of phonon bottleneck will be explained. If taking state density of electrons in a conduction band of the semiconductor into consideration, the state density of electrons continuously exists in all energy in, for example, a bulk or a two-dimensional quantum well. In particular, a state density function in the bulk is $E^{1/2}$, and a state density function in the two-dimensional quantum well becomes a step function for the energy value.

On the other hand, if dimension used for confining the carrier is lowered like the quantum wire (one-dimensional quantum well) and the quantum box (zero-dimensional quantum well), the state density function takes discrete values. In the quantum box, it takes completely discrete values like a delta function. As to the recombination of electrons and holes in the quantum box, electrons located at the least energy point (i.e., the point of k=0 in direct transition) of the conduction band are recombined with holes (similarly, holes at the point of k=0). The state of electrons lost by the recombination can be supplemented by relaxation of electrons located at higher energy level. Upon this transition, optical phonons (LO phonons) are transmitted mainly.

However, in the case of the bulk and the two-dimensional quantum well, in a state after the LO phonons are emitted, an after transition level certainly exists because of the continuous state density. Therefore, the transition may always occur. On the other hand, in the case of the quantum wire and the quantum box, the transition may not occur unless the level stays at an energy level which is low by just an energy of LO phonons since levels are located discretely.

In other words, if high dimension is used to confine carriers in the quantum box etc., transition of electron or relaxation of energy can be suppressed because of low probability of the LO phonon emission.

Like this, a phenomenon wherein energy state transitions of the carriers between discrete levels can be suppressed by interaction between the phonon and the carriers is called as a phonon bottleneck phenomenon.

For instance, in the N-shaped characteristic appeared in the I–V characteristic of the resonance tunneling diode formed by the two-dimensional quantum well structure, it can be so understood that, even under the non-resonance voltage condition, the so-called valley current flows from the emitter to the collector because a high energy state electron subband (extension of a wave function from the emitter side) formed in the quantum well is shifted to a low energy state electron subband (extension of a wave function from the collector side) owing to emission of the LO phonons.

While, in the resonance tunneling diode formed by the quantum wire structure or the quantum box structure, it can be expected that, since transition between sub-bands in the non-resonance state can be suppressed by the phonon bottleneck in the quantum well section, the valley current is extremely decreased. Thus, employing this phenomenon, the P/V ratio can be improved.

In addition, adjusting dimensions of the quantum box formed in the bottom section of the concave section, the double barrier structure can be formed as either a resonance tunneling diode structure employing a resonance tunneling phenomenon or a single electron resonance tunneling structure employing a Coulomb-Blockade phenomenon handling a single electron tunneling phenomenon. Further, if a pair of emitters are formed respectively with the double barrier structure formed in a plurality of concave sections, its current capacity can therefore be increased.

The above-mentioned Coulomb-Blockade phenomenon is explained hereinafter.

The capasitance of a device becomes small as the size of the device is miniaturized. The amount of electric charges stored in the device is Q. On the other hand, in case that a carrier (an electron, in this case) tunnels a potential barrier, an electrostatic energy change ΔE of the carrier before and after the tunneling is expressed as follows:

$$\Delta E = (Q-e)^2/2C - Q^2/2C = e/C \cdot (e/2 - Q)$$

where e means an elementary electric charge ($1,602 \times 10^{-19}$ Coulomb). If the size of the device is large, ΔE may be ignored because its capacitance C is large, When the size of the device is around a nanometer scale, the capacitance C becomes small. Due to this fact, ΔE before and after a tunneling becomes large. Thus, the numbers of carriers passing a device becomes small as the size of the device becomes small, and therefore, the electrostatic energy change ΔE is largely affected by movement of carrier itself. As a result, the energy of the system becomes negative when the amount of charge of the carrier exceeds e/2. In this case, the free energy of a carrier not experiencing a tunneling is smaller as compared with that of the carrier experiencing a tunneling. In other words, the tunneling of a carrier is blocked by the carrier itself. This Phenomenon is called as Coulomb-Blockade phenomenon.

In turn, several definite examples of InP system quantum semiconductor memory device will be explained.

FIRST EXAMPLE

Referring to FIGS. 15A to 15E and FIG. 16, steps of fabricating a first InP system quantum semiconductor memory device will be discussed. FIGS. 15A to 15E are sectional views taken along the bit line.

Figure 15A:
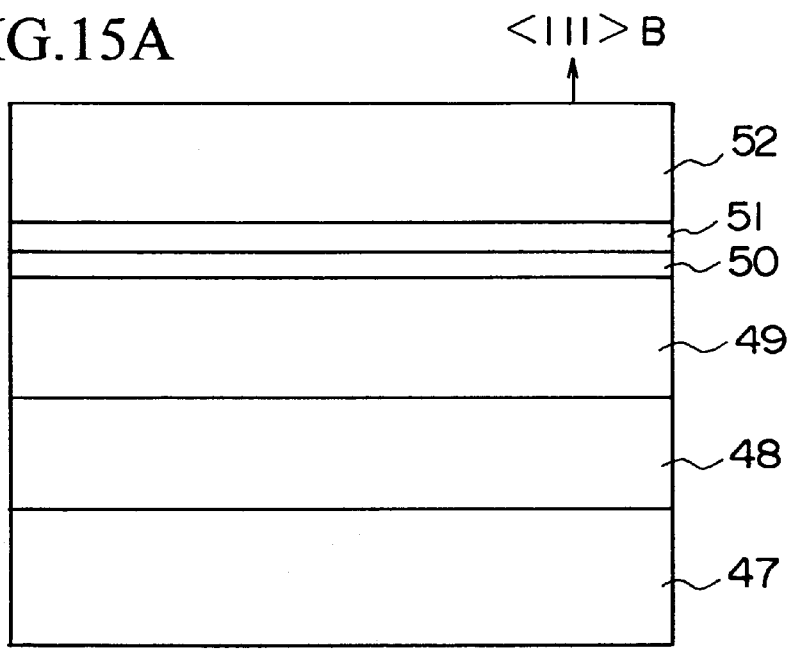

First, as shown in FIG. 15A, an n+ type InGaAs sub collector layer 48 of 200 nm in thickness, an n type InGaAs collector layer 49 of 200 nm in thickness, an i type InP collector barrier layer 50 of 100 nm in thickness, an n type InGaAs base layer 51 of 50 nm in thickness, and an Fe doped semi-insulating InP layer 52 of 500 nm in thickness are continuously and epitaxially grown on the (111) B face of an semi-insulating InP substrate 47 having the zincblende type crystal structure by means of reduced pressure MOVPE method (metal organic chemical vapor deposition). Fe is doped in the semi-insulating InP substrate 47.

Figure 15B:
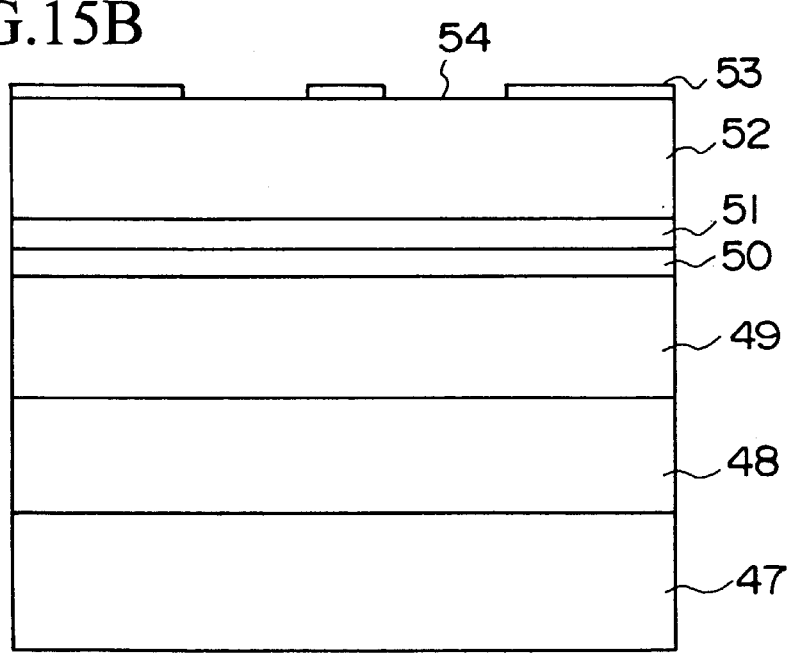

Then, as shown in FIG. 15B, an $SiO_2$ film 53 is formed and etched to form a regular triangular-shaped opening portion 54, thus forming an etching mask.

Figure 16:
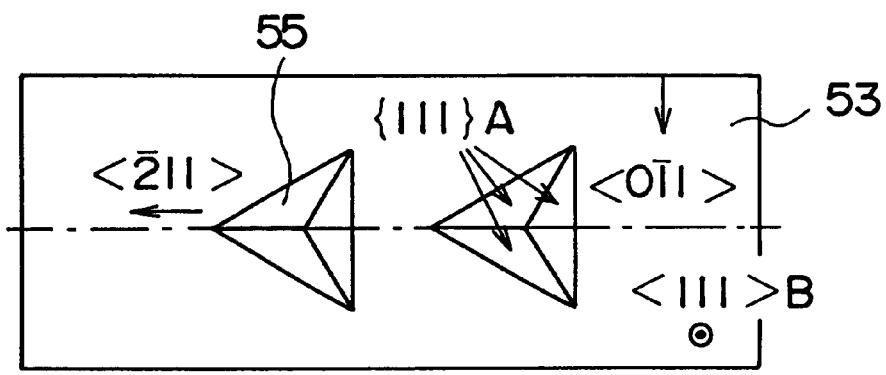
FIG. 16 is a top view showing a top surface of the structure illustrated in FIG. 15C.

Subsequently, as shown in FIGS. 15C and 16, concave sections 55 each having an inverse regular triangular tetrahedron surrounded by three equivalent {$\bar{1}\ \bar{1}\ 1$} A faces is formed by means of anisotropic etching process employing Br$_2$ ethanol solution etc. A size of the concave section 55 having the inverse regular triangular tetrahedron is defined by a size of the opening section 54 used as the mask.

In the concave sections 55 having an inverse regular triangular tetrahedron, a slant angle of sidewalls formed of three $\{\bar{1}\bar{1}1\}$ A faces against the (111) B face is set to about 70.5° C. A valleyline thereof exhibits a crystal state similar to the {100} face. A slant angle of the valleyline against the $\{\bar{1}\bar{1}1\}$ A face is set to about 54.7° C.

In this case, it should be noted that either the regular triangle shape or the circular shape, as described in the first embodiment, may be used as the etching mask opening section. In the case of the circular shape, the concave sections having the inverse regular triangular tetrahedron, which is formed to be circumscribed about the opening section, may be formed in an alignment manner.

Figure 15D:
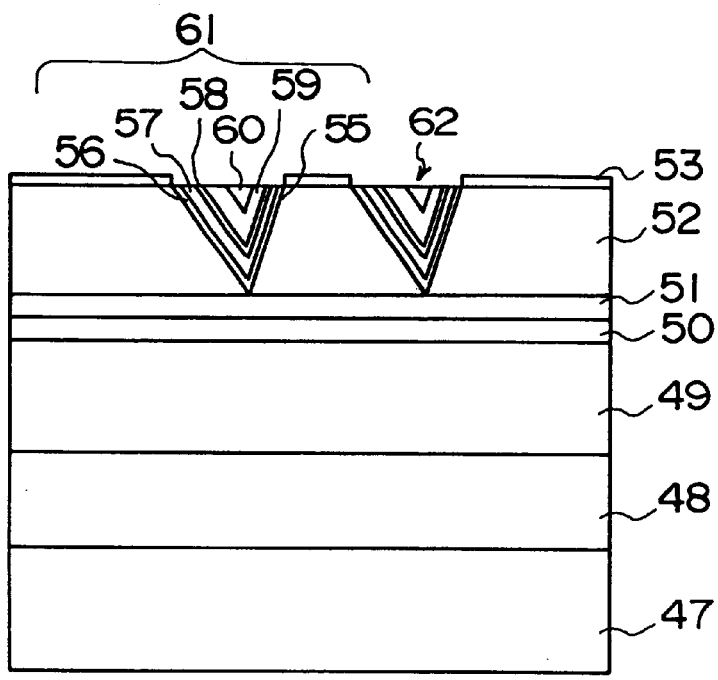

Next, as shown in FIG. 15D, by means of the reduced pressure MOVPE method using, as a growth preventing mask, the SiO$_2$ film 53 used as the etching mask previously, an InAlAs barrier layer 56 of a thickness of 3 nm, an InGaAs well layer 57 of a thickness of 4 nm, and an InAlAs barrier layer 58 of a thickness of 3 nm are grown in the concave section so as to trace the shape of the concave section. Thereafter, an n type InGaAs emitter layer 59 and n$^+$ type InGaAs contact layer 60 are grown so as to bury remaining section of the concave section.

In this case, if such growth conditions (i.e., growth temperature and V group element supply amount) are selected that the growth rate of the $\{\bar{1}\bar{1}1\}$ A face as the side face of the concave section is set extremely larger than that of the (111)B face corresponding to the crystal face in the bottom face of the concave section, these layers may be grown so as to trace the shape of the concave section.

Note that n$^+$ type InGaAs contact layer 60 may be formed by an ion injection method.

Figure 15E:
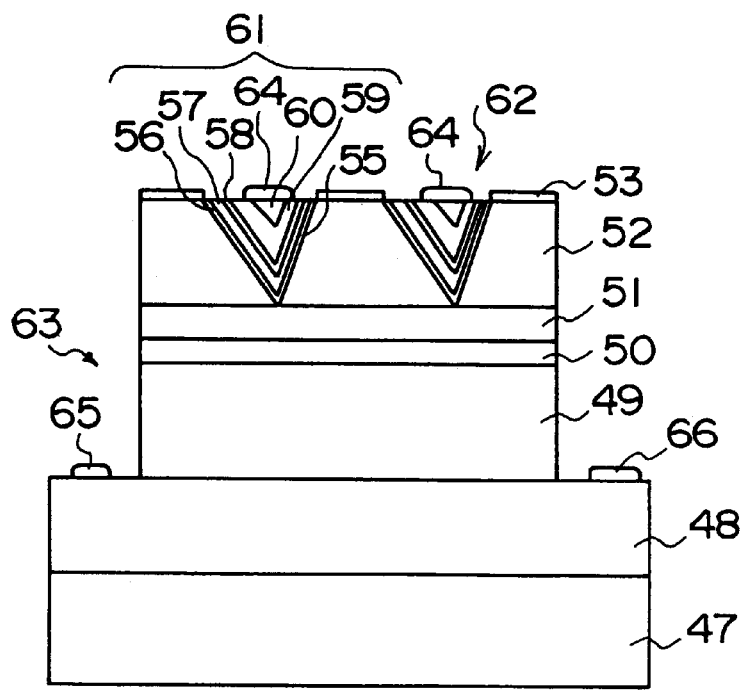

Next, as shown in FIG. 15E, a double emitter structure having a first emitter 61 and a second emitter 62 are defined by etching process. A mesa structure 63 reaching an n$^+$ type InGaAs sub-collector layer 58 is formed. Then, an emitter electrode 64 connected to an n$^+$ type InGaAs contact layer 60 in the emitter side via a contact hole provided in a protecting insulating layer (not shown) is formed. At this time, an electrode 65 is also connected to an exposed n$^+$ type InGaAs sub-collector layer 58. As a result, a quantum semiconductor memory device having the double emitter structure which exhibits differential load characteristic are completed.

Since, by forming such structure as described above, an effective emitter can be attained by the quantum box formed in the bottom section of the concave section, an emitter having a smaller size than that of the mesa structure 63 in the emitter section can be derived. Thus, integration density can be remarkably improved. Further, since the resonance tunneling diode structure can be formed by the quantum box, which being zero-dimensional quantum well structure, the large P/V ratio can be derived according to the above principle of phonon bottleneck.

The resonance tunneling diode structure of the first embodiment may be formed in a concave section formed by (111)A face as a principal face orientation of the semiconductor layer, as will be described in a third embodiment. A device structure of this case is the same as the first embodiment except for the face orientation. In this case, an etching step of forming the concave section and an epitaxial growth step of forming the quantum device structure can be effected as consecutive steps, without exposing the substrate into the air. For this reason, deterioration in the device characteristic due to contamination can be prevented, and productivity of the device can be improved.

SECOND EXAMPLE

Figure 17:
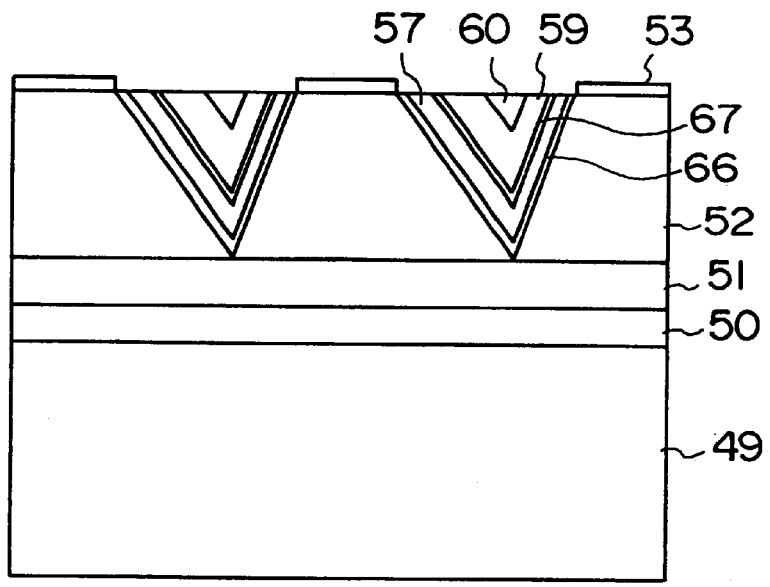
FIG. 17 is a sectional view showing a first modification of the semiconductor device according to the second embodiment of the present invention.

With reference to FIG. 17, a second example will be explained. FIG. 17 is a sectional view of a memory cell, corresponding to FIG. 15D. Only a structure of an emitter section of the second example will be explained because a structure formed from the substrate to the base layer is the same as in the first example including the face orientation.

An Fe-doped semi-insulating InP layer 52 grown on an n type InGaAs base layer 51 is processed by anisotropic etching using an SiO$_2$ film 53 as the mask to thus form a concave section having an inverse regular triangular tetrahedron. After this, an i type InP barrier layer 66, an i type InGaAs well layer 57, and an i type InP barrier layer 67 are grown in the concave section so as to trace the shape of the concave section. Thereafter, an n type InGaAs emitter layer 59 and an n$^+$ type InGaAs contact layer 60 are grown so as to bury remaining section of the concave section.

In other words, in the second embodiment, the i type InAlAs barrier layer 56, 58 in the first embodiment are replaced with the i type InP layers 66, 67. Therefore, since carriers can be confined by high-resistance of the semi-insulating InP layer 52 constituting the concave section, such replacements are enabled while keeping the same device characteristic as in the first embodiment.

In this case, note that the n$^+$ type InGaAs contact layer 60 may also be formed by the ion injection method.

THIRD EXAMPLE

Figure 18:
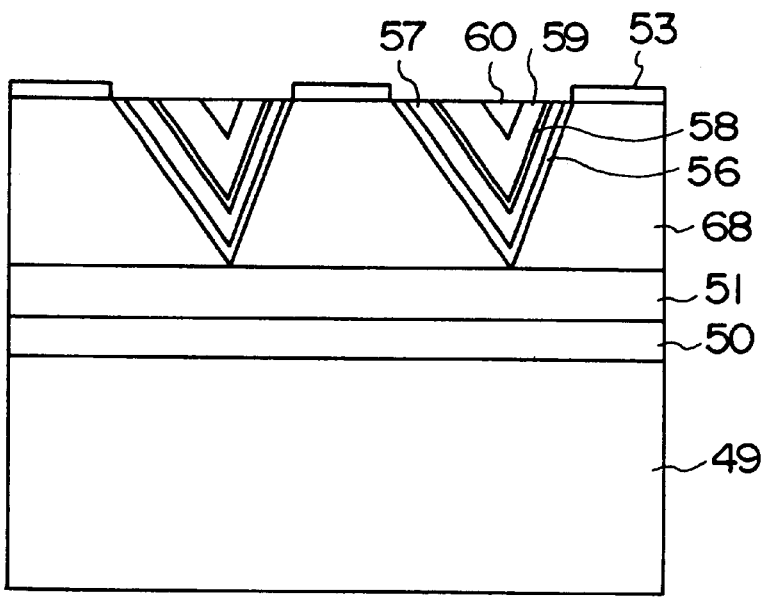
FIG. 18 is a sectional view showing a second modification of the semiconductor device according to the second embodiment of the present invention.

With reference to FIG. 18, a third example will be explained. FIG. 18 is a sectional view of a memory cell, corresponding to FIG. 15D. Only a structure of an emitter section of the second example will be explained because a structure formed from the substrate to the base layer is the same as in the first example including the face orientation.

A p type or i type InP layer 68 is grown on an n type InGaAs base layer 51. Thereafter, the p type or i type InP layer 68 is processed by anisotropic etching using an SiO$_2$ film 53 as the mask to thus form a concave section having an inverse regular triangular tetrahedron. After this, an i type InAlAs barrier layer 56, an i type InGaAs well layer 57, and an i type InAlAs barrier layer 58 are grown in the concave section so as to trace the shape of the concave section. Thereafter, an n type InGaAs emitter layer 59 and an n$^+$ type InGaAs contact layer 60 are grown so as to bury remaining section of the concave section.

More particularly, in this third embodiment, the semi-insulating InP layer 52 in the first embodiment is replaced with the p type or i type InP layer 68. Therefore, since carriers can be confined by high diffusion barrier or high-resistance of the p type or i type InP layer 68, such replacement is enabled while keeping the same device characteristic as in the first embodiment.

In this case, note that the n$^+$ type InGaAs contact layer 60 may also be formed by the ion injection method.

FOURTH EXAMPLE

Figure 19:
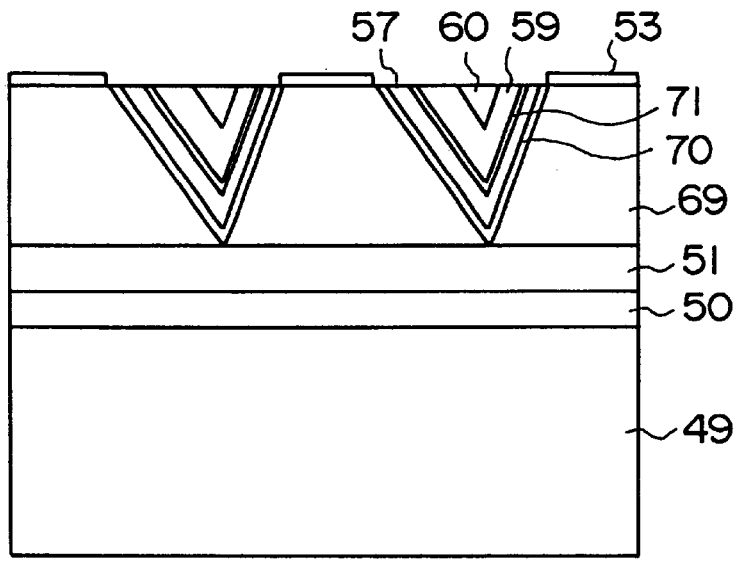
FIG. 19 is a sectional view showing a third modification of the semiconductor device according to the second embodiment of the present invention.

With reference to FIG. 19, a fourth example will be explained. FIG. 19 is a sectional view of a memory cell, corresponding to FIG. 15D. Only a structure of an emitter section of the fourth example will be explained because a structure formed from the substrate to the base layer is the same as in the first example including the face orientation.

A p type or i type InGaAs layer 69 is grown on an n⁺ type InGaAs base layer 51. The p type or i type InGaAs layer 69 is processed by anisotropic etching using an SiO₂ film 53 as the mask to thus form a concave section having an inverse regular triangular tetrahedron. After this, an i type InAlAs or InP barrier layer 70, an i type InGaAs well layer 57, and an i type InAlAs or InP barrier layer 71 are grown in the concave section so as to trace the shape of the concave section. Thereafter, an n type InGaAs emitter layer 59 and an n⁺ type InGaAs contact layer 60 are grown so as to bury remaining section of the concave section.

In other words, in the fourth embodiment, the semi-insulating InP layer 52 in the first embodiment is replaced with the p type or i type InGaAs layer 69. In addition, the i type InAlAs barrier layers 56, 58 are replaced with the i type InAlAs or InP barrier layers 70, 71. Therefore, since carriers can be confined by high diffused barrier and high-resistance of the p type or i type InGaAs layer 69, such replacements are enabled while keeping the same device characteristic as in the first embodiment.

FIFTH EXAMPLE

Figure 20:
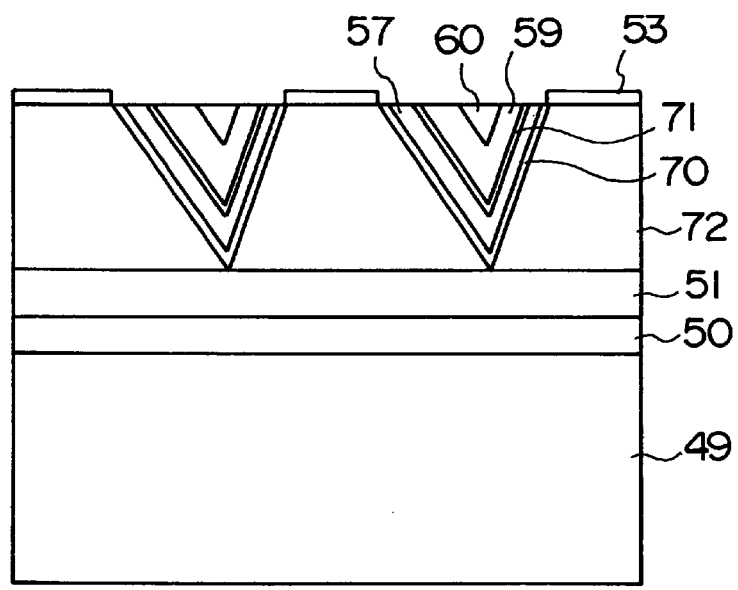
FIG. 20 is a sectional view showing a fourth modification of the semiconductor device according to the second embodiment of the present invention.

With reference to FIG. 20, a fifth example will be explained. FIG. 20 is a sectional view of a memory cell, corresponding to FIG. 15D. Only a structure of an emitter section of the fourth example will be explained because a structure formed from the substrate to the base layer is the same as in the first example including the face orientation.

An n⁺ type InGaAs or InP layer 72 is grown on an n type InGaAs base layer 51. The n type InGaAs or InP layer 72 is processed by anisotropic etching using an SiO₂ film 53 as the mask to thus form a concave section having an inverse regular triangular tetrahedron. After this, an i type InAlAs or InP barrier layer 70, an i type InGaAs well layer 57, and an i type InAlAs or InP barrier layer 71 are grown in the concave section so as to trace the shape of the concave section. Thereafter, an n type InGaAs emitter layer 59 and an n⁺ type InGaAs contact layer 60 are grown so as to bury remaining section of the concave section.

In particular, in the fifth embodiment, the semi-insulating InP layer 52 in the first embodiment is replaced with the p type or i type InGaAs layer 69. In addition, the i type InAlAs barrier layers 56, 58 are replaced with the i type InAlAs or InP barrier layers 70, 71. Therefore, since the n type semi-conductor layer is used to form the concave section and, therefore, a diffused barrier for electrons as carriers becomes low, a lowest confine effect can be attained.

As a result, in the case of the fifth example, if, as explained in a third embodiment described later, the n⁺ type InGaAs contact layer 60 is negative-biased relatively and the n⁺ type InGaAs base layer 51 is positive-biased relatively, a lowest potential barrier can be derived locally in the bottom section of the concave section. Thus, since the quantum box which has an effective carrier confine dimension less than a dimensional limit specified by its geometrical dimension can be achieved, electrons may be injected into the base layer from this smallest section.

Figure 21A:
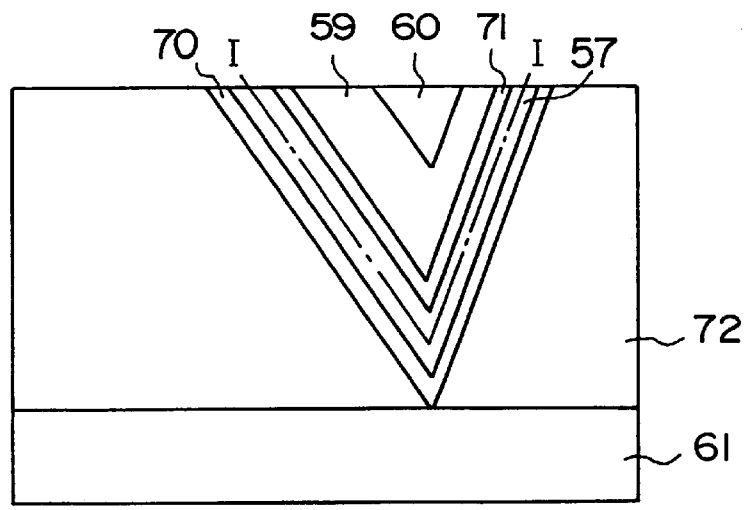
FIG. 21A is an enlarged sectional view showing part of the semiconductor device shown in FIG. 20.
Figure 21B:
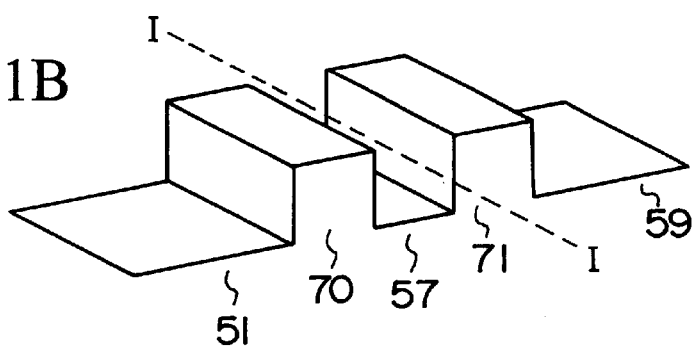
FIGS. 21B and 21C are views of energy band, each showing a principle of carrier confinement in the semiconductor device shown in FIG. 20.
Figure 21C:
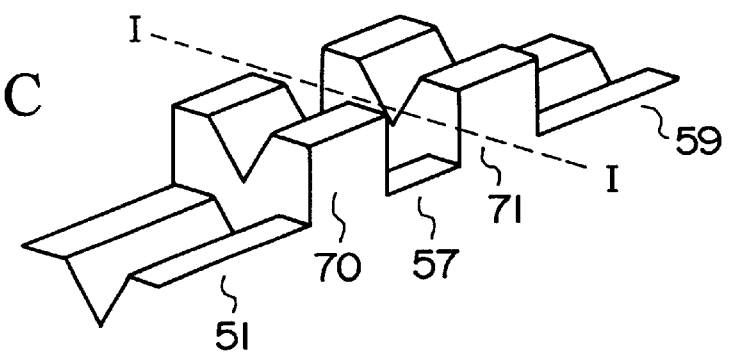

With reference to FIGS. 21A to 21C, circumstances of the above will be explained in detail.

FIG. 21A is a sectional view showing an emitter section of the quantum semiconductor memory device in the fifth example according to the present invention. FIG. 21B is a view showing a band diagram of the conduction band side in the stacked direction of the emitter section shown in FIG. 21A in a non-bias state. FIG. 21C is a view showing a band diagram of the conduction band side in a bias state. In FIGS. 21A to 21C, a dashed line taken along |–| denotes the same section.

First, as shown in FIG. 21A, potential energy can be considered differently because of differences in thickness of the barrier layers 70, 71 and the well layer 57 taken along |–|. As a first, there is a consideration where, in the quantum well structure which has substantially uniform thickness of the barrier layers 70, 71 and the well layer 57, a confine potential energy like the quantum well becomes even according to its location. As a second, there is another consideration where, if curvature occurs in part of the hetero junction structure, minimum potential energy for electrons and holes in the well layer 57 can be attained near the bottom of the apex of the concave section having the inverse triangular pyramid. However, it is not apparent until now which consideration is correct although theoretical calculation of the potential energy has been performed.

As shown in FIG. 21B, in a non-bias state, an ordinary tunneling barrier structure in which the well layer 57 is placed between the barrier layers 70, 71 can be attained. Therefore, in the non-bias state, there exists a possibility that three-dimensional energy barrier, even small, for electrons and holes can be formed. On the contrary, there exists another possibility that the confine structure cannot be attained along the dashed line A–A' in FIG. 21B since an absolute value of the energy barrier is extremely small.

As shown in FIG. 21C, if the n type InGaAs base layer 51 of the semiconductor device is biased relatively positively and the n type InGaAs emitter layer 59, i.e., the n⁺ type InGaAs contact layer 60 is biased relatively negatively, an electric field near the bottom of the concave section having a small radius of curvature is emphasized. Thus, a potential for electrons in that section becomes minimum as shown in FIG. 21C.

Therefore, it can be assumed that electrons in the well layer in the bottom section of the concave section are effectively in the quantum box state. Since the quantum box can be obtained as a quantum box having a minute structure which in excess of a lower limit of manufacturing in fabricating steps, electrons can be injected effectively into the base layer from the top portion of the concave section.

As stated above, nevertheless which one of two considerations above is correct, it becomes possible to operate the minute quantum box which is small beyond the limitation of the geometrical dimension if the one conductivity type base layer 51 of the semiconductor device is positive-biased relatively and the one conductivity type contact layer 60 is negative-biased relatively.

Such operation of the minute quantum box which is small beyond the limitation of the geometrical dimension described just above is not restricted to this fifth example, but is common to the first to fourth examples.

SIXTH EXAMPLE

Next, with reference to FIG. 22, a sixth example will be explained.

Figure 22:
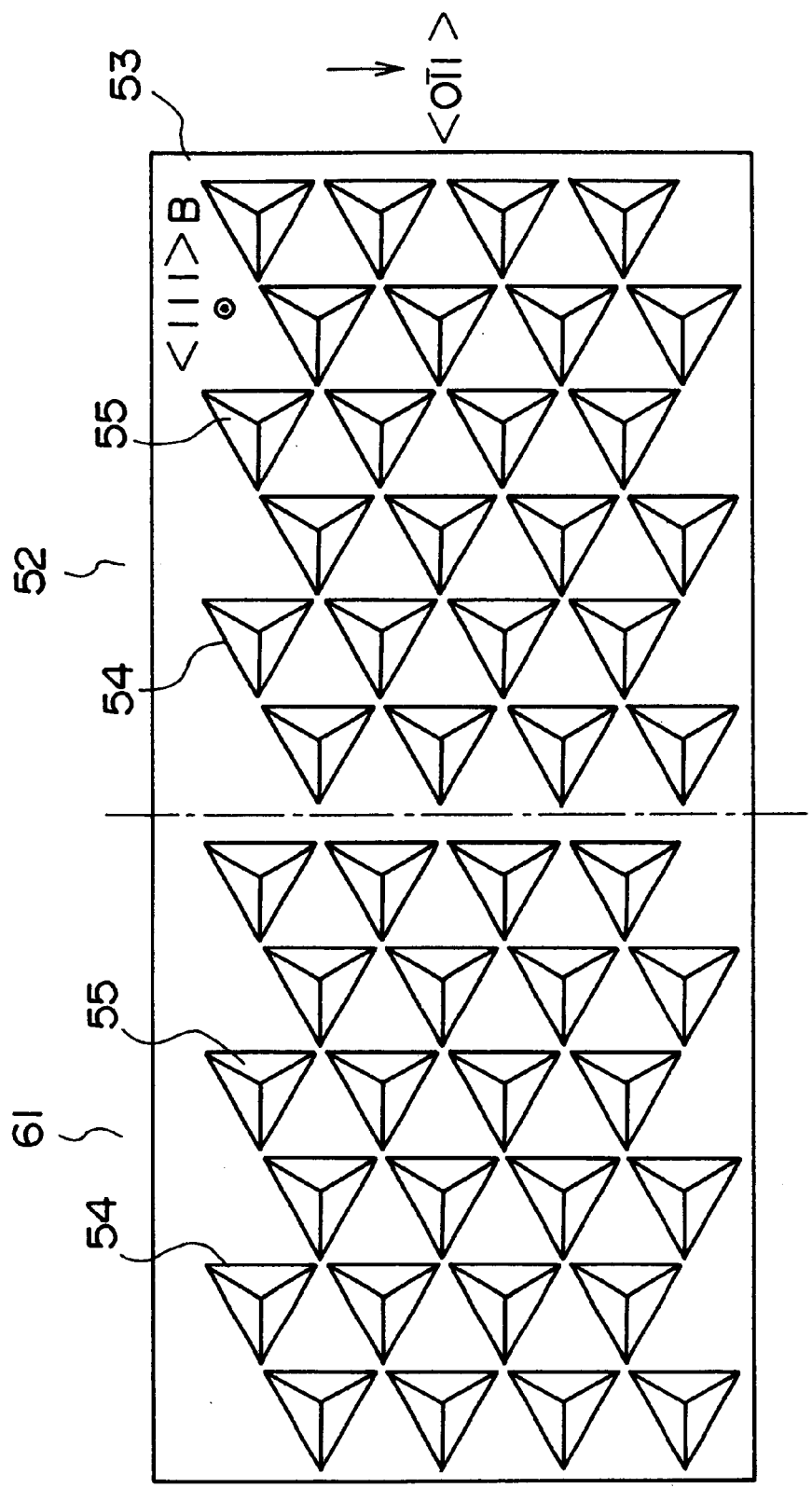
FIG. 22 is a top view showing the semiconductor device according to the second embodiment in which a plurality of carrier confining areas are formed.

FIG. 22 is a view showing a top surface structure of an emitter structure of the quantum semiconductor memory device having a multi emitter structure, wherein respective emitters 61, 62 are provided with a plurality of concave sections 55 (24 concave sections 55 in FIG. 22). Double barrier structures are formed in respective concave sections 55.

In this case, in order to form the concave section, a semiconductor layer, for example, a semi-insulating InP layer of a thickness of 0.2 µm is formed on an n type InGaAs base layer. An SiO$_2$ film 53 is then formed on the semi-insulating InP layer. A plurality of regular triangular opening sections 54 (the number is 48 in FIG. 22) having a side of 0.3 µm are in turn formed. Next, like the first embodiment, the double barrier structures are formed by etching and epitaxial growth processes in the concave sections 55.

In case, as above stated, respective emitters 61, 62 are fabricated by the double barrier structures formed in the plurality of concave sections 55, current capacity can be increased in contrast to the first to fifth examples having one concave section 55 of the emitter section. Thus, note that the number of the concave sections 55 may be decided according to current capacity required.

Although, in the first to sixth examples discussed advance, the n type device using the electron as the carrier has been explained, these examples can be applied to a p type device using the hole as the carrier. In this case, n type layers employed in the first to sixth examples must be replaced with the p type layers.

If the operation of the minute quantum box which is small beyond the limitation of the geometrical dimension is effected by applying the bias, as in the fifth example, when these examples are applied to the p type device, the direction, i.e., polarity of the bias must be set oppositely.

If the p$^+$ type InGaAs layer is positive-biased relatively and the p type InGaAs base layer is negative-biased relatively, the potential energy can be set to be minimum in the bottom of the concave section by superposing external potential on the holes. Thereby, the holes are collected in the bottom section of the concave section so that an effective quantum box can be formed near the bottom.

In the first example, a thickness of the semi-insulating InP layer 52 having the concave sections therein is set as 0.5 µm. However, the thickness is not limited to this value, and may be set to any value within a range of 10 nm to 10 µm. Further, thicknesses of the barrier layers and the well layer constituting the double barrier structure may be set to any value within a range of 1 to 10 nm and a range of 1 to 50 nm, respectively. These ranges can also be used in the second to fifth examples.

In the sixth example, a thickness of the semi-insulating InP layer 52 having the concave sections therein is set as 0.2 µm. However, the thickness is not limited to this value, and may be set to any value within a range of 10 nm to 10 µm. In addition, thicknesses of the barrier layers and the well layer constituting the double barrier structure may be set to any value within a range of 1 to 10 nm and a range of 1 to 50 nm, respectively.

In the above first to sixth examples, a GaAs system semiconductor may be used instead of the InP system material used. In other words, a semi-insulating GaAs substrate may be used instead of the semi-insulating InP substrate, a GaAs layer may be used instead of the InGaAs layer, an AlGaAs layer may be used instead of the InP barrier layer or the InAlAs layer, and an AlGaAs layer or a GaAs layer may be used instead of the InP layer or InGaAs layer forming the concave section.

Furthermore, the second embodiment is not restricted to the InP system or the GaAs system, and can be applied in principle to a semiconductor having the zincblende type crystal structure. For instance, a binary compound semiconductor such as GaP, a ternary compound semiconductor such as AlGaAs, InGaAs, InAlAs, InGaP, AlGaP, a quaternary compound semiconductor such as InGaAsP may be employed. In addition, a II-VI group compound semiconductor having the zincblende type crystal structure may be utilized.

(Third Embodiment)

First, prior to detailed discussions of a semiconductor device according to a third embodiment of the present invention, experiments forming the basis of the third embodiment will be explained.

Figure 23A:
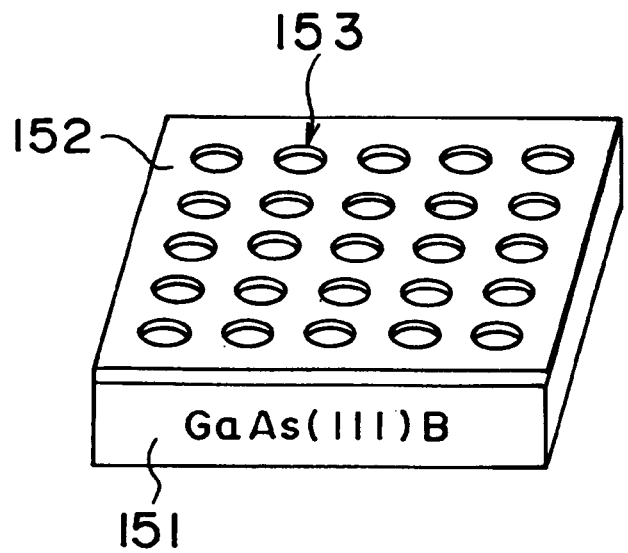
FIG. 23A is a perspective view showing one step of fabricating a quantum effect semiconductor device according to a third embodiment of the present invention, wherein a substrate is covered with a mask pattern.
Figure 23B:
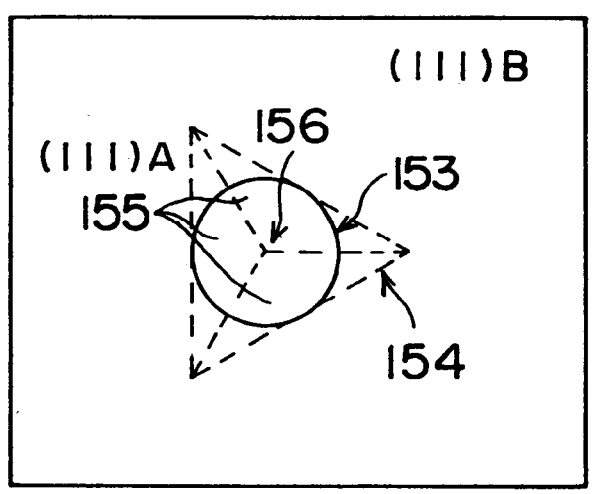
FIG. 23B is a plan view showing the mask pattern in FIG. 23A and a concave formed on a substrate by using the mask pattern.
Figure 23C:
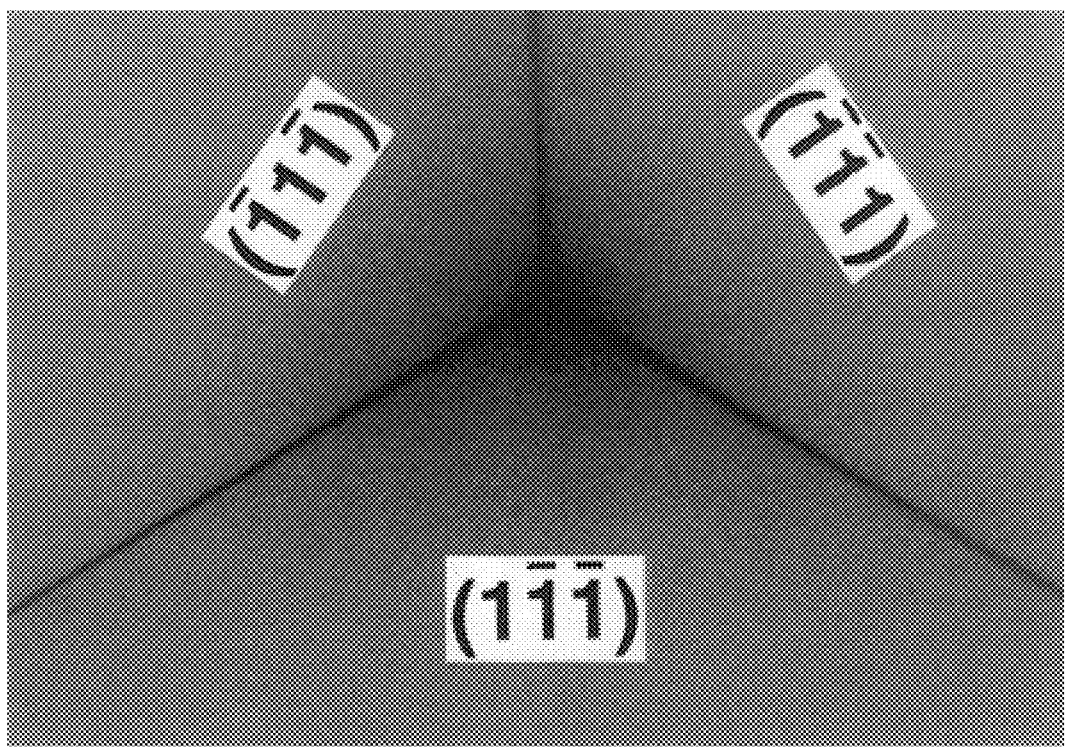
FIG. 23C is a photograph showing a top and side faces of a tetrahedron which appears on a bottom of the concave shown in FIG. 23B.

FIGS. 23A to 23C show an etching step of forming tetrahedral-shaped concaves (TSR) on a surface of a semiconductor substrate.

As shown in FIG. 23A, an SiO$_2$ film 152 is grown by chemical vapor deposition (CVD) to have a thickness of about 100 nm on a (111) B surface of an n+ type GaAs substrate 151 having a zinchblende type crystal structure. Opening portions 153 having a diameter of about 2 µm are formed in the SiO$_2$ film 152 in terms of photoresist and etching technology.

As shown in FIG. 23B, the GaAs substrate 151 is etched via an SiO$_2$ mask 152 by anisotropic etching using ethanol solution including bromine of 1 volume (V) %. (111) A faces 155 of the GaAs substrate 151 are scarcely etched by the 1 V % Br$_2$-ethanol solution. Therefore, the GaAs faces exposed from the opening portions 153 of the mask 152 are gradually etched, but etching on the (111) A faces does not proceed any longer after the (111) A faces are exposed. If the etching is continued further, it ceases automatically at the time when triangular pyramid which is circumscribed about the opening portion 153 is formed, as shown in FIG. 23B. In this state, a cavity 154 having the triangular pyramid shape surrounded by side faces, which have three-fold rotational symmetry formed by the (111) A faces, is formed on the lower portion of the opening portion 153. In addition, three ridgelines meet together at the top portion 156 of the triangular pyramid. Face orientation at the meeting portion is not defined exactly, but changes gradually. Now, the top portion 156 exists on the bottom of the cavity 154.

FIG. 23C shows an enlarged photograph near the top portion of the triangular pyramid. The top portion of the triangular pyramid wherein face orientation changes gradually has a size of about 20 nm or less. In this portion, not the (111) A faces but the (111) B faces which are similar to that in the surface of the substrate 151 become dominant as face orientation. The ridgeline is located between two (111) A faces, and therefore can also be regarded as the (001) face.

Figure 24A:
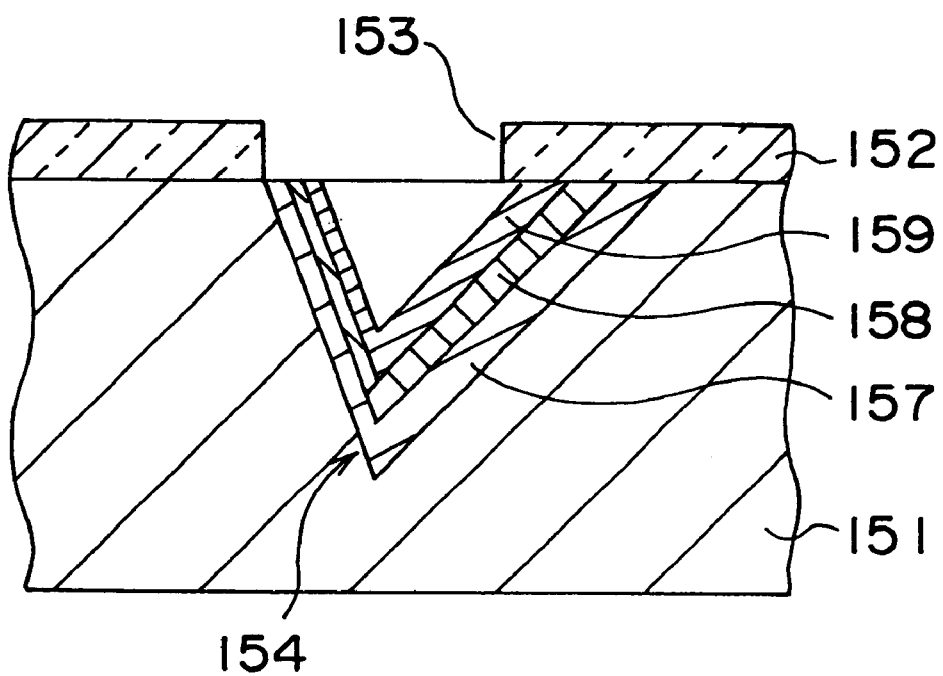
FIG. 24A is a sectional view showing the concave shown in FIG. 23B and compound semiconductor layers formed on inner faces of the concave.
Figure 24B:
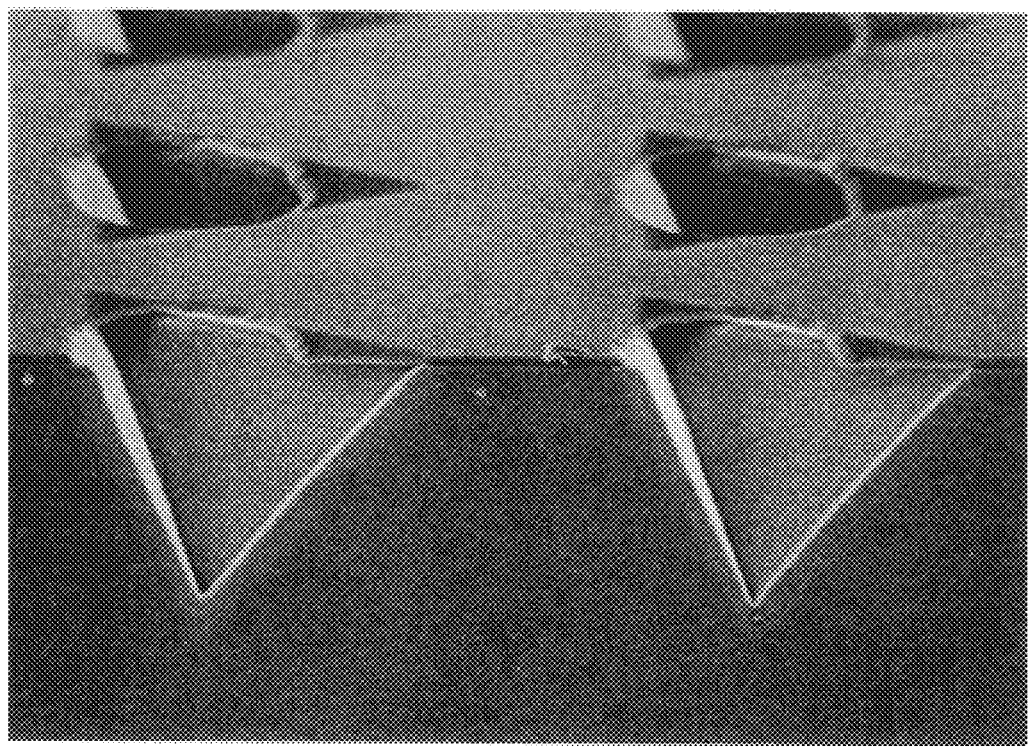
FIG. 24B is a photograph showing the concave shown in FIG. 23B and the compound semiconductor layers formed on inner faces of the concave.

FIGS. 24A and 24B show a step of epitaxial growth executed in the tetrahedral-shaped concaves (TSR) formed as above.

In the epitaxial growth, trimethyl gallium (TMGa) is used as GaAs material, trimethyl indium (TMIn) is used as In material, and arsine (AsH$_3$) is used as As material. The epitaxial growth is effected by low pressure metal organic vapor phase epitaxy (LP-MOVPE) at a growth atmospheric pressure of 50 torr. When the epitaxial growth is executed, a V/III ratio of supply gas is set to two values 191 and 19 upon growing the GaAs layer, and a V/III ratio of supply gas is set to two values 170 and 17 upon growing the InGaAs layer. These growth temperatures are set respectively to two values, i.e., 600° C. and 700° C.

The V/III ratio is adjusted by varying an amount of AsH$_3$.

The growth conditions which enable the initial tetrahedral shape to be maintained are the growth temperature 600° C. and the V/III ratio 19 (or 17) among four kinds of conditions. The result of epitaxial growth executed under these conditions will be explained hereinafter.

As shown in FIG. 24A, a GaAs buffer layer 157 having a thickness of about 30 nm, an InGaAs quantum well layer 158, and a GaAs cap layer 159 having a thickness of about 20 nm have been grown on the inner surface of the concave 4 on the GaAs substrate 151 covered with the SiO$_2$ mask 152 in that order. A thickness of the InGaAs quantum well layer 158 has been varied between 2.5 to 50 nm. A density of the tetrahedral-shaped concaves (TSR) is about $1 \times 10^6$ cm$^{-2}$.

As shown in a photograph in FIG. 24B, when the epitaxial growth is performed while the SiO$_2$ mask 152 being left, the epitaxial layer has been grown in the concaves 4 beneath the SiO$_2$ mask 152. Thus, the layer having a uniform thickness has also been formed in the concaves 4 beneath the SiO$_2$ mask 152.

After the epitaxial layer being grown, the SiO$_2$ mask 152 has been removed. Then, photoluminescence (PL) has been measured under conditions of temperature 5K and excitation light 25 W/cm$^2$.

Figure 25A:
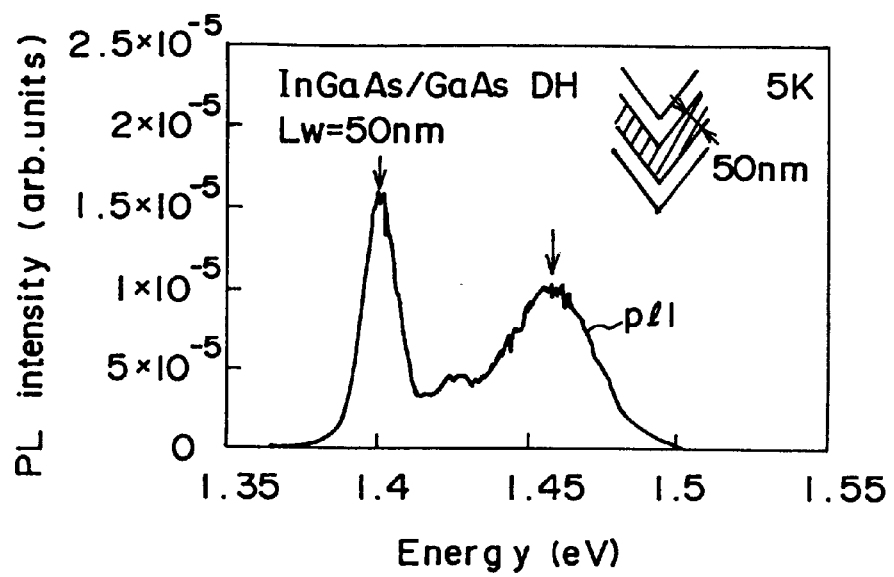
FIG. 25A is a view illustrating a measured relation between photoluminescence strength and energy gap in the compound semiconductor layers formed in the concave shown in FIG. 24A.

FIG. 25A shows the result of the PL measurement. The abscissa shows photon energy to emit light in unit of eV while the ordinate shows strength of PL light in arbitrary unit. The PL strength is shown by a curve pl1 in FIG. 25A in case a thickness of the InGaAS layer 8 on the (111) A faces is 50 nm. In FIG. 25A, two peaks have been observed at energy 1.4 eV and energy 1.46 eV. Energy difference 60 meV between two peaks cannot be verified by quantum size effect. Based on the quantum size effect, about 2.2 meV may be obtained as the energy difference. The peak appeared at 1.40 eV has been changed depending on TSR density.

Figure 25B:
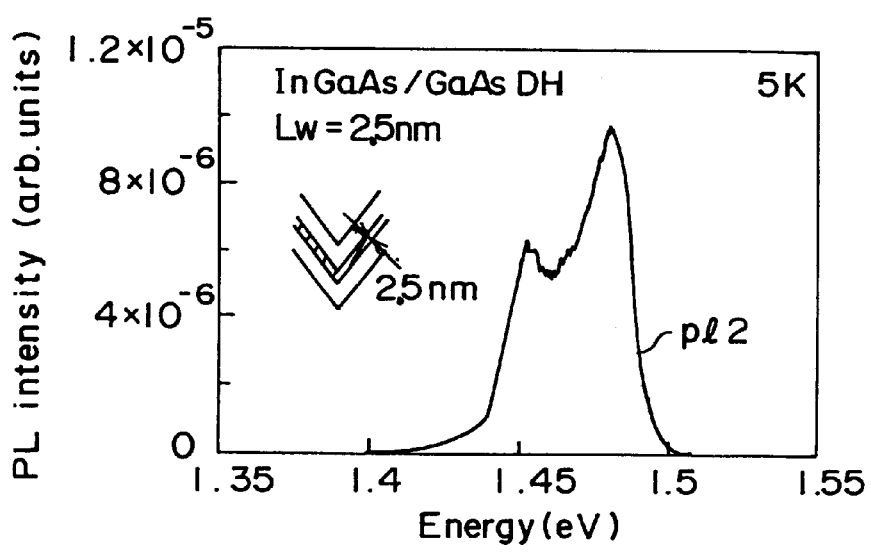
FIG. 25B is a view illustrating a measured relation between photoluminescence strength and energy gap in case a quantum well layer of the compound semiconductor layers formed in the concave in FIG. 24A is formed thin.

Next, another sample which has the same structure as the sample in FIG. 24A but has thin film thickness of InGaAs quantum well layer 158 has been prepared. The PL property of the sample has been measured similarly. FIG. 25B shows the result of PL measurement of InGaAs/GaAs double hetero-junction. A thickness of InGaAs layer is about 2.5 nm on the (111) A faces. Like FIG. 25A, the abscissa shows photon energy to emit light in unit of eV while the ordinate shows strength of PL light emitting in arbitrary unit.

In FIG. 25B, two peaks have been observed in a curve pl2 showing PL strength, as stated in the double heterojunction structure in FIG. 25A. However, these two peaks have appeared at energy 1.45 eV and 1.48 eV. It has been found that the peak at 1.45 eV tends to increase as the layer thickness of InGaAs layer is decreased.

Two PL peaks shown in FIGS. 25A and 25B indicates that the grown InGaAs layer has two kinds of properties.

Figure 26A:
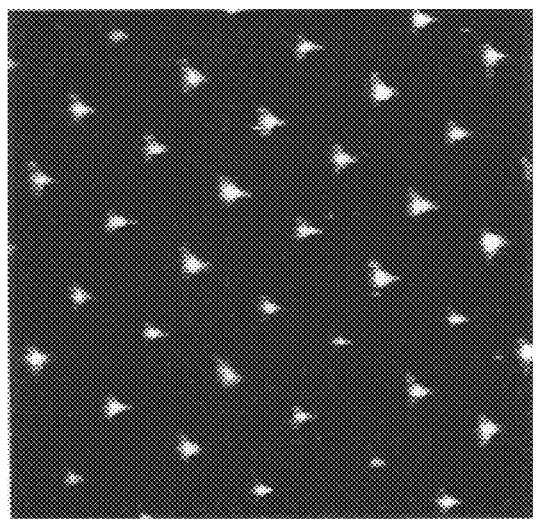
FIG. 26A is a photograph showing a crystal emitting light of 1.45 eV which is obtained by measuring a sample of InGaAS/GaAs double heterojunction formed in the concave in FIG. 23B in terms of cathode luminescence measurement.
Figure 26B:
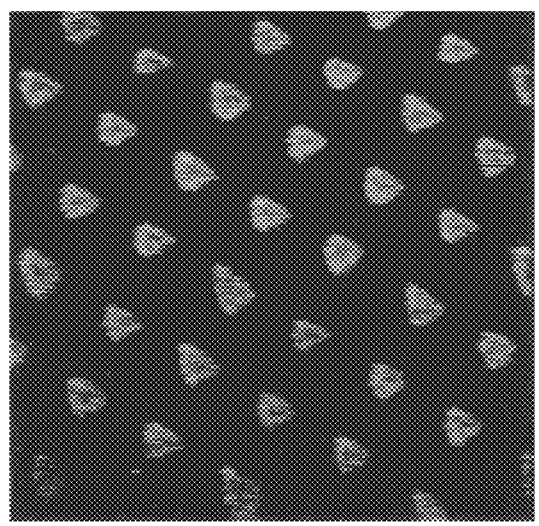
FIG. 26B is a photograph showing a crystal emitting light of 1.48 eV which is obtained by measuring a sample of InGaAS/GaAs double heterojunction formed in the concave in FIG. 23B in terms of cathode luminescence measurement.

FIGS. 26A and 26B show respectively the results of cathode luminescence (CL) measurement of the sample having the InGaAs/GaAs double heterojunction. The CL measurement has been taken at temperature 50 K. FIG. 26A is a photograph of the crystal which emits light at 1.45 eV. FIG. 26B is a photograph of the crystal which emits light at 1.48 eV.

It can be found that a light emitting portion in FIG. 26A and a light emitting portion in FIG. 26B have a complementary relation with each other. Light emitting at 1.45 eV in FIG. 26A has occurred at the top of TSR. In addition, narrow light emitting has been recognized around the light emitting portion in three symmetrical directions. The light emitting portion corresponds to the location of ridgeline where the (111) A faces of TSR meet together. Three ridgelines meet together on the top, i.e., the top exists on the bottom of the concave.

Light emitting at 1.48 eV in FIG. 26B corresponds to the (111) A faces of TSR.

As stated above, it has been found from the result of the PL measurement that the epitaxial layer grown on the walls of TSR has different light emitting mechanisms at least on the top portion and the (111) A side faces. narrow tip or top end.

If the narrow bandgap semiconductor device and the wide bandgap semiconductor device are alternatively formed by epitaxial growth, the quantum dot may be formed on the top portion of the narrow bandgap semiconductor device. If the thickness of the narrow bandgap semiconductor layer is formed thick, a quantum state which is long in the thickness direction can be derived, and further the quantum wire may be formed.

Since positions of the concaves can be defined by adjusting opening locations of the mask on the substrate, quantum dots may be formed on desired locations. Besides, such quantum dot may be formed without dry etching, so that good crystal property can be achieved.

FIGS. 27A to 27I are sectional views showing fabricating steps of the quantum effect semiconductor device according to the third embodiment of the present invention.

Figure 27A:
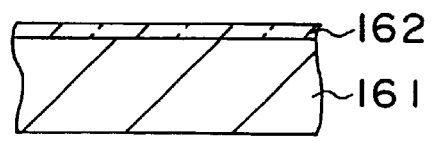
FIGS. 27A to 27I are sectional views showing fabricating steps of the quantum effect semiconductor device according to the third embodiment of the present invention.
Figure 27B:
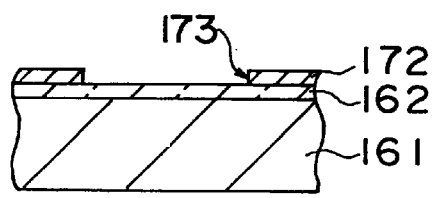

As shown in FIG. 27B, an SiO$_2$ film 162 having a thickness of 100 nm is grown by CVD on the surface of the substrate 161 which is formed of n+ GaAs having (111)B faces. Since the SiO$_2$ film 162 is a film serving as the growth mask, it may be replaced with other insulating films.

Figure 27C:
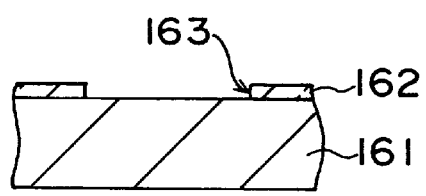

As shown in FIG. 27C, a photoresist layer 172 is coated on the SiO$_2$ film 162, opening portions 173 each having a diameter of 2 μm are formed by photolithography thereon. The SiO$_2$ film 162 therebeneath is patterned based on the opening portions 173 using the resist mask 172 thus formed as an etching mask. The patterning may be formed by either wet etching or dry etching. Thereafter, the resist pattern 52 is removed.

FIG. 27C shows a shape of the SiO$_2$ mask into which the resist pattern is transferred. The SiO$_2$ mask 162 has an opening 163 having a diameter of 2 μm. The (111) B faces of the substrate 161 are exposed within the opening 163.

Figure 27D:
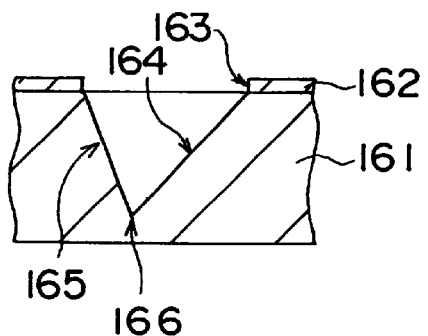

As shown in FIG. 27D, using the SiO$_2$ film 162 as the

Such light emitting having different wavelengths can be explained by supposing that the InGaAs layer has respectively different band structures on the top portion and the side faces.

For instance, it can be considered that In$_{0.1}$Ga$_{0.9}$As has been grown on the side faces while In$_x$Ga$_{1-x}$As (x>0.1) having larger In composition has been grown on the top portion. The more In composition in InGaAs becomes larger, the more the bandgap becomes narrow.

In addition, since the InGaAs layer has the tetrahedral shape, potential distribution in the crystal has pyramidal boundary condition. In such case, it has been well known that, if the layer thickness is thinner than the critical thickness $rc = a_B \cdot (1 + \cot(2\alpha))$, a stable point of potential occurs at the top portion of the pyramid. Where $a_B$ denotes Bohr radius, and $\alpha$ denotes hemi-vertical angle.

It may be supposed that the critical thickness is at least $3 \cdot a_B$. In order to exhibit quantum effect fully, it is preferable that the InGaAs layer must be grown to have a thickness of $2a_B$ or less.

The reason why two light emitting peaks are generated may be explained according to either of the reasons explained above.

The fact that light emitting having low energy is generated from the top portion of TSR represents that narrow bandgap has occurred on the top portion of TSR. Since the narrow bandgap portion has sufficiently small size, carriers located on the top portion may achieve the quantum dot.

Like this, it can be found that, if an epitaxial layer of a mixed crystal semiconductor is grown on the side faces of the concave of the triangular pyramid, the quantum dot can be formed on the top portion of the concave. Though the shape of the concave is verified experimentally as the tetrahedral shape, other shapes may attain the same advantages if they have their sufficiently etching mask, the exposed surface of the substrate 161 is treated by anisotropic etching using 1 V % Br$_2$ ethanol solution. In the anisotropic etching, etching rate is extremely lowered on the (111) A faces. Therefore, the etching ceases automatically when the exposed faces are (111) A faces.

If the opening 163 is formed to have its sides where the (111) A faces intersect with the (111) B faces on the surface, etching ceases automatically when the (111) A faces are grown to pass edges of the openings 163, as shown in FIG. 27D.

At this time, tetrahedral concaves 164 are formed on the surface of the substrate 161. However, strictly speaking, the top portions 166 of the concaves 164 are not formed only by the (111) A faces, but they are formed as gentle curves where face orientation gradually changes. In the top portions 166, the (111) B faces serving as the substrate face orientation becomes dominant.

The openings in the mask 162 may be formed as any shapes such as circular shape, triangular shape, polygon shape. The triangular concave having the (111) A faces is etched as the shape which is circumscribed about the opening.

Next, epitaxial growth is executed in the concaves 164. As explained referring to FIGS. 1 and 2, even if the mask remains like an eaves, good epitaxial growth can be done on side faces of the concaves beneath the mask.

The epitaxial growth is conducted by low pressure metal organic chemical vapor deposition (LP-MOCVD), for example, at growth temperature of 600° C. and using trimethyl gallium (TMGa), trimethyl indium (TMIn), and arsine (AsH$_3$) as material gas, and using silane (SiH$_4$) as an n type impurity source.

Figure 27E:
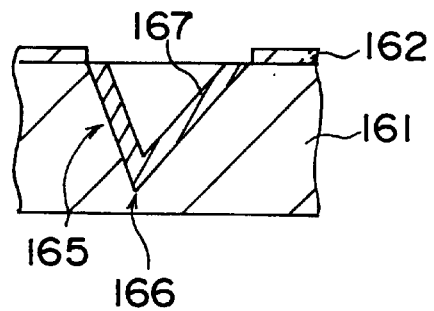

As shown in FIG. 27E, n type GaAS buffer layers 167 are grown to have a thickness of about 30 nm on the surfaces of the concaves 164. A concentration of the n type impurity is set to, for example, $1 \times 10^{18}$ cm$^{-3}$.

Figure 27F:
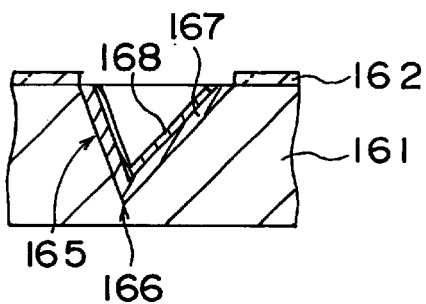

Subsequently, as shown in FIG. 27F, AlGaAs energy barrier layers 168, which have their composition Al$_{0.2}$Ga$_{0.8}$As on the (111) A faces, are grown on the surface of the GaAS buffer layers 167 to have a thickness of about 5 nm.

Figure 27G:
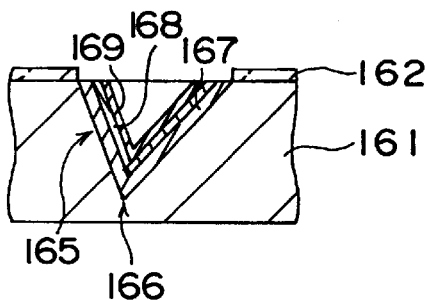

Then, as shown in FIG. 27G, InGaAs quantum well layers 169 of about 5 nm in thickness, which have their composition In$_{0.1}$Ga$_{0.9}$As on the (111) A faces, are grown on the surface of the energy barrier layers 168. The composition denotes composition on the (111) A faces hereinafter.

Figure 27H:
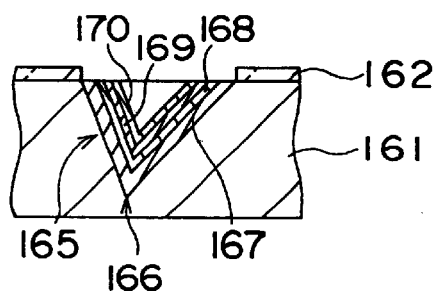

Next, as shown in FIG. 27H, Al$_{0.2}$Ga$_{0.8}$As energy barrier layers 170 are grown on the surface of the quantum well layers 169 to have a thickness of about 5 nm.

Figure 27I:
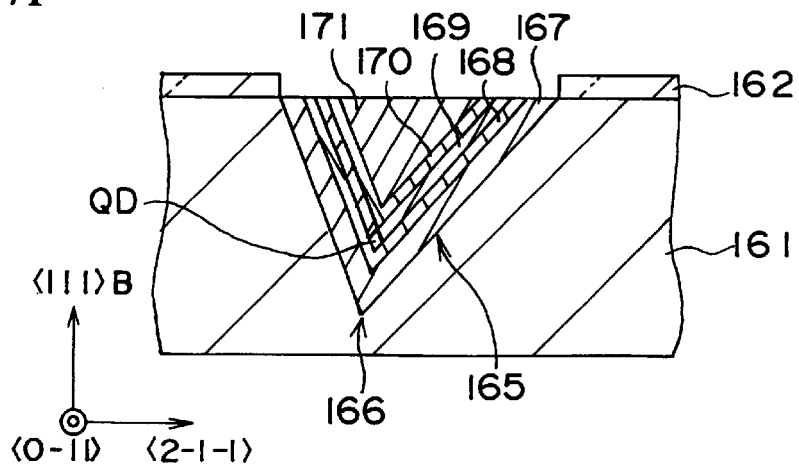

Thereafter, as shown in FIG. 27I, electrode layer 171 formed of an n type GaAs are grown until the concaves 165 in the substrate are buried completely. A concentration of the n type impurity in the n type GaAs is set to, for example, $2 \times 10^{18}$ cm$^{-3}$. Like this, stacked layer structures in which the quantum well layer 169 is put between a pair of energy barrier layers 168, 170 are formed. Incidentally, the crystal orientation is shown in the lower left portion in FIG. 27I. Face orientation being dominant on the top portion of the concave 166 is the (111) B face, and the (111) A faces are exposed on other side faces.

In the quantum well layer 169, the quantum dots QD are formed on the top portions, as described above. The quantum dots QD sandwich the electrode layers 171 and the energy barrier so as to couple the layers 170 to each other. Electrons can be input/output to/from the quantum dots QD by adjusting bias voltage between the substrate 161 and the electrode layer 171.

For example, there has been disclosed in KAYSER, J. Crystal. Growth 107 (1991), pp.989–998, that, when InGaAs is grown on both the (111) A faces and the (111) B faces simultaneously, GaAs composition on the (111) A faces becomes higher than that on the (111) B faces.

In other words, the InGaAs mixed crystal having high In composition than that of the (111) A faces is grown on the (111) B faces. Therefore, it can be considered that the quantum dots QD are formed by InGaAs, which has higher In composition than that of InGaAs mixed crystal on the (111) A faces.

As described above, a stable state of carriers can be achieved on the top portion of the pyramid area. Therefore, it can be supposed that a stable energy state can be achieved on the top portion in the concave even if the compositions are equal. The quantum dots QD can be formed on the top portions based on any reasons.

If the buffer layer, the energy barrier layer, and the quantum well layer are grown in the concave, other layers can be intervened between the impurity doped layer and the energy barrier layer. In addition, other layers can be interposed in order to form electric contacts easily. Besides, epitaxial growth can be executed by forming mixedly the above various layers.

FIGS. 28A to 28D show variations or modifications of the above growth method.

Figure 28A:
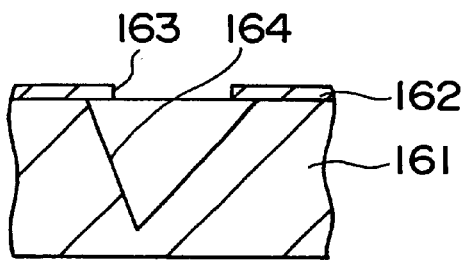
FIGS. 28A to 28D are sectional views showing partially modified fabricating steps of the quantum effect semiconductor device as shown FIGS. 27A to 27I according to the third embodiment of the present invention.

FIG. 28A shows the case wherein the mask layer extending like the eaves is used. The SiO$_2$ mask 162 has circular openings 163, for example, as shown in FIG. 23A. The triangular pyramid type concaves 164 are formed thereunderneath so as to circumscribe about respective circular openings 163.

The openings 163 can be formed as various shapes such as triangular shape, rectangular shape, circular shape or the like. In addition, irregular shapes except for regular shapes may also be used.

Figure 28B:
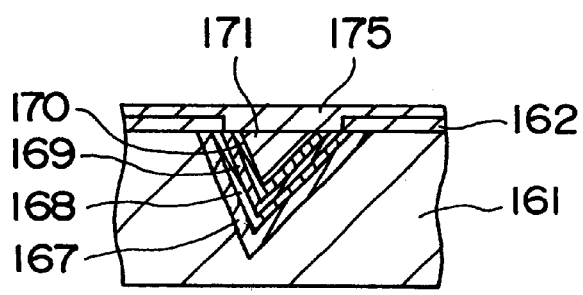
Figure 28C:
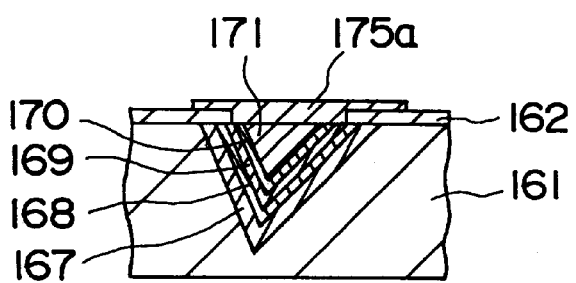

FIGS. 28B and 28C show steps of forming electrodes on the surface. An electrode layer 175 may be formed by evaporation etc. on the resultant structure shown in FIG. 27I. The electrode layer 175 is formed by stacking Ti lower layer of about 10 nm in thickness and Au upper layer of about 200 nm in thickness, for example.

After this, a resist mask is formed on the electrode layer 175, and then the electrode layer 175 is patterned by etching.

FIG. 28C shows the shape of the electrode from which the resist mask is removed after patterning. The electrodes 175a can contact to the electrode layers 171 by ohmic contact, and also exist on the SiO$_2$ mask 162 around the electrode layers 171.

Figure 28D:
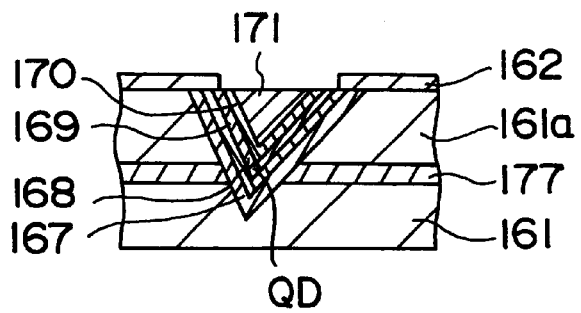

FIG. 28D shows other examples of lower electrode structure coupled to the quantum dot QD. A p (or n) type compound semiconductor layer 177 and then an n (or p) type compound semiconductor layer 161a are formed by epitaxial growth on the n (or p) type substrate 161. After this, the SiO$_2$ mask 162 is formed on the n (or p) type compound semiconductor layer 161a, and then etching process and epitaxial growth are executed, as in the above example.

Here, a depth of the quantum dot QD which is formed on the top portion of the quantum well layer 169 is formed to coincide substantially to a depth of the p (or n) type compound semiconductor layer 177. The quantum dot QD is coupled to the p (or n) type compound semiconductor layer 177 via the energy barrier layer 168 and the buffer layer 167. If the substrate 161 and the n (or p) type compound semiconductor layer 161a are formed of GaAs, the p (or n) type compound semiconductor layer 177 may be formed of GaAs, AlGaAs, or other compositions.

Figure 29:
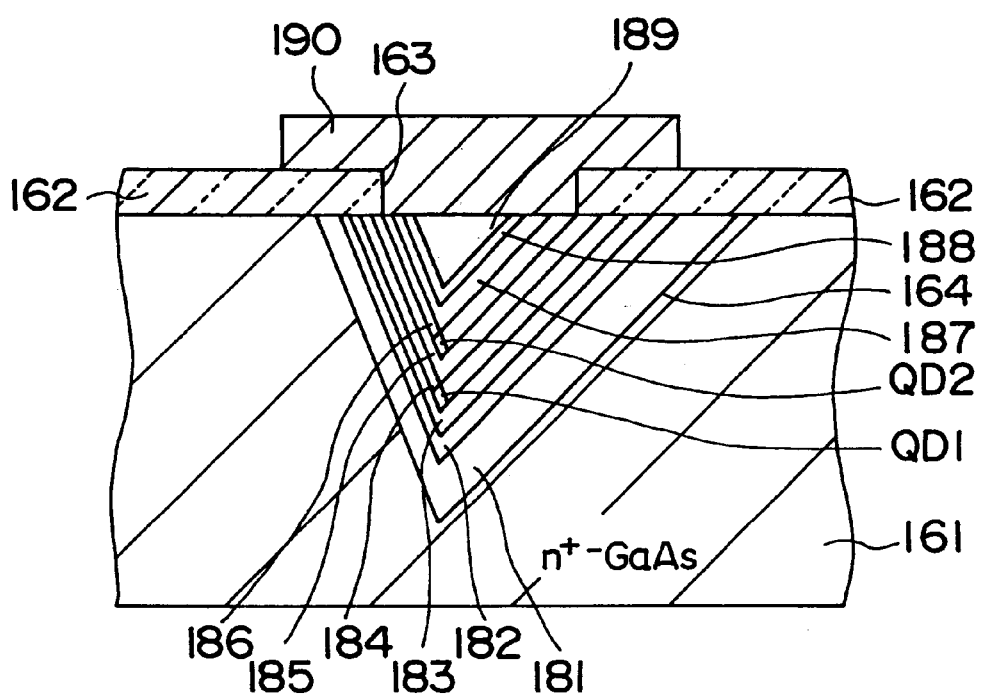
FIG. 29 is a sectional view showing the quantum effect semiconductor device having quantum dots which are formed by means of the fabricating steps of the quantum effect semiconductor device according to the third embodiment of the present invention.
Figure 29:
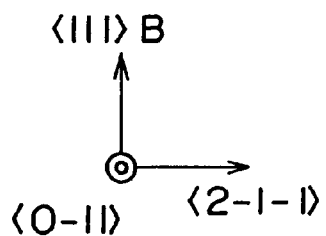

FIG. 29 shows a structure of a coupled quantum dot semiconductor device wherein two quantum dots are coupled. The SiO$_2$ mask 162 is formed on the surface of the n+ type GaAs substrate 161. Openings 163 are formed in the SiO$_2$ mask 162.

Like the above example, triangular pyramid type concaves 164 are formed on the lower portion of the openings 163. A stacked layer structure is formed in the concave 164 by epitaxial growth. The epitaxial layers comprise n type GaAs buffer layer 181 of about 30 nm in thickness, GaAs layer 182 of 5 nm in thickness, Al$_{0.2}$Ga$_{0.8}$As energy barrier layer 183 of 5 nm in thickness, In$_{0.1}$Ga$_{0.9}$As quantum well layer 184 of 5 nm in thickness, Al$_{0.2}$Ga$_{0.8}$As energy barrier layer 185 of 5 nm in thickness, In$_{0.1}$Ga$_{0.9}$As quantum well layer 186 of 5 nm in thickness, Al$_{0.2}$Ga$_{0.8}$As energy barrier layer 187 of 5 nm in thickness, GaAs layer 188 of 5 nm in thickness, and n type GaAs electrode layer 189 to bury remaining areas.

Furthermore, a layered electrode 190 is formed by stacking Ti layer having a thickness of 10 nm and Au layer having a thickness of 200 nm on the upper surface of respective layers. The quantum dots QD1 and QD2 are formed on the top portions of the quantum well layers 184 and 186. These quantum dots are coupled mutually, and the upper quantum dot QD2 is coupled further to the electrode layer 189. Although the structure has been shown wherein two quantum dots are coupled sequentially in FIG. 29, a structure may be formed wherein three quantum dots or more are coupled sequentially by forming the quantum well layer and the energy barrier layer repeatedly more over.

Figure 30A:
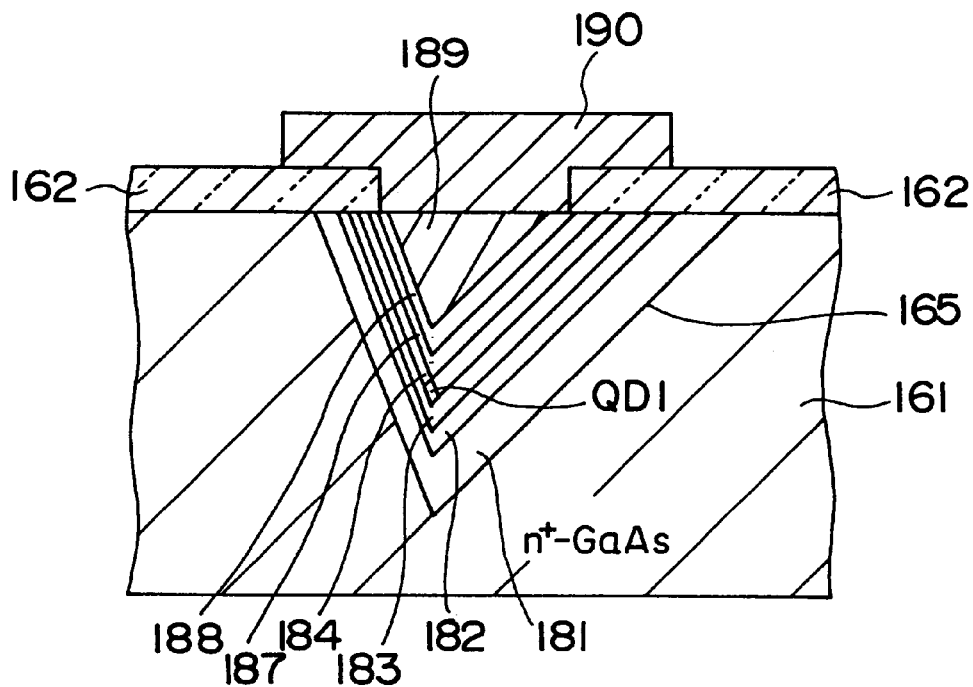
FIGS. 30A and 30B are sectional views showing a partially modified quantum effect semiconductor device according to the third embodiment of the present invention.

FIG. 30A shows a structure including a single quantum dot. The quantum well layer 186 and the energy barrier layer 185 therebeneath to form the upper quantum dot are omitted from the structure shown in FIG. 29. Other structures are the same as the structure in FIG. 29.

Figure 30B:
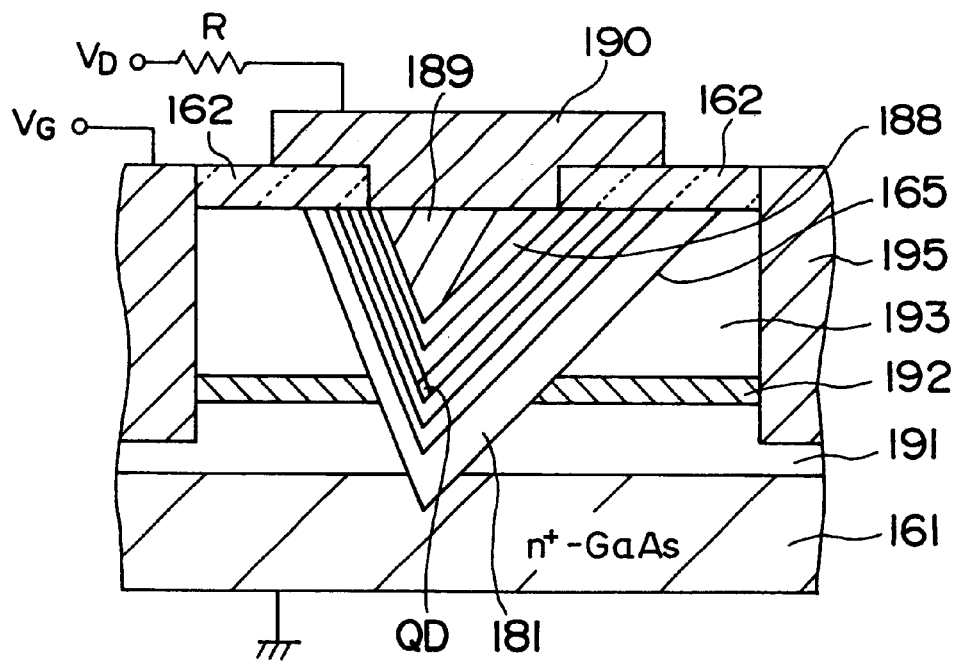

FIG. 30B shows a structure wherein an electrode layer is provided in the quantum dot to apply the bias voltage in the substrate. High resistivity compound semiconductor layer 191, p$^+$ type GaAs layer 192, and high resistivity GaAs layer 193 are stacked epitaxially on the surface of the n+ type GaAs substrate 161. The SiO$_2$ mask 162 is formed on the high resistivity GaAs layer 193, thus forming the same structure as that shown in FIG. 30A.

Here, a depth of the quantum dot QD which is formed on the top portion of the quantum well layer 184 is formed to coincide substantially to a depth of the p$^+$ type GaAs layer 192. After epitaxial growth to bury the concave 165 on the surface of the substrate 161, a groove of a mesa structure is formed by etching part of the SiO$_2$ mask 162, the high resistivity GaAs layer 193, the p$^+$ type GaAs layer 192, the high resistivity compound semiconductor layer 191. The p$^+$ type GaAs layer 192, the high resistivity GaAs layer 193, and the high resistivity compound semiconductor layer 191 are exposed from side faces of the groove.

Gate electrodes 195 are formed by vacuum evaporation etc. on the side faces of the mesa type structure. The electrodes 195 are connected to the p$^+$ type GaAs layer 192 by ohmic contact. The electrode layer 189 formed of n type GaAs and the n+ type GaAs substrate 161 serve respectively as source and drain. A gate electrode, to which bias voltage can be supplied, is attached to the quantum dot QD, which is included between the source and the drain, by the electrode 195 and the p$^+$ type GaAs layer 192.

For example, a load resistance R is connected to the electrode 190. A serial connection formed of the resistance R and the source and drain structure is connected between power supply voltages. An input signal Vg is applied to the gate electrode 195. Buried p type semiconductors may be used as the gate electrodes 195.

Figure 31A:
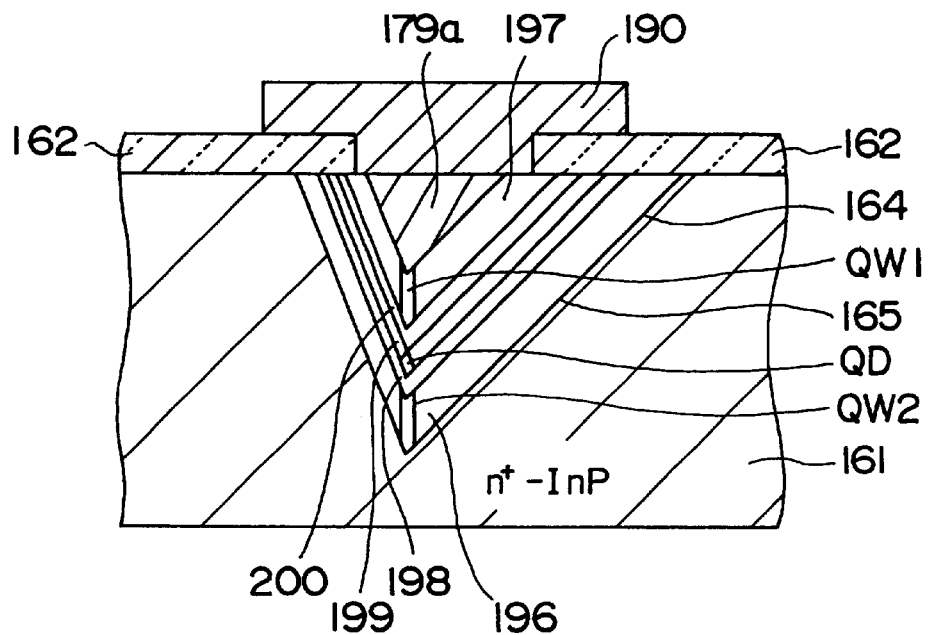
FIGS. 31A and 31B are sectional views showing the quantum effect semiconductor device having longitudinal quantum wires which are formed by means of the fabricating steps of the quantum effect semiconductor device according to the third embodiment of the present invention.
Figure 31B:
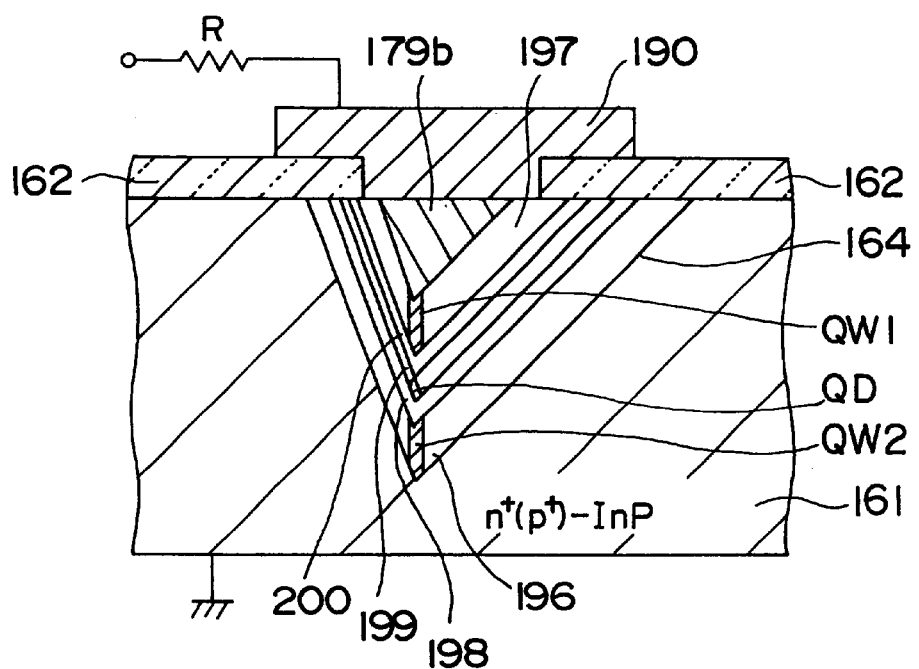

FIGS. 31A and 31B show a structure of the quantum effect semiconductor device obtained by combining the quantum dot into the quantum wire.

In FIG. 31A, the SiO$_2$ mask 162 is formed on the surface of the n+ type InP substrate 161. Like the above examples, tetrahedral concaves 164 are formed by etching. Respective layers are formed by epitaxial growth in the concaves 164 as follows.

First, an n type InGaAs layer 196 having a thickness of about 200 nm is grown. In this case, when InGaAs is grown simultaneously on the (111) A faces and the (111) B faces in the InP crystal, mixed crystal composition having higher In composition are grown on the (111) B faces in contrast to the (111) A faces. Consequently, line regions having higher In composition are grown in the n type InGaAs layers 196 on the top of the concaves 164 in the height direction. Thus, quantum wires QW2 are formed on respective top portions.

On the InGaAs layer 196, stacked are InP energy barrier layer 198 of 7 nm in thickness, In$_{0.53}$Ga$_{0.47}$As quantum well layer 199 of 5 nm in thickness, and InP energy barrier layer 200 of 7 nm in thickness. The quantum dot QD is formed on the top portion of the quantum well layer 199.

Furthermore, In$_{0.53}$Ga$_{0.47}$As layer 197 having a thickness of 200 nm is grown thereon. In the InGaAs layer 197 over the quantum wire QW2, the quantum wire QW1 as well as the InGaAS layer 196 are formed. N type In$_{0.53}$Ga$_{0.47}$As electrode layers 179a are grown on respective remaining concave portions.

The n type quantum wires QW2 are electrically connected to the n type substrate 161. The n type quantum wires QW1 are electrically connected to the n type electrode layers 179a. A quantum effect semiconductor devices comprising serially connected quantum dots QD are formed between the n type quantum wires QW1 and QW2. The number of quantum dots can be increased freely, as shown in FIG. 29. Conductive layers like the p$^+$ type semiconductor layer 192 shown in FIG. 30B may be formed on the sides of the quantum dots so that the bias voltage may be applied capacitively to the quantum dots.

The structure shown in FIG. 31A has been derived by connecting the quantum dot and the quantum wire between the n type regions. But, the pn junction may be combined with the quantum wires and the quantum dots.

FIG. 31B shows a structure wherein the pn junction is combined with the structure of FIG. 31A. The SiO$_2$ mask 162 is formed on the surface of the n+ type (or p$^+$ type) InP substrate 161. In FIG. 31B, the procedures of forming openings in the SiO$_2$ mask 162 through the tetrahedral concaves 164 are identical to those in FIG. 31A.

In the concave 164, n type InGaAs layer 196 of 200 nm in thickness, InP layer 198 of 7 nm in thickness, In$_{0.53}$Ga$_{0.47}$As layer 199 of 5 nm in thickness, InP layer 200 of 7 nm in thickness, and In$_{0.53}$Ga$_{0.47}$As layer 197 of 200 nm in thickness are continuously formed. And, p type In$_{0.53}$Ga$_{0.47}$As electrode layer 179b is formed to bury remaining concave areas.

The p type electrode layer 179b and the n type quantum wire QW2, and the p type buried region 179b and the n type substrate 161 form respectively the pn diode structure. On the junction portion of the pn diode structure, the quantum wire QW1 and the quantum dot QD are coupled in serial. For example, the electrode 190 is connected to an input terminal via the resistor R, and the substrate is grounded.

In the structure wherein the pn junction structures are combined with the quantum dots and the quantum wires, light emitting recombinations may be generated by injecting carriers of both polarities into the quantum wires and the quantum dots from the p type region and the n type region. Therefore, light emitting semiconductor devices such as laser may be fabricated by these structures.

The present invention is not limited by the above descriptions. For example, the quantum dots and the quantum wires are freely combined. The concave formed on the surface of the substrate is not limited to the tetrahedral shape. Various concave shapes may be employed if such crystals are used that its properties are significantly different on the side face and the top portion. The crystal growing method is not limited to MOVPE, and the molecular beam epitaxy (MBE) and gas source MBE etc. may be used. The semiconductor materials used here are not limited to the aboves. For instance, if the quantum well layer is formed by InGaAs on the GaAs substrate, InGaP as well as AlGaAs may be used as the energy barrier layer. In addition, on the InP substrate, the quantum well layer may be formed by InGaAsP, and the energy barrier layer may be formed by InAlGaAsP. Otherwise, it is obvious for the skilled person that various variations, improvements, combinations and the like are enabled.

With the above, if concaves having desired shapes are formed in the openings of the mask by etching and epitaxial growth is conducted in these concaves, quantum structures such as the quantum dots, the quantum wires and the like may be formed on desired locations. The quantum structures thus formed are not subjected to damage because of etching etc., and therefore good crystal state and good electron state can be achieved. In addition, by use of these quantum structures, various semiconductor devices can be fabricated.

(Fourth Embodiment)

Figure 32A:
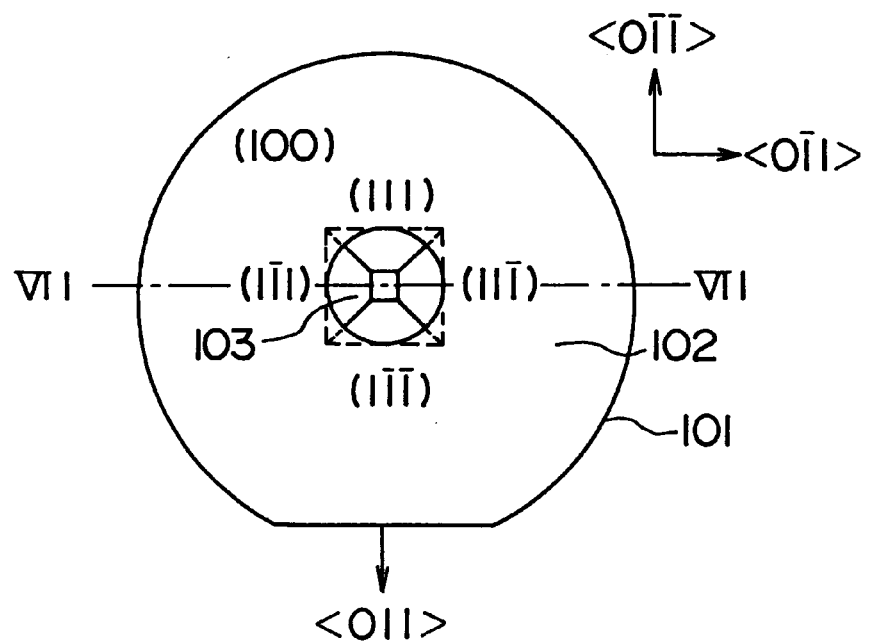
FIG. 32A is a plan view showing a semiconductor device according to a fourth embodiment of the present invention.
Figure 32B:
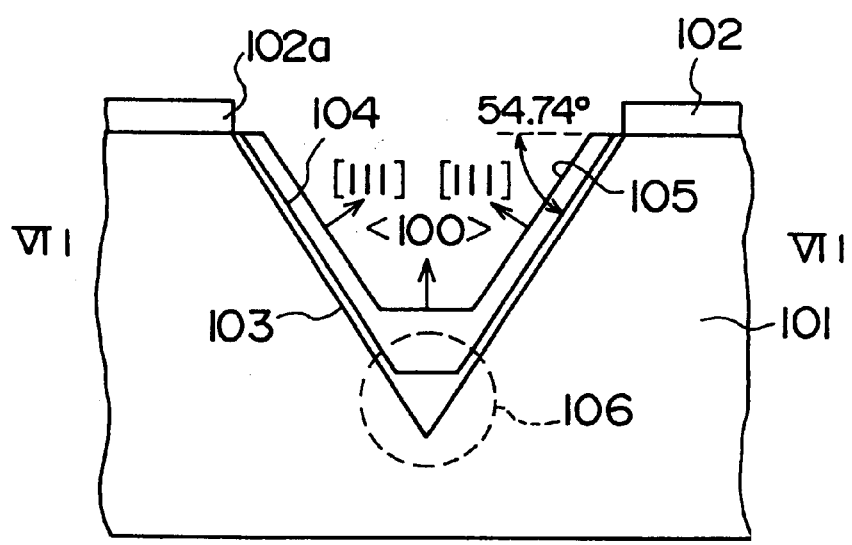
FIG. 32B is a sectional view showing the semiconductor device in FIG. 32A.

Referring to FIGS. 32A and 32B, a fourth embodiment of the present invention will be explained.

FIG. 32A is a top view showing schematically a semiconductor wafer in which a quantum box is formed. FIG. 32B is enlarged sectional view taken along a dashed line VII—VII in FIG. 32A.

As shown in FIGS. 32A and 32B, a semiconductor substrate 101 is formed of silicon, germanium etc. having a diamond type crystal structure. It has an orientation flat in a (011) face, and face orientation of a principal face is a (100) face. A mask 102 having a circular or rectangular opening section 102a therein is formed on the semiconductor substrate 101.

When the semiconductor substrate 101 exposed from the opening section 102a is etched by anisotropic etching, a concave section 103 having an inverse regular quadrangular pyramid shape is formed. A bottom of the inverse regular quadrangular pyramid shape is circumscribed about the opening section 102a of the mask 102, and sidewall sections are formed by {111} faces which are inclined against the (100) face by about 54.74°. A quantum box 106 is formed of a well layer 104 and a barrier layer 105 both formed on an inner surface of the concave section 103. An energy band gap in the barrier layer 105 is larger than that of the well layer 104.

Sidewalls of the concave section 103 are formed of four {111} faces, each being equivalent to the (111) face, i.e., (111) face, (11 $\bar{1}$) face, (1 $\bar{1}$ $\bar{1}$) face, and (1 $\bar{1}$ 1) face. Sides of rectangular faces of the concave section 103 are in the directions of <0 $\bar{1}$ 1> and <0 $\bar{1}$ $\bar{1}$>. In this case, a [111] direction denotes an equivalent direction to a <111> direction, a <1 $\bar{1}$ $\bar{1}$> direction or the like.

Next, with reference to FIGS. 33A to 33C, a method of forming the above quantum semiconductor device will be described in detail.

Figure 33A:
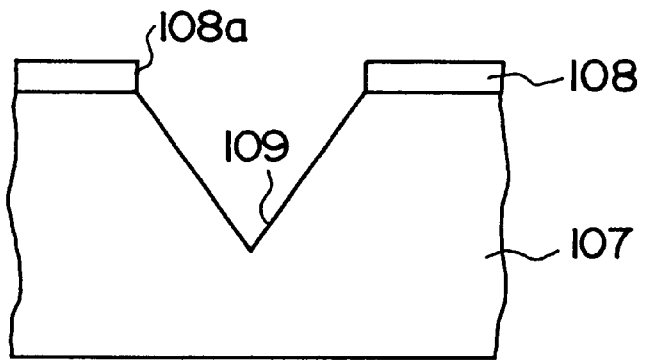
FIGS. 33A to 33C are sectional views showing manufacturing steps of the semiconductor device according to the fourth embodiment of the present invention.

First, as shown in FIG. 33A, an SiO$_2$ film of 0.2 μm thickness is formed by CVD method on a silicon substrate 107, a principal face of which is a (100) face and a thickness of which is 600 μm. A circular opening section 108a having a diameter of 1 μm is formed in the SiO$_2$ film by the ordinary photolithography technology, thereby forming an SiO$_2$ mask 108.

Subsequently, the silicon substrate 107 is etched by using aqueous solution at temperature of about 100° C. The aqueous solution is formed by mixing ethylenediamine [NH$_2$(CH$_2$)$_2$NH$_2$] of 46.4 mol %, pyrocatechol [C$_6$H$_4$(OH)$_2$] of 4 mol %, and H$_2$O of 49.6 mol %.

In this etching step, anisotropic etching occurs from the inside of the opening section 108a. As shown in FIG. 32A, an concave section 109 having an inverse regular quadrangular pyramid shape surrounded by the {111} faces. A rectangular shape in the uppermost section (dotted line in FIG. 32A) is substantially circumscribed about the circular opening section 108a in the concave section 109.

The reason why the concave section 109 having such shape is formed is that etching solution of the aqueous solution comprising the ethylenediamine and pyrocatechol becomes very small in the {111} face in contrast to that of silicon having the diamond type crystal structure. If the {111} face occurs at outer circumference of the circular opening section 108a according to the conditions, the etching cannot proceeds any more. Therefore, such a rectangular shape can be formed that the uppermost section of the concave section 109 having an inverse regular quadrangular pyramid shape is circumscribed about the circular opening section 108a.

This etching method has been recited in an article [14], which is utilized as manufacturing means for fabricating nozzles of the ink jet printer and various micro machines.

[14] E. Bassous: IEEE Trans. on ED, vol.25, 1978, pp.1178–1185

The deepest section of the concave section 109 having an inverse regular quadrangular pyramid shape has been observed by the high resolution scanning electron microscope (SEM). As a result, it has been observed that four {111} faces are substantially perfectly intersected with each other.

Figure 33B:
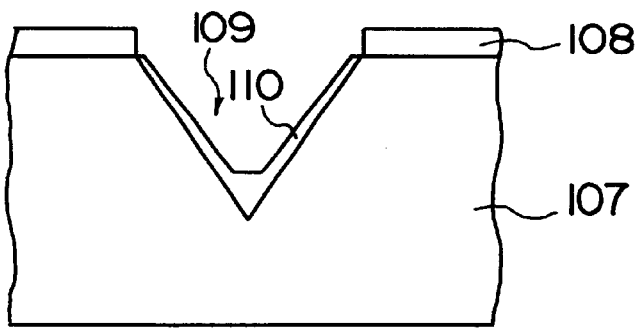

Subsequently, as shown in FIG. 33B, with remaining the mask 108, the silicon substrate 107 is placed in the lateral type low pressure chemical vapor deposition (LPCVD) apparatus. A temperature of the silicon substrate 107 is set at temperature of 700° C. In this state, germane (GeH$_4$) gas of 50 sccm having 2% concentration diluted by H$_2$ is supplied and, at the same time, high purity H$_2$ gas is supplied as carrier gas so as to set a total flow amount of H$_2$ to 5000 sccm in the reaction chamber. Thus, a germanium layer 10 can be grown by a 5 nm thickness at a growth rate of 3.33 nm/min.

In this case, it has been known that a chemical vapor deposition rate of the semiconductor such as silicon having a diamond type crystal structure has a face orientation dependency. In general, as recited in an article [15], since the rate becomes {100} to {110}>{111}, the growth proceeds preferentially near the bottom of the concave section 109 close to the crystal state of the (100) face. As a result, a shape of the concave section 109 becomes gradually an inverse regular quadrangular pyramid shape.

[15] S. K. Tung: J. Electrochem. Soc., vol.112, 1965, pp.436–438

Figure 33C:
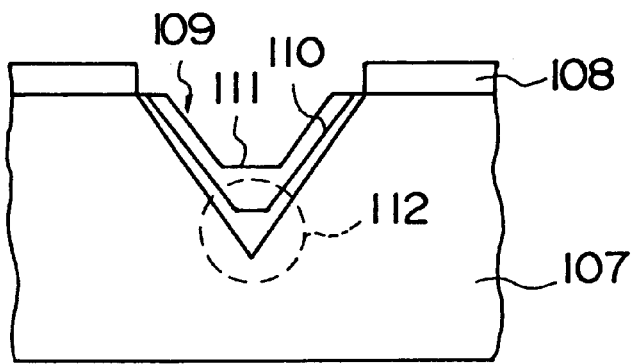

Subsequently, as shown in FIG. 33C, by supplying silane (SiH$_4$) using the high purity H$_2$ gas as carrier gas, a silicon layer 111 is grown by a thickness of 30 nm. For this reason, a zero-dimensional quantum box, which has the silicon substrate 107 and the silicon layer 111 as barrier layers and the germanium layer 110 as a well layer, can be formed.

This quantum box is important as a basic device for a light emitting device such as a laser, a light emitting diode (LED); future nano-electronics based on cell automaton or neuro network; or a super high density memory using quantum level in tera bit (T bit) class, and therefore various applications of the quantum box will be expected.

During forming the quantum box, the quantum wire using the germanium layer as the well layer can be formed along the valleyline of the inverse quadrangular pyramid shape and at the same time the quantum wire the quantum well can be formed along the sidewall section of the inverse quadrangular pyramid shape.

The quantum wire and the quantum wire are also expected as applications for the light emitting device. Especially, if, in the quantum well, entire sidewall faces are used as a light emitting face and inclined sidewall sections are used as a reflection face, a light having a directivity in the direction perpendicular to the substrate can be emitted.

Further, if both the quantum box formed on the bottom of the concave section and the quantum wire formed on a pair of valleylines in the concave section are utilized in combination, a new property electron device can be formed by controlling a transmit characteristic of electrons, that is, a time required for electrons having one-dimensional degree of freedom in one quantum wire to reach the other quantum wire via the zero-dimensional quantum box.

In the fourth embodiment, although the aqueous solution comprising ethylenediamine and pyrocatechol has been used as the etching liquid, the etching may be done using KOH aqueous solution comprising KOH of 44 weight % and water at temperature of 85° C. This method has been disclosed in an article [16].

[16] D. L. Kendall: Appl. Phys. Letters, vol.26, 1975, pp.195–198

The diameter of the opening section formed in the mask may be determined according to the size of the concave section. For example, in case the ordinary photolithography technology is used, it may be set within a range of 1 to 50 μm. If the exposure process is done by using the electron beam lithography technology, an opening having a diameter up to 10 nm can be formed.

In the above embodiments, the epitaxial growth has been conducted while remaining the $SiO_2$ mask layer and, therefore, the contact electrode connected to the silicon layer as the barrier layer can be formed in a self-alignment manner by using the $SiO_2$ mask.

If the quantum size effect can be attained, any thickness of the germanium layer may be used. Ordinarily, the thickness may be less than 10 nm. Other manufacturing conditions and thicknesses of the silicon layers may be set suitably according to the purpose of the device.

(Fifth Embodiment)

Figure 34A:
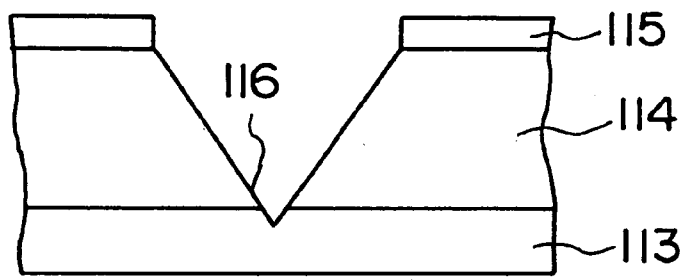
FIGS. 34A to 34C are sectional views showing manufacturing steps of a semiconductor device according to a fifth embodiment of the present invention.
Figure 34B:
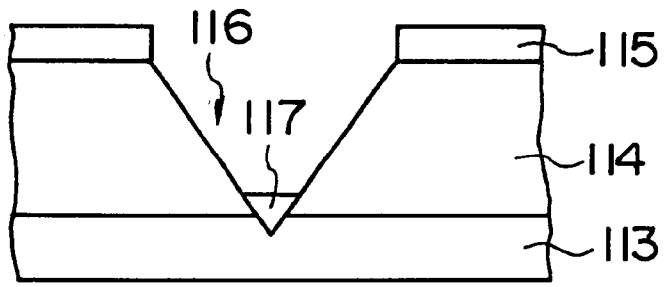
Figure 34C:
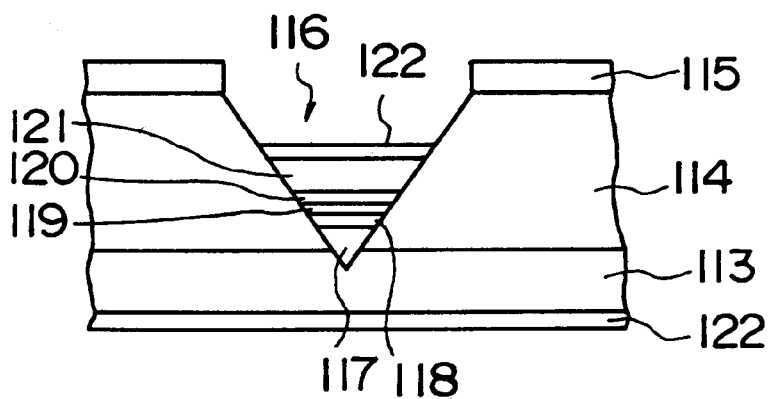

With reference to FIGS. 34A to 34C, a method of manufacturing an Si/SiC system resonance tunneling structure according to a fifth embodiment of the present invention will be explained.

First, as shown in FIG. 34A, an $SiO_2$ film having a thickness of 20 nm is formed by means of CVD method on a (100) face of a p type semiconductor layer 114 formed on an n type silicon substrate 113. A circular hole having a diameter of 1 μm is in turn formed by means of ordinary photolithography technology. The $SiO_2$ film is used as a mask 115. The n type silicon substrate 113 has a thickness of 600 μm, and the p type semiconductor layer 114 has a thickness of 0.5 to 0.6 μm.

Next, by etching the n type silicon substrate 113 by using aqueous solution consisting of 44 weight % and water, a concave section 116 having an inverse regular quadrangular pyramid shape surrounded by four {111} faces is formed. If aqueous solution consisting of ethylenediamine and pyrocatechol is used instead of the KOH aqueous solution in the etching process, etching rate for the p type silicon is extremely decreased. Therefore, such aqueous solution is not effective.

Subsequently, in a state wherein the mask 115 remains on the p type semiconductor layer 114, the silicon substrate 113 is disposed in the lateral LPCVD apparatus. Then, as shown in FIG. 34B, a silicon layer 117 having an inverse quadrangular pyramid shape having a thickness of 10 nm is grown on the bottom of the concave section 116 in the LPCVD apparatus. Since a sharp bottom end of the bottom section has a crystal state close to that of the (100) face, a (100) face appears on the rectangular top face of the silicon layer 117. In this case, although not shown, crystal is also slightly grown on a sidewall section of the {111} face actually.

Then, as shown in FIG. 33C, an SiC barrier layer 118 of 2 nm thickness having a larger energy band gap than that of silicon, a silicon well layer 119 of 5 nm thickness, an SiC barrier layer 120 of 2 nm thickness, and a silicon layer 121 of 10 nm thickness are continuously formed. Finally, an electrode 122 is formed by ordinary method, thus resulting in a resonance tunneling structure.

It is of course that the resonance tunneling structure can be used as a normal resonance tunneling device. In addition, if the silicon layer 117 having an inverse quadrangular pyramid shape is formed as a minute area, the silicon well layer 119 can also be formed as a minute area which is capable of being used as the quantum box. Thus, it will be expected that the structure can also be operated as a single electron tunneling device.

(Sixth Embodiment)

Next, with reference to FIGS. 35A and 35B, a basic structure of a sixth embodiment of the present invention will be discussed.

Figure 35A:
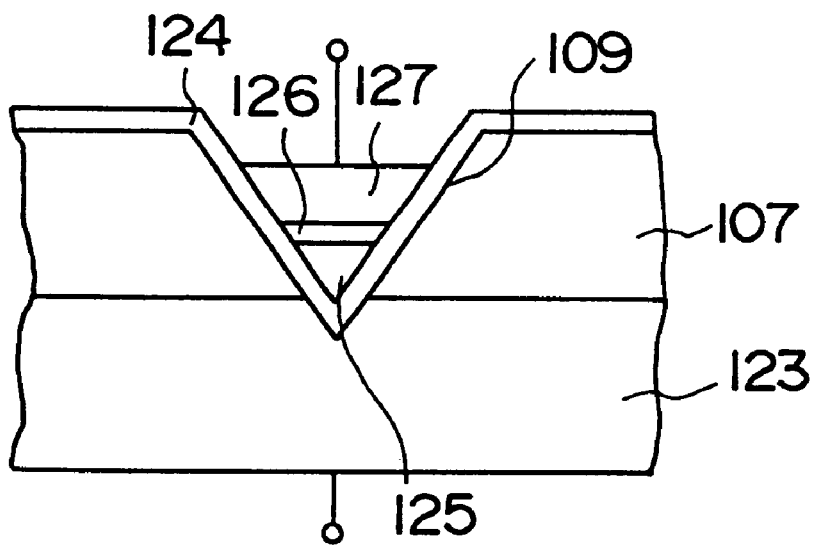
FIG. 35A is a sectional view showing a semiconductor device according to a sixth embodiment of the present invention.

FIG. 35A is a sectional view showing a silicon system single tunneling device. FIG. 35B is a view showing an equivalent circuit of the electron tunneling device in FIG. 35A.

First, an $n^+$ type ion injection area 123 is formed at a depth near 0.3 μm from a surface of an n type silicon substrate 107. After this, an $SiO_2$ film (not shown) of 20 nm thickness is formed by means of CVD method on the (100) face the silicon substrate 107.

The silicon substrate 107 has a thickness of 600 μm. But, for the sake of simplicity of the explanation, an ion injection area 123 is formed in the whole lower side of the silicon substrate 107 in FIG. 35A. Subsequently, a circular hole having a diameter of 0.5 μm is formed in the $SiO_2$ film by the electron beam lithography technology to use the $SiO_2$ film as a mask.

Thereafter, the silicon substrate 107 is etched by the aqueous solution consisting of ethylenediamine and pyrocatechol, so that the concave section 109 having an inverse regular quadrangular pyramid shape surrounded by four {111} faces is formed. A sharp end portion of the concave section 109 has a depth just reaching an upper portion of the ion injection area 123.

Then, after removing the $SiO_2$ film, the silicon substrate 107 is set in the lateral LPCVD apparatus. Then, an entire surface of the resultant structure is thermally oxidized to thus form a thermal oxide film 124 having a thickness of 3 nm, in which electrons can pass through, on the surface including the concave section 109. Subsequently, an n+ type polycrystal silicon layer having a thickness of 10 nm, which is used as an intermediate electrode 125, is grown on the bottom of the concave section 109. After this, an entire surface thereof is thermally oxidized to form a tunnel oxide film 126 having a thickness of 3 nm. Finally, the n+ type polycrystal silicon is grown again to be used as an upper electrode 127. With the above, a resonance tunneling structure has been completed.

In this case, a first minute tunneling junction 128 formed of the n+ type ion injection area 123, the thermal oxide film 124 and the intermediate electrode 125 is formed, and a second minute tunneling junction 129 formed of the intermediate electrode 125, the tunnel oxide film 126 and the upper electrode 127 is formed. In case the intermediate electrode 125 is sufficiently small, the structure can operate as the single electron tunneling device.

Figure 35B:
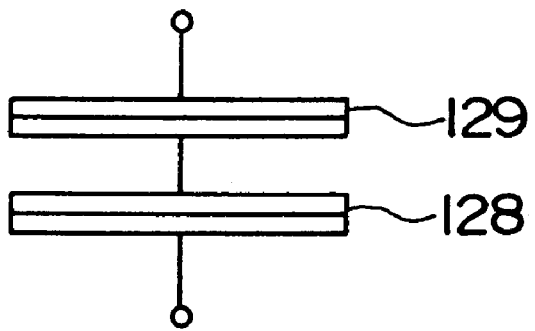
FIG. 35B is a view showing an equivalent circuit of the semiconductor device in FIG. 35A.

Its equivalent circuit is shown in FIG. 35B wherein the first and second minute tunneling junctions 128 and 129 are connected in series. In this minute area, a tunneling junction capacitance becomes small.

In the single electron tunneling device, such nature is utilized that, for example, if electrons passing through the first minute tunneling junction 128 exist in the intermediate electrode 125, electrons supplied from the n+ type ion injection area 123 cannot pass through the first minute tunneling junction 128.

In the explanation of the basic structure of the sixth embodiment, the concave section 109 is formed to reach the n+ type ion injection area 123. However, this structure is not always required. In the explanation of the basic structure of the sixth embodiment, various numeric conditions may suitably be changed. For example, the thickness of the thermal oxide film formed on the surface of the substrate and the thickness of the tunnel oxide film are desired to have a range of 1 to 5 nm. And the thickness of the intermediate electrode is desired to be less than 10 nm, but is not limited to less than 10 nm.

In the sixth embodiment, a conductive material such as Al may be used as the intermediate electrode and the upper electrode instead of the polycrystal silicon. If the conductive material such as Al having low melting point is used, Al can be filled in the concave section by reflow because of heat, and a predetermined thickness thereof can be attained by etch-back process. In this case, the conductive material attached to the sidewall of the concave section can be negligible.

In the sixth embodiment, the intermediate tunnel oxide film is formed of the $SiO_2$ film made by the thermal oxidation. If Al is used as the conductive material, the intermediate tunnel oxide film is formed of alumina. In place of the thermal oxide film, an oxide film formed by CVD method may be used. In addition, instead of the oxide film, an insulating film such as a silicon oxynitride film (SiON film) or a silicon nitride film (SiN film) may be used.

Next, modifications of the sixth embodiment will be explained.

First Modification

Figure 36A:
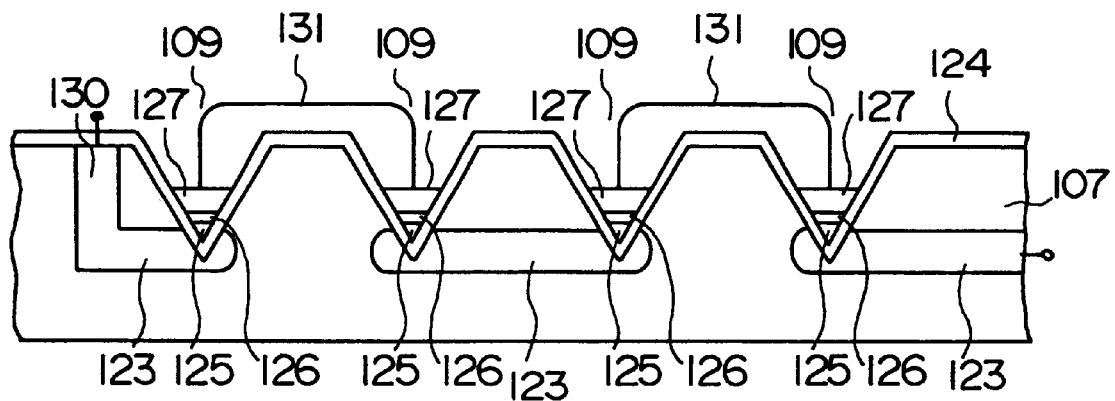
FIG. 36A is a sectional view showing a first modification of the semiconductor device according to the sixth embodiment of the present invention.
Figure 36B:
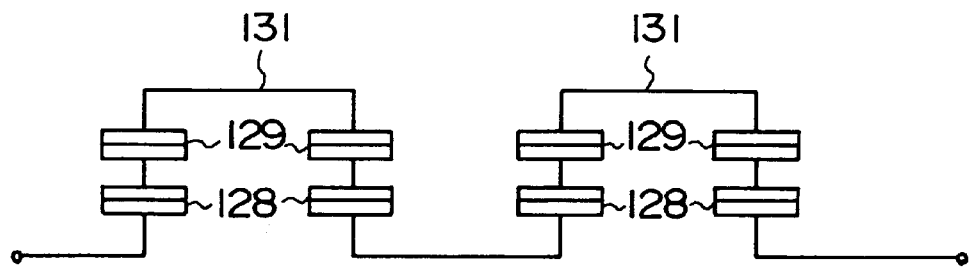
FIG. 36B is a view showing an equivalent circuit of the semiconductor device in FIG. 36A.

With reference to FIGS. 36A and 36B, specific structure of the sixth embodiment will be explained. FIG. 36A is a sectional view showing a single electron tunneling apparatus in which a plurality of Si system single electron devices are connected in series. FIG. 36B is a view showing an equivalent circuit of the single electron tunneling apparatus in FIG. 36A.

Manufacturing steps of fabricating the single electron tunneling apparatus shown in FIG. 36A is substantially identical to those of the single electron tunneling apparatus shown in FIG. 35A.

In FIG. 36A, plural concave sections 109 shown in FIG. 35A are formed on the same substrate by forming a plurality of opening sections in a mask. A plurality of single electron tunneling devices are formed in these concave sections 109 one by one. Then, these single electron tunneling devices are series-connected via connecting wiring layers 131. And electrodes are connected by connecting areas 130 formed by ion injection.

As a method of forming the ion-injected area 123, there may also be utilized a method wherein an n type impurity is ion-injected into the surface of the silicon substrate 107 and then a silicon layer is formed by epitaxial growth to have a thickness of about 0.3 $\mu$m. In case the silicon layer is grown more than 0.5 $\mu$m, the connecting area 130 coupled to the ion-injected area 123 may be formed as follows. That is, first impurity ions having large diffusion coefficient are locally ion-injected into the surface of the silicon substrate 107, then epitaxial growth is effected, then ions are injected from the surface of the epitaxial growth layer, and then a resultant structure is heat-treated. In addition, if it is difficult to form the connecting area 130 by an epitaxial growth and a heat treatment, these steps may be repeated several times.

FIG. 36B shows an equivalent circuit in FIG. 36A. Two minute tunnel junctions 128, 129 are connected in series, and a plurality of connected junctions (in FIG. 36B, 4 connected junctions are shown) are connected.

As described above, if a plurality of device areas composed of two minute tunnel junctions 128, 129 are series-connected, an operation, which is unstable by one device area, becomes stable.

Second Modification

Figure 37A:
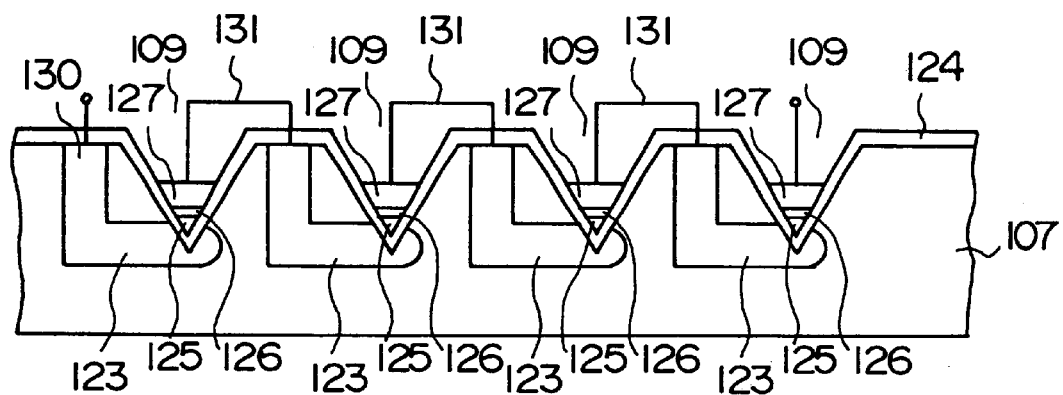
FIG. 37A is a sectional view showing a second modification of the semiconductor device according to the sixth embodiment of the present invention.
Figure 37B:
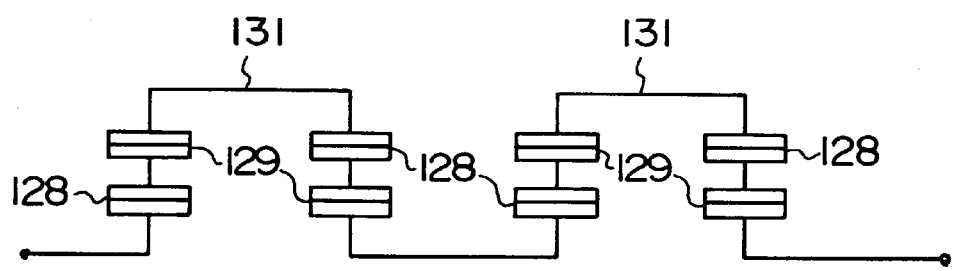
FIG. 37B is a view showing an equivalent circuit of the semiconductor device in FIG. 37A.

FIG. 37A is a sectional view showing a single electron tunneling apparatus in which a plurality of Si system single electron devices are connected in series. FIG. 37B is a view showing an equivalent circuit of the single electron tunneling apparatus in FIG. 37A.

This single electron tunneling apparatus can be formed by manufacturing steps substantially identical to those of fabricating the single electron tunneling apparatus shown in FIG. 36A, except that one connecting area 130 must be formed in one concave section 109. The upper electrode 127 in the concave section 109 is connected to the connecting electrode 130 in adjacent concave section 109 via the external wiring 131. By use of these connections, single electron tunneling devices are connected in series.

On the contrary, in the first modification, as shown in FIGS. 36A and 36B, two adjacent upper electrodes 127 are connected via the external wiring 131, and two adjacent ion-injected areas are connected. By use of these connections, single electron tunneling devices are connected in series.

According to the connection order, in the single electron tunneling device, current always flows from the minute tunneling junction 128 having a small capacitance to the minute tunneling junction 128 having a small capacitance. However, a symmetry is improved, and the characteristic can be stabilized more and more.

Third Modification

Figure 38A:
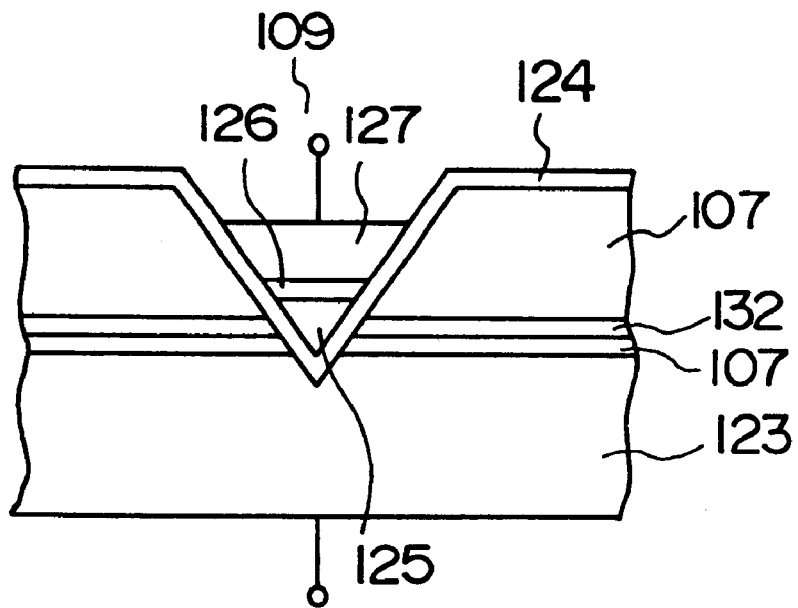
FIG. 38A is a sectional view showing a third modification of the semiconductor device according to the sixth embodiment of the present invention.
Figure 38B:
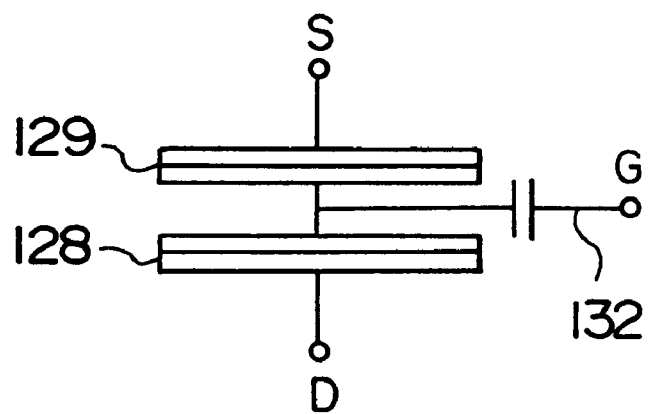
FIG. 38B is a view showing an equivalent circuit of the semiconductor device in FIG. 38A.
Figure 39A:
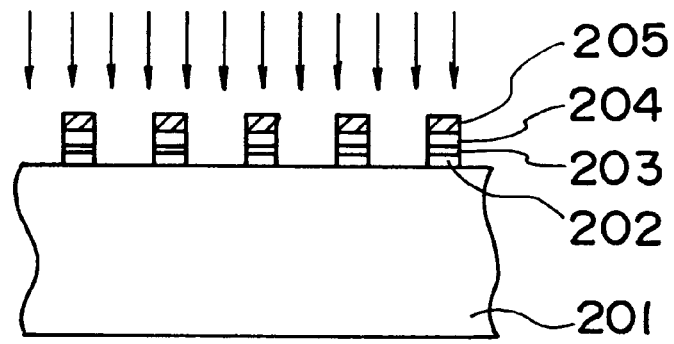
FIG. 39A is a sectional view showing a first example of the conventional fabricating method of the quantum effect semiconductor device.
Figure 39B:
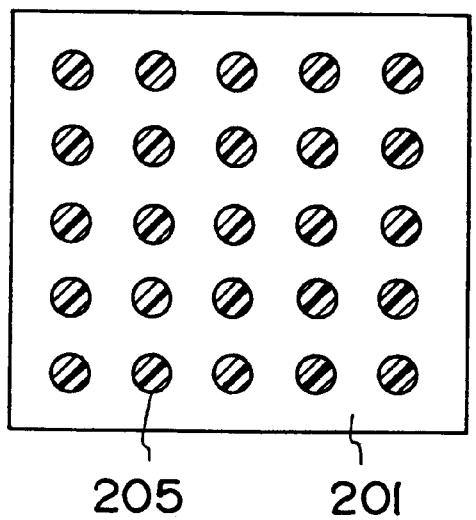
FIG. 39B is a plan view showing the first example shown in FIG. 39A.
Figure 40A:
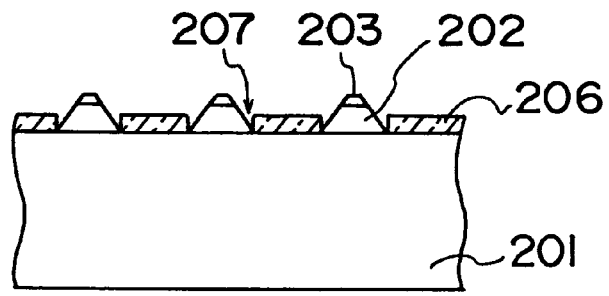
FIG. 40A is a sectional view showing a second example of the conventional fabricating method of the quantum effect semiconductor device.
Figure 40B:
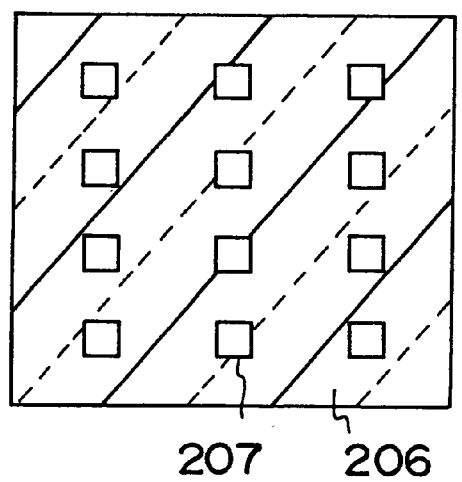
FIG. 40B is a plan view showing the second example shown in FIG. 40A.
Figure 41A:
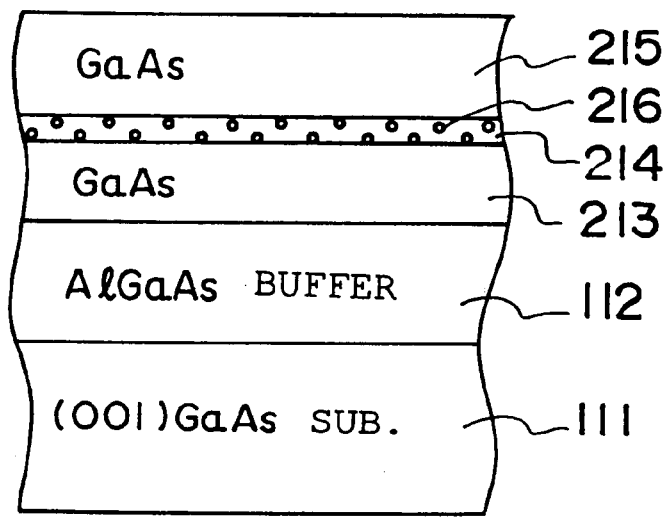
FIG. 41A is a sectional view showing a third example of the conventional fabricating method of the quantum effect semiconductor device.
Figure 41B:
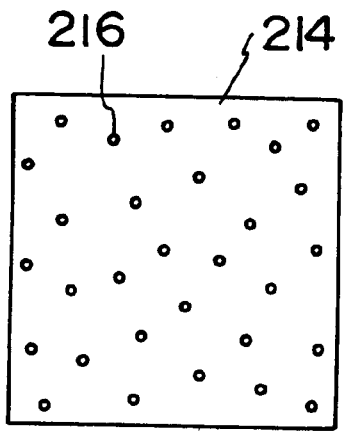
FIG. 41B is a plan view showing the third example shown in FIG. 41A.

FIG. 38A is a sectional view showing a single electron tunneling device with control electrodes, that is, a single electron tunneling transistor (SET). FIG. 38B is a view showing an equivalent circuit of the single electron tunneling apparatus in FIG. 38A.

Manufacturing steps of fabricating the single electron tunneling transistor shown in FIG. 38A is substantially the same as those of the single electron tunneling device shown in FIG. 35A. However, the third modification is different from the first modification in that the n type impurity is ion-injected into the silicon substrate 107 to thus form the n+ ion-injected area 123 and then the p+ type area 132 used as the control electrode is formed by ion-injecting the p type impurity.

In this case, the KOH aqueous solution may be used as etching solution because of existing of the p+ type area 132. Further, the control electrode of this case may be constituted by the n+ type area instead of the p− type area 132. But, the sidewall can be prevented from electron-tunneling because of diffusion potential if the p+ type area 132 is used.

As shown in FIG. 38B, the single electron tunneling transistor has a gate G between two minute tunnel junctions 128 and 129. The gate G is formed of the p+ type area 132.

Potential of the intermediate electrode 125 can be controlled by adjusting electric potential of the gate G, so that tunneling of electrons can be controlled. Therefore, the single electron tunneling transistor can serve as the transistor having a source S, a drain D, and a gate G.

In this third modification, although the structure has been described as the single electron tunneling transistor, it may be used as the resonance tunneling transistor by setting a size of the intermediate electrode large.

In this sixth embodiment, the KOH aqueous solution may be used as the etching solution instead of the aqueous solution comprising ethylenediamine and pyrocatechol, as in the fourth embodiment. In addition, the diameter of the circular opening section formed in the SiO$_2$ mask may be determined according to a required size. For instance, in case the ordinary photolithography is used, the diameter may be set within a range of 1 to 50 μm. In case the electron beam lithography is used, the diameter may be set in about 10 nm.

(Seventh Embodiment)

In the fourth and sixth embodiments, a single electron tunneling device or a single electron tunneling apparatus has been explained. But, in view of its purpose, it is a matter of course ordinarily that a plurality of integrated single electron tunneling devices may be used.

In the fourth to sixth embodiments, although the (100) face is selected as the face orientation of the substrate, the face orientation is not limited to the (100) face and thus the {100} face equivalent to the (100) face may be used. Further, the face orientation is not always restricted to the {100} face. The substrate having a cut face slightly inclined to the {100} face, for example, a cut face inclined by less than 10°, may be used. In summary, any cut face in which the concave section having an inverse regular quadrangular pyramid shape surrounded by the {111} faces, as the purpose of the present invention, can be formed may be used.

In the meanwhile, in the fourth to sixth embodiments, although the circular opening sections are formed in the mask, they are not limited to the circular shape and therefore rectangular shapes each having sides elongated in the <0 $\bar{1}$ 1> direction and <0 $\bar{1}$ $\bar{1}$> direction may be formed in the mask.

In the fourth to sixth embodiments, if the insulating layer and the conductive material layer are used, the sputter method or the deposition method may also be used.

In the fourth to sixth embodiments, the SiO$_2$ mask has been employed to form the concave section. However, the mask is not restricted to the SiO$_2$ mask and therefore an insulating film such as a silicon oxynitride film (SiON film) or a silicon nitride film (Si$_3$N$_4$ film) may be utilized. Furthermore, a conductive mask such as W, WSi, or Al may be used. But, since it is important that the mask has to be tightly contacted to the substrate to control the shape of the concave section, the SiO$_2$ is the most suitable in view of this respect.

In the fourth and the fifth embodiments, epitaxial growth has been performed while remaining the mask. But, it should be noted that the epitaxial growth may be effected after removing the mask.

In addition, in the sixth embodiment described above, oxidation process and film forming process have been performed after removing the mask. However, note that the oxidation process and the film forming process may be effected, with leaving the mask. In this case, as in the fourth and the fifth embodiments, the contact layer for the upper electrode may be formed by conducting selective growth partially using the mask.

Moreover, although, in the fourth to the sixth embodiments, the silicon substrate has been used as the substrate, any semiconductors having a diamond type crystal structure may be in principle used.

Note that the semiconductor device shown in the fourth to the sixth embodiments may be formed in the concave section of the first embodiment.

What is claimed is:

1. A method of fabricating a semiconductor device comprising:

forming a mask having circular or rectangular openings on a semiconductor substrate of a {100} face having a diamond type crystal structure;

forming concave sections by anisotropic wet etching using said mask, each of said concave sections having an inverse regular quadrangular tetrahedron and having a bottom size which is circumscribed about at least said opening section of said mask, and an etching rate of said anisotropic wet etching in said {111} face being smaller than those in other crystal faces; and forming an active region of minute structure in said concave section.

2. The method of fabricating a semiconductor according to claim 1, wherein said stacking step is effected to form said minute structure is formed while said mask being left on said semiconductor substrate.

3. The method of fabricating a semiconductor according to claim 2, wherein said mask comprise any one of an insulating material, a conductive material, and a semiconductor material.

4. A method of fabricating a semiconductor device comprising the steps of:

forming a mask having opening portions on a surface of a substrate having specific face orientation;

forming concaves having side faces, which are converged respectively toward tops on bottoms in proportion to depth, by etching said substrate via said opening portions of said mask; and growing quantum effect layers by growing consecutive compound semiconductors, which have respectively different energy band structures on said tops and said side faces surrounding said tops, on inner faces of said concaves.

5. A method of fabricating a semiconductor device according to claim 4, wherein said concaves are formed respectively like inverse pyramid shapes.

6. A method of fabricating a semiconductor device according to claim 4, wherein said concaves are formed respectively like inverse pyramid shapes, and edge portions of said pyramid shapes are circumscribed about said opening portions of said mask.

7. A method of fabricating a semiconductor device according to claim 4, wherein said substrate is formed of a compound semiconductor substrate having a zincblende type crystal structure with (111) B faces, and said concaves are formed respectively as inverse triangular pyramids having three side faces which form three-fold rotational symmetry using three (111) A faces as side faces.

8. A method of fabricating a semiconductor device fabricating according to claim 4, further comprising the steps of:

growing energy barrier layers by growing second compound semiconductor layers, which have respectively a larger bandgap than those of said compound semiconductors, in said concaves before growing said quantum effect layers; and forming quantum boxes or quantum wires respectively on said quantum effect layers which are respectively grown on said energy barrier layers and located over said tops.

9. A method of fabricating a semiconductor device according to claim 8, wherein said energy barrier layers growing step and said quantum effect layers growing step are executed repeatedly.

10. A method of fabricating a semiconductor device, comprising the steps of:

forming a mask having windows therein on a crystal layer;

forming concave sections in said crystal layer by supplying etchant through said windows; and forming a quantum structure on at least one of bottom sections of said concave sections, side faces thereof, and intersecting lines of said side faces.

11. The method according to claim 10, wherein said crystal layer has a zincblende type crystal structure.

12. The method according to claim 10, wherein a shape of said concave section comprises a tetrahedron formed by four triangles, one apex of which is located in said crystal layer.

13. The method according to claim 10, wherein said quantum structure comprises a III-V group compound semiconductor layer, and is formed by stacking materials having large band gap and materials having small band gap in sequence.

14. The method according to claim 10, wherein said quantum structure formed in said bottom of said concave section is a quantum box, said quantum structure formed in said intersecting line is a quantum wire, and said quantum structure formed in said sidewall is a quantum well.

15. The method according to claim 14, wherein said quantum box, said a quantum wire, and said quantum well comprises a III-V group compound semiconductor layer, and said quantum box, said a quantum wire, and said quantum well can be formed selectively by changing at least one of a partial pressure of V-group elements and a growth temperature.

16. The method according to claim 15, wherein a shape of said concave section comprises a tetrahedron formed by four triangles one apex of which is located in said crystal layer, and said quantum box is formed on said apex of a bottom in said crystal layer, and said a quantum wire is formed on said intersecting lines of said triangles, and said quantum well is formed on said face of said triangle.

17. The method according to claim 10, wherein a face of said crystal layer in which said concave section is formed is a (111)B face.

18. The method according to claim 10, wherein each of said windows formed in said mask is inscribed to a triangle formed in a (111) B face of said concave section.

19. The method according to claim 10, wherein each of said windows formed in said mask has a curved figure having an arbitrary shape or a polygon shape.

20. The method according to claim 10, wherein said windows of said mask comprise a plurality of opening sections.

21. The method according to claim 10, wherein said mask comprise any one of an insulating material, a conductive material, and a semiconductor material.

22. The method according to claim 10, wherein said quantum structure is formed after said mask is removed.

23. The method according to claim 10, wherein said quantum structure is formed with said mask being left and is selectively grown in said concave section.

24. The method according to claim 10, wherein said quantum structure is formed by any one of MBE, MOVPE, ALE, CBE, GSMBE, MOMBE, chloride VPE, hydride VPE, and LPE.

* * * * *